(12) United States Patent
Gohara et al.

(10) Patent No.: US 8,902,589 B2
(45) Date of Patent: Dec. 2, 2014

(54) SEMICONDUCTOR MODULE AND COOLER

(75) Inventors: Hiromichi Gohara, Matsumoto (JP); Takeshi Ichimura, Matsumoto (JP); Akira Morozumi, Okaya (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 232 days.

(21) Appl. No.: 13/634,813

(22) PCT Filed: Apr. 21, 2011

(86) PCT No.: PCT/JP2011/059831
§ 371 (c)(1),
(2), (4) Date: Nov. 21, 2012

(87) PCT Pub. No.: WO2011/132736
PCT Pub. Date: Oct. 27, 2011

(65) Prior Publication Data
US 2013/0058041 A1 Mar. 7, 2013

(30) Foreign Application Priority Data

Apr. 21, 2010 (JP) ................. 2010-097911

(51) Int. Cl.
*H05K 7/20* (2006.01)
*F28F 3/12* (2006.01)
(Continued)

(52) U.S. Cl.
CPC ... *H01L 23/3735* (2013.01); *H01L 2224/73265* (2013.01); *H01L 2924/13055* (2013.01); *H01L 24/32* (2013.01); *H01L 2224/85447* (2013.01); *H01L 23/473* (2013.01); *H01L 2224/85455* (2013.01); *H01L 2224/32225* (2013.01); *H01L 2924/01078* (2013.01); *H01L 24/48* (2013.01); *H01L 2224/48227* (2013.01); *H01L 2924/01019* (2013.01); *H01L 25/072* (2013.01); *H01L 24/85* (2013.01); *H01L 25/18* (2013.01); *H01L 2924/01004* (2013.01); *H01L 24/73* (2013.01)
USPC ...... 361/699; 361/679.53; 361/698; 361/702; 361/704; 361/715; 165/80.2; 165/80.4; 165/104.19; 165/104.33; 257/706; 257/712; 257/714

(58) Field of Classification Search
USPC ............ 361/679.46, 679.53, 688, 689, 361/698–714, 715, 717–727; 165/80.2–80.5, 104.19, 104.26, 165/104.33, 104.34, 185; 257/706–727; 174/15.1, 16.3; 62/259.2
See application file for complete search history.

(56) References Cited

U.S. PATENT DOCUMENTS 5,099,311 A * 3/1992 Bonde et al. ............. 165/80.4
5,170,319 A * 12/1992 Chao-Fan Chu et al. ..... 361/689
(Continued)

FOREIGN PATENT DOCUMENTS

| JP | 2001-035981 A | 2/2001 |
| JP | 2001-352025 A | 12/2001 |

(Continued)

*Primary Examiner* — Michail V Datskovskiy
(74) *Attorney, Agent, or Firm* — Rabin & Berdo, P.C.

(57) ABSTRACT

A semiconductor module and a cooler capable of cooling a semiconductor element efficiently. The semiconductor module supplies a refrigerant to a water jacket configuring the cooler, to cool a circuit element part disposed on an outer surface of a fin base. This semiconductor module has: a fin connected thermally to the circuit element part; a refrigerant introducing passage in the water jacket, which has a guide part that has one surface and another surface inclined to guide the refrigerant toward one side surface of the fin; a refrigerant discharge passage disposed in the water jacket to be parallel to the refrigerant introducing passage, which has a side wall parallel to another side surface of the fin; and a cooling passage formed in a position for communicating the refrigerant introducing passage and the refrigerant discharge passage with each other in the water jacket. The fin is disposed in the cooling passage.

22 Claims, 50 Drawing Sheets

(51) Int. Cl.
*H01L 23/373* (2006.01)
*H01L 23/473* (2006.01)
*H01L 25/07* (2006.01)
*G06F 1/20* (2006.01)
*H01L 23/00* (2006.01)
*H01L 25/18* (2006.01)

(56) References Cited

U.S. PATENT DOCUMENTS

| | | | | |
|---|---|---|---|---|
| 5,504,378 | A | * 4/1996 | Lindberg et al. | 307/10.1 |
| 5,737,186 | A | * 4/1998 | Fuesser et al. | 361/699 |
| 6,101,715 | A | * 8/2000 | Fuesser et al. | 29/890.03 |
| 8,291,967 | B2 | * 10/2012 | Yoshida et al. | 165/80.4 |
| 2006/0225867 | A1 | 10/2006 | Park et al. | |
| 2008/0237847 | A1 | 10/2008 | Nakanishi et al. | |
| 2009/0178792 | A1 | 7/2009 | Mori et al. | |
| 2009/0314474 | A1 | 12/2009 | Kimbara et al. | |
| 2010/0051234 | A1 | 3/2010 | Mori et al. | |
| 2010/0252235 | A1 | 10/2010 | Mori et al. | |

FOREIGN PATENT DOCUMENTS

| | | |
|---|---|---|
| JP | 2006-080211 A | 3/2006 |
| JP | 2006-295178 A | 10/2006 |
| JP | 2006-310485 A | 11/2006 |
| JP | 2007-012722 A | 1/2007 |
| JP | 2008-205371 A | 9/2008 |
| JP | 2008-235725 A | 10/2008 |
| JP | 2008-251932 A | 10/2008 |
| JP | 2008-263137 A | 10/2008 |
| JP | 2009-170583 A | 7/2009 |
| JP | 2009-231677 A | 10/2009 |
| JP | 2009-266936 A | 11/2009 |
| JP | 2010-056131 A | 3/2010 |
| WO | WO-2009/069578 A1 | 6/2009 |

* cited by examiner

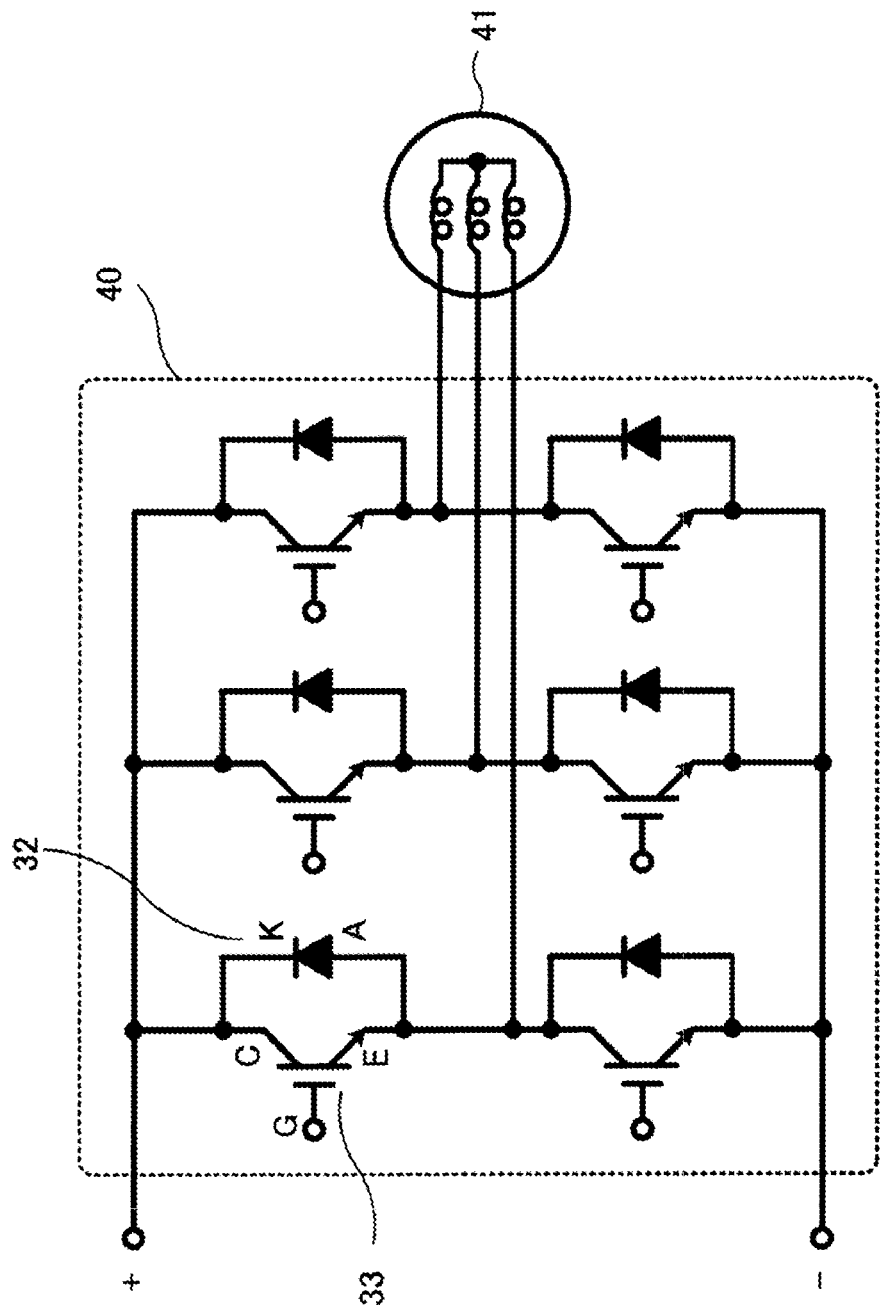

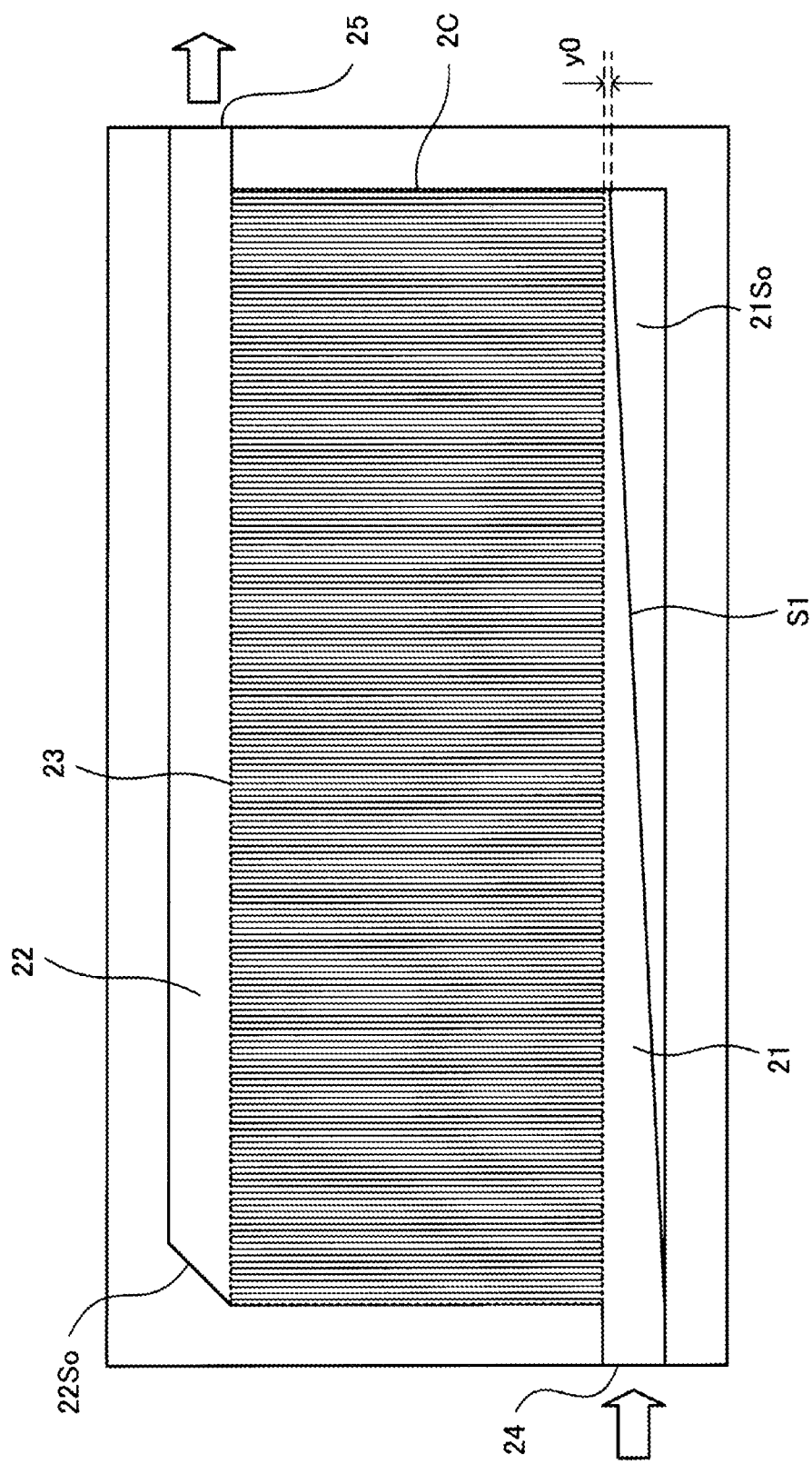

FIG. 11B

|  | x0[mm] | y0[mm] |
|---|---|---|
| FIG. 9 | – | 3.0 |
| TYPE A | 30 | 3.0 |
| TYPE B | 40 | 3.0 |
| TYPE C | 40 | 2.0 |
| TYPE D | 40 | 4.0 |
| TYPE E | 60 | 3.0 |
| TYPE F | 90 | 3.0 |
| TYPE G | 120 | 3.0 |
| TYPE H | 20 | 1.0 |
| TYPE I | 40 | 5.0 |

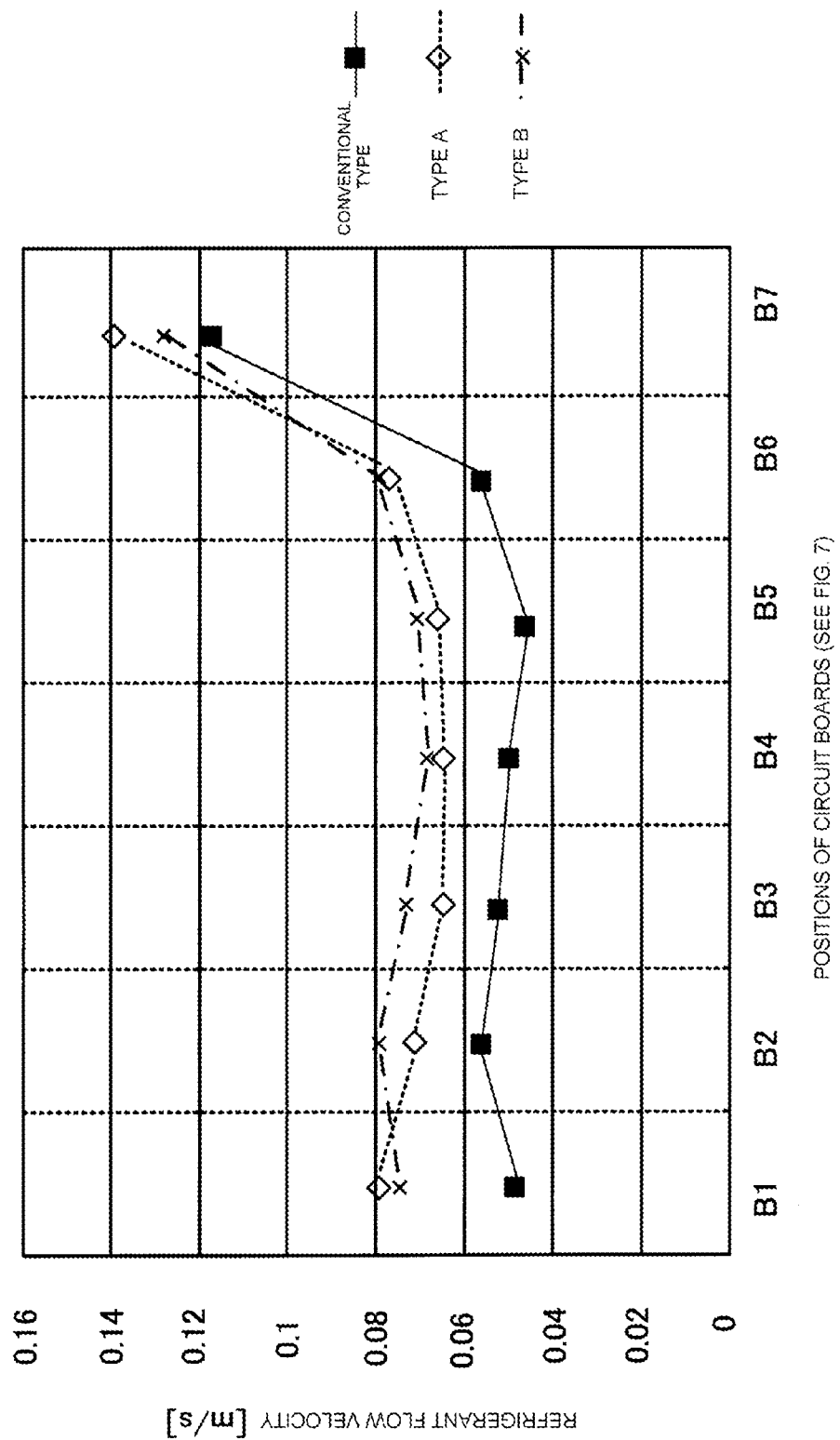

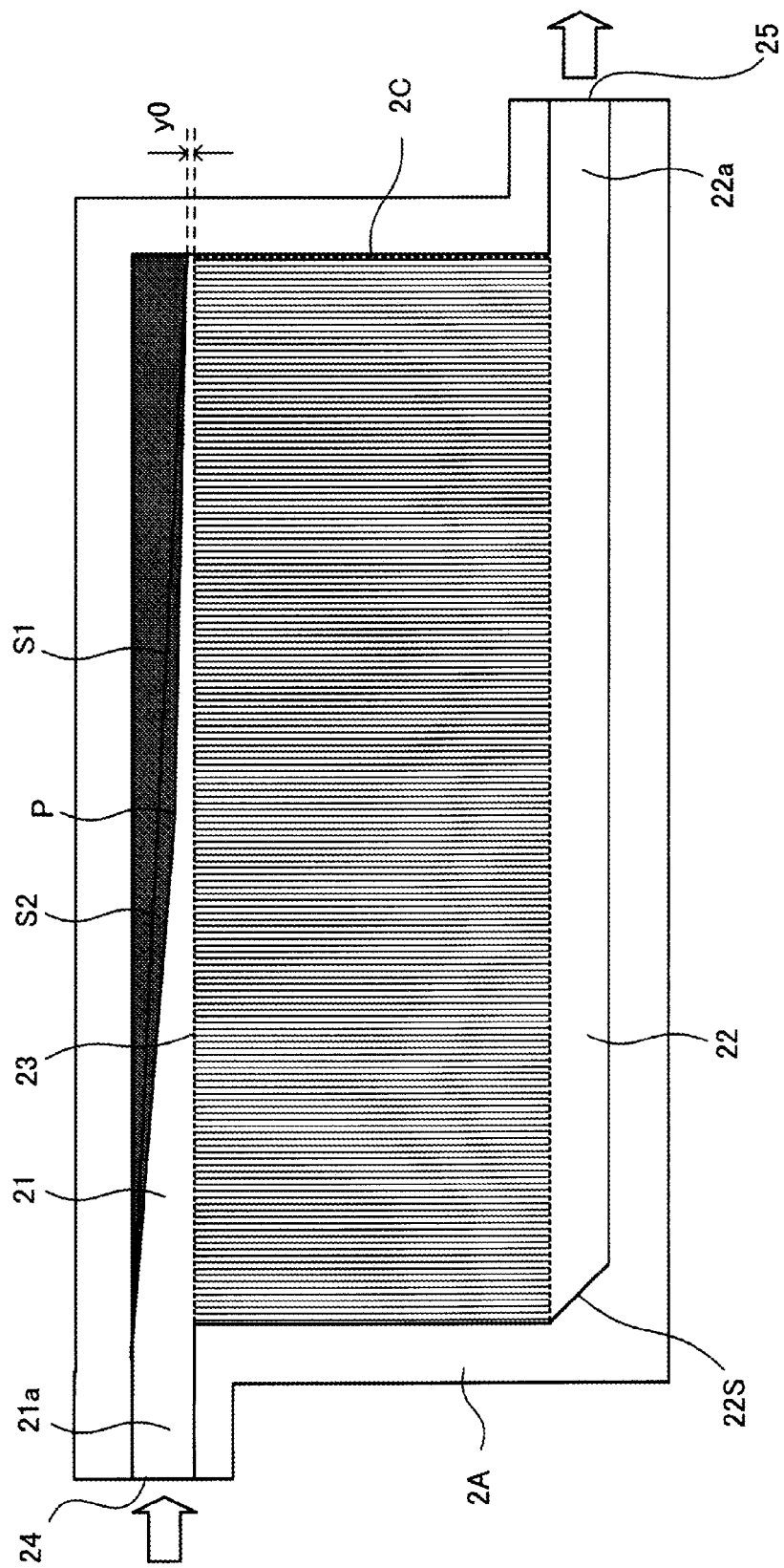

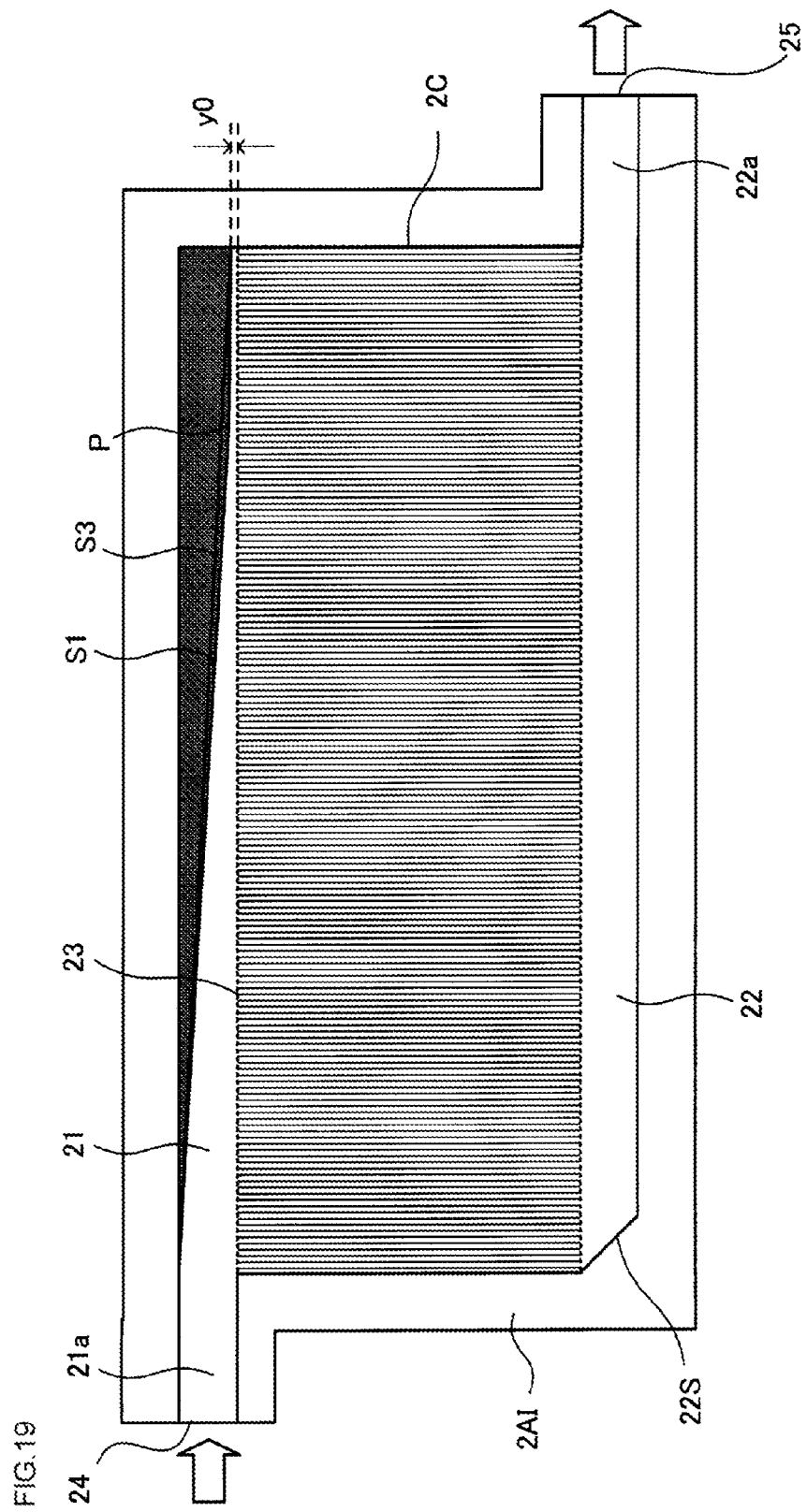

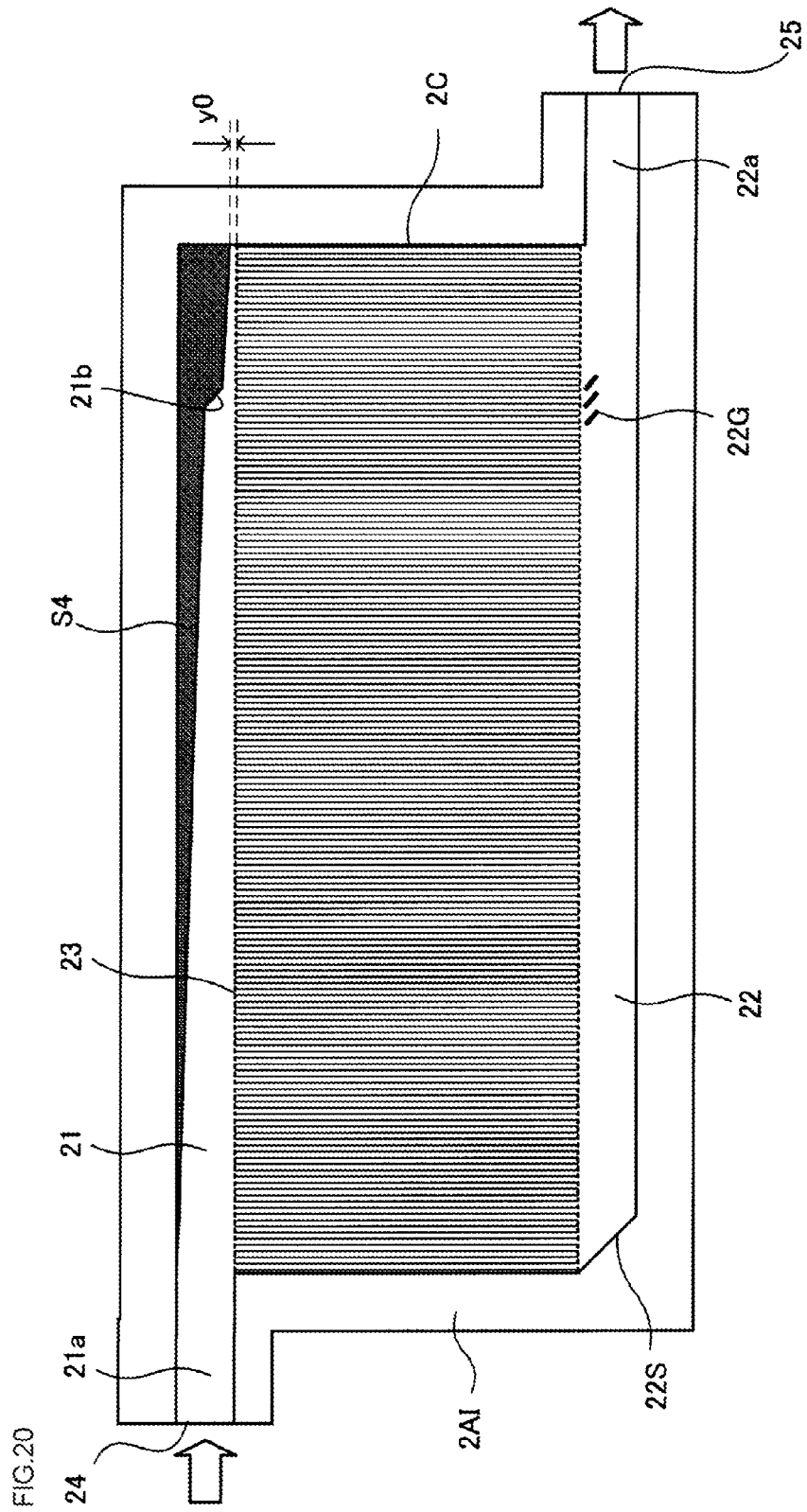

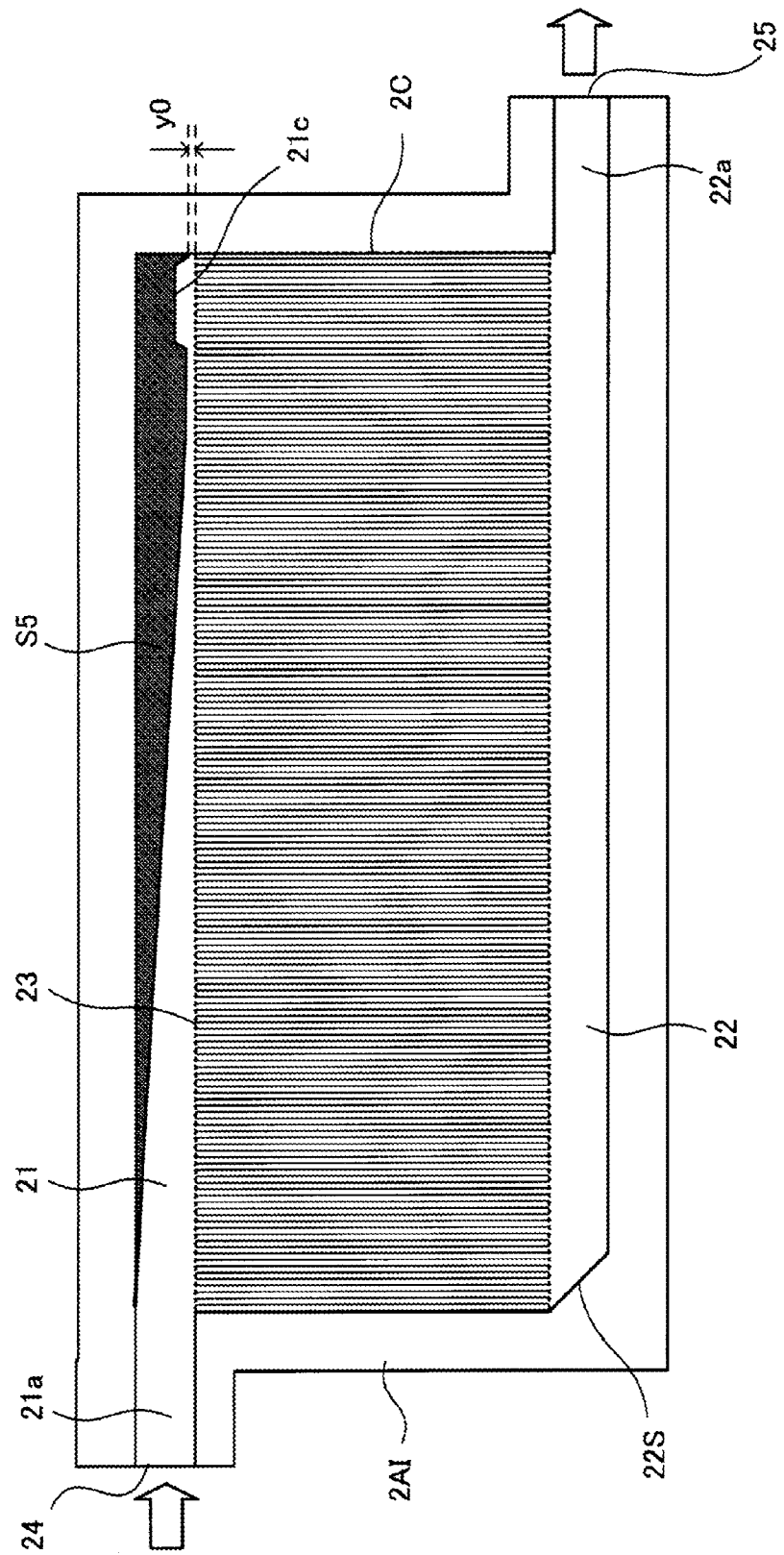

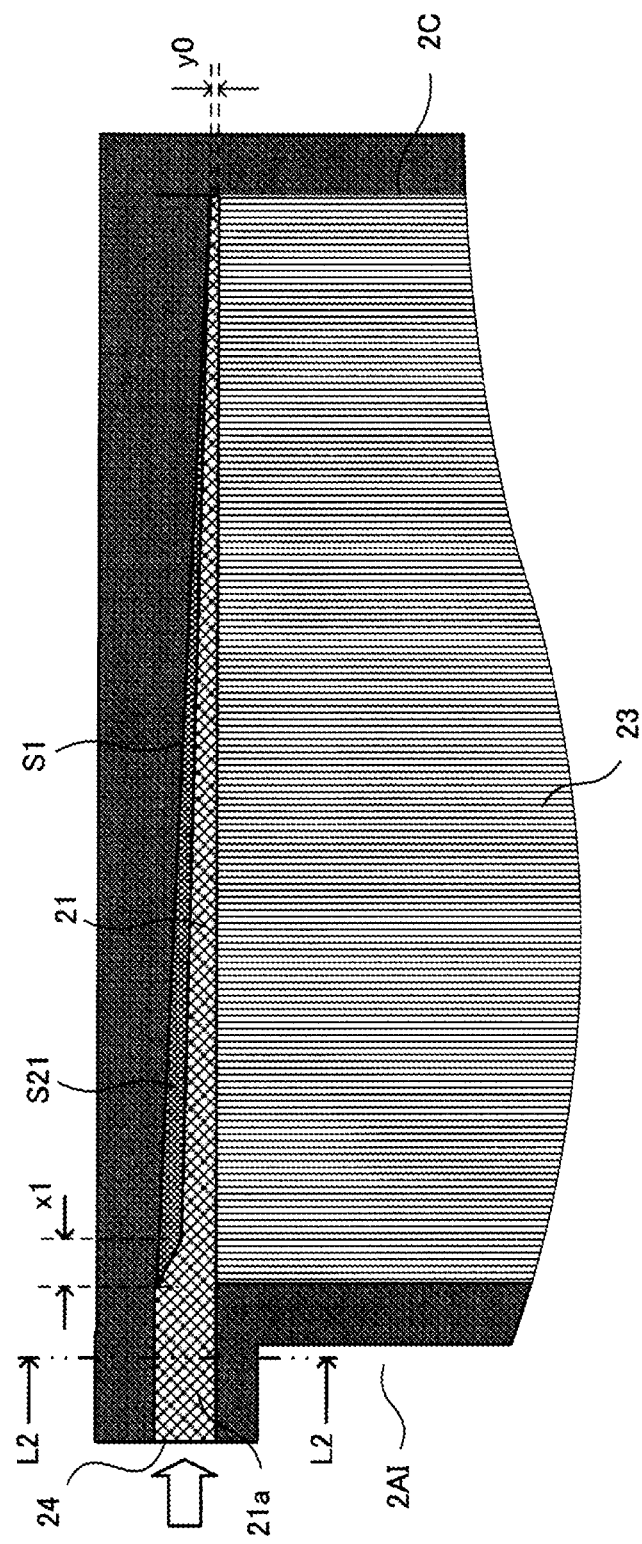

(x1: DISTANCE, y0: FIN-SLOPE INTERVAL, z1: HEIGHT)

|  | x1[mm] | y0[mm] | z1[mm] |
|---|---|---|---|
| FIG. 17 | - | 4.0 | - |
| TYPE J | 10.0 | 4.0 | 2.5 |
| TYPE K | 10.0 | 4.0 | 5.0 |

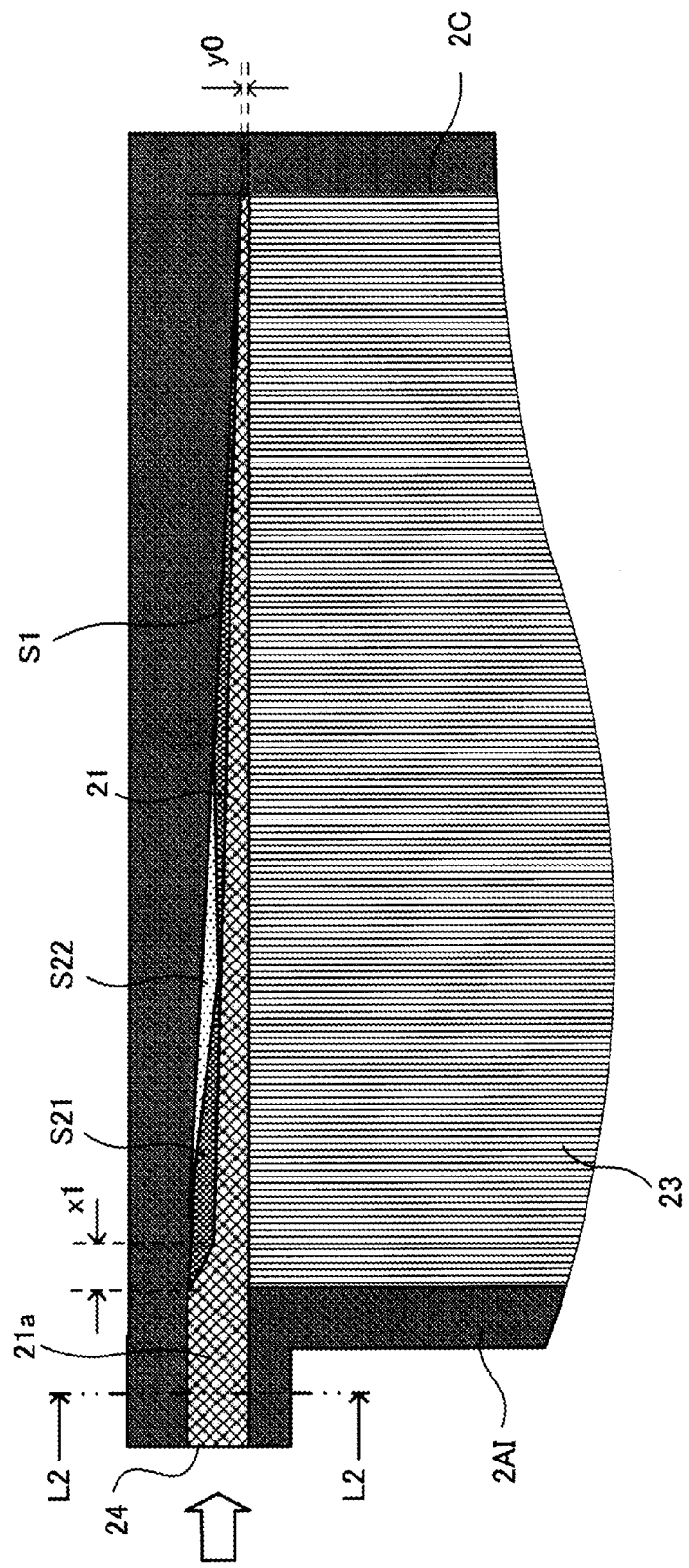

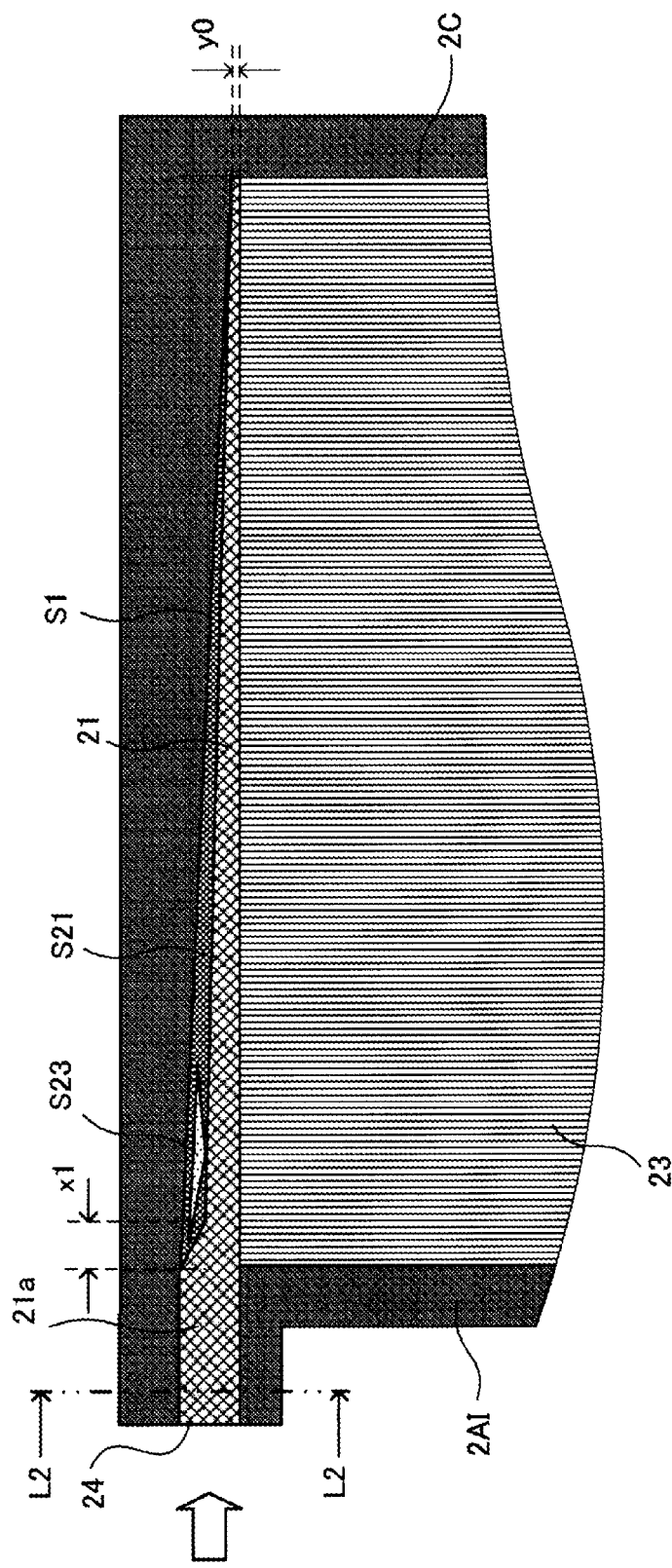

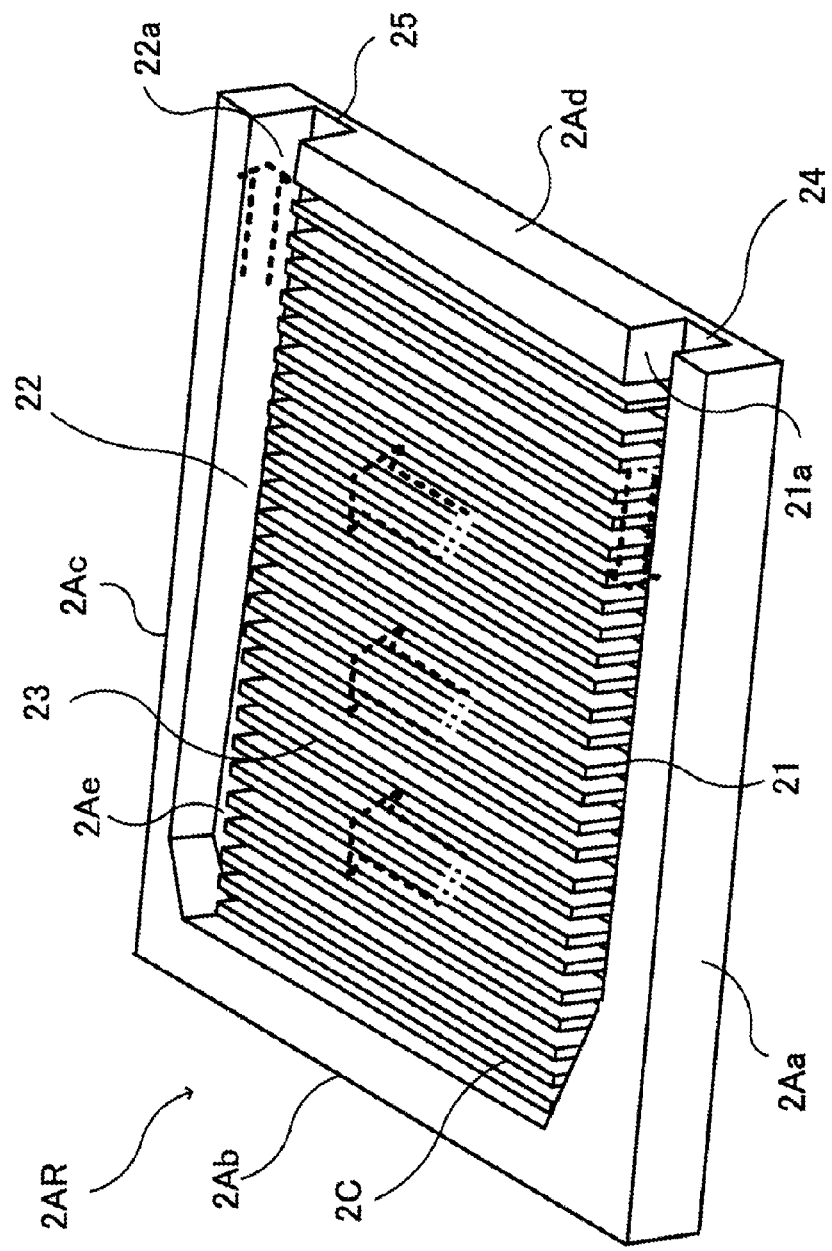

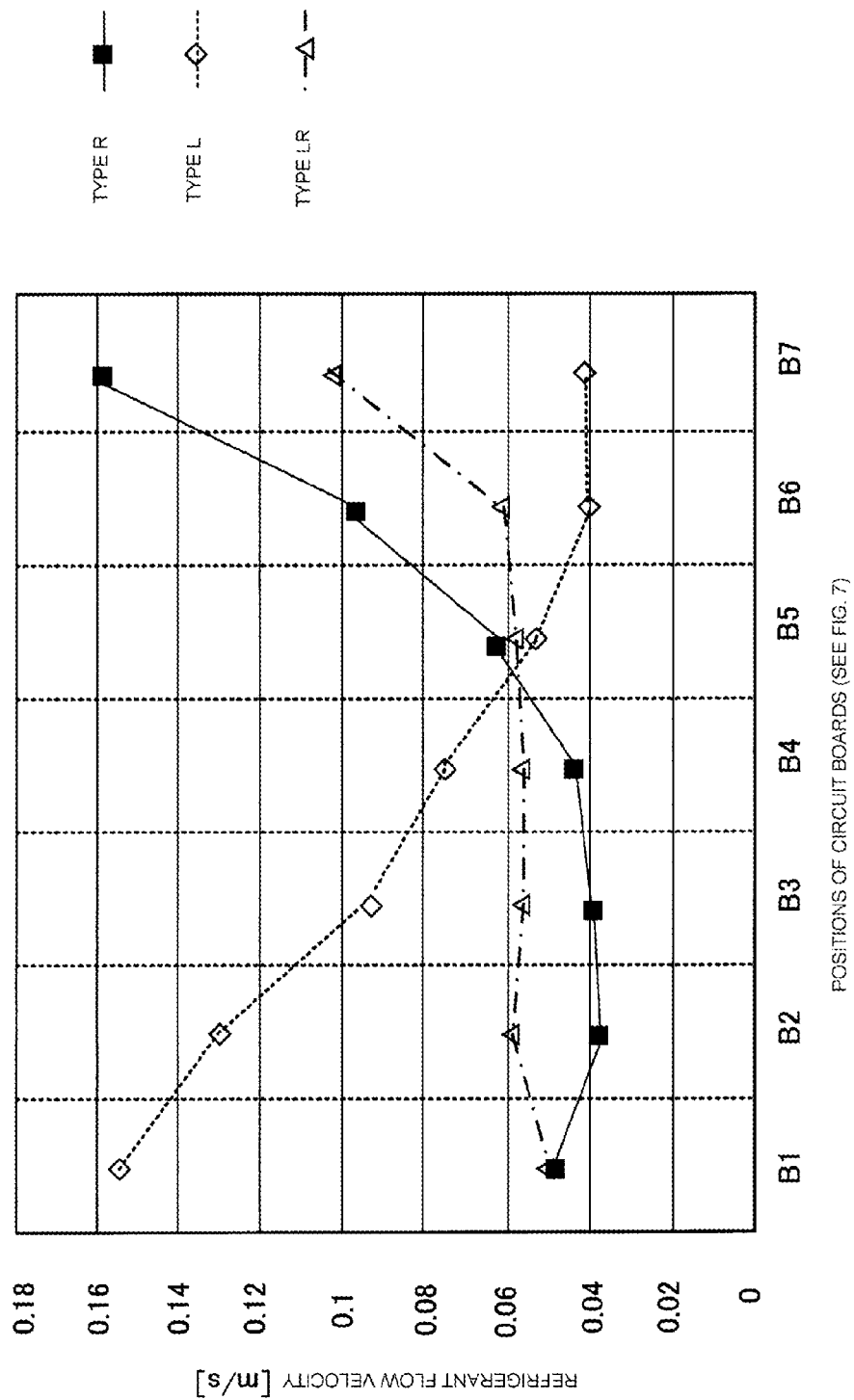

(x, x1: DISTANCE, y0, y1: FIN-SLOPE INTERVAL, z1: HEIGHT)

| STRUCTURE | x[mm] | y0[mm] | x1[mm] | y1[mm] | z1[mm] |
|---|---|---|---|---|---|
| TYPE L | 255 | 2 | – | – | – |
| TYPE L1 | 183 | 2 | – | – | – |
| TYPE L2 | 98 | 2 | – | – | – |
| TYPE L3 | 13 | 2 | – | – | – |
| TYPE M | 255 | 2 | 11.5 | 5 | 2.5 |
| TYPE Ma | 255 | 2 | 20 | 5 | 2.5 |
| TYPE Mb | 255 | 2 | 11.5 | 10 | 2.5 |
| TYPE Mc | 255 | 2 | 11.5 | 5 | 5 |

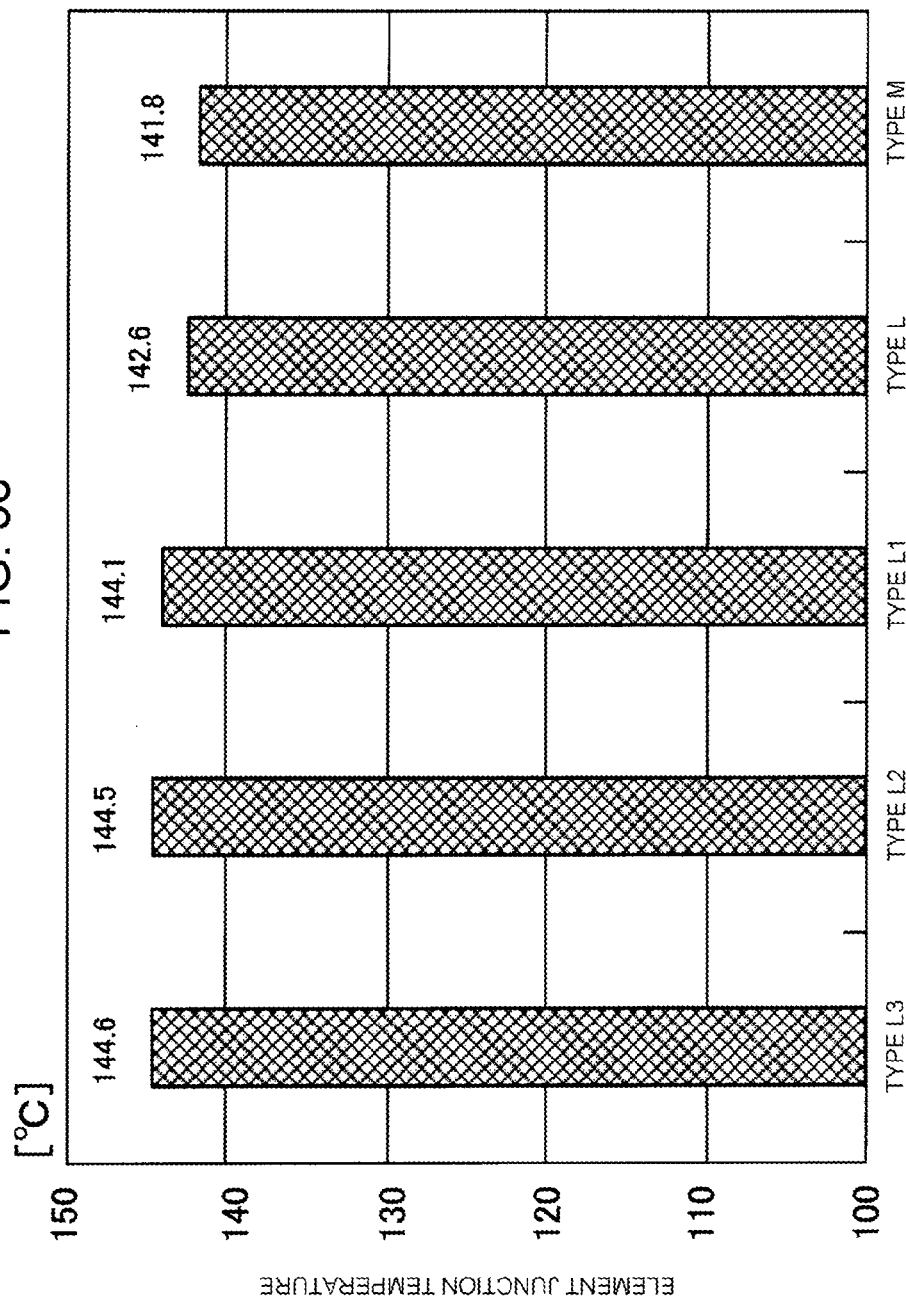

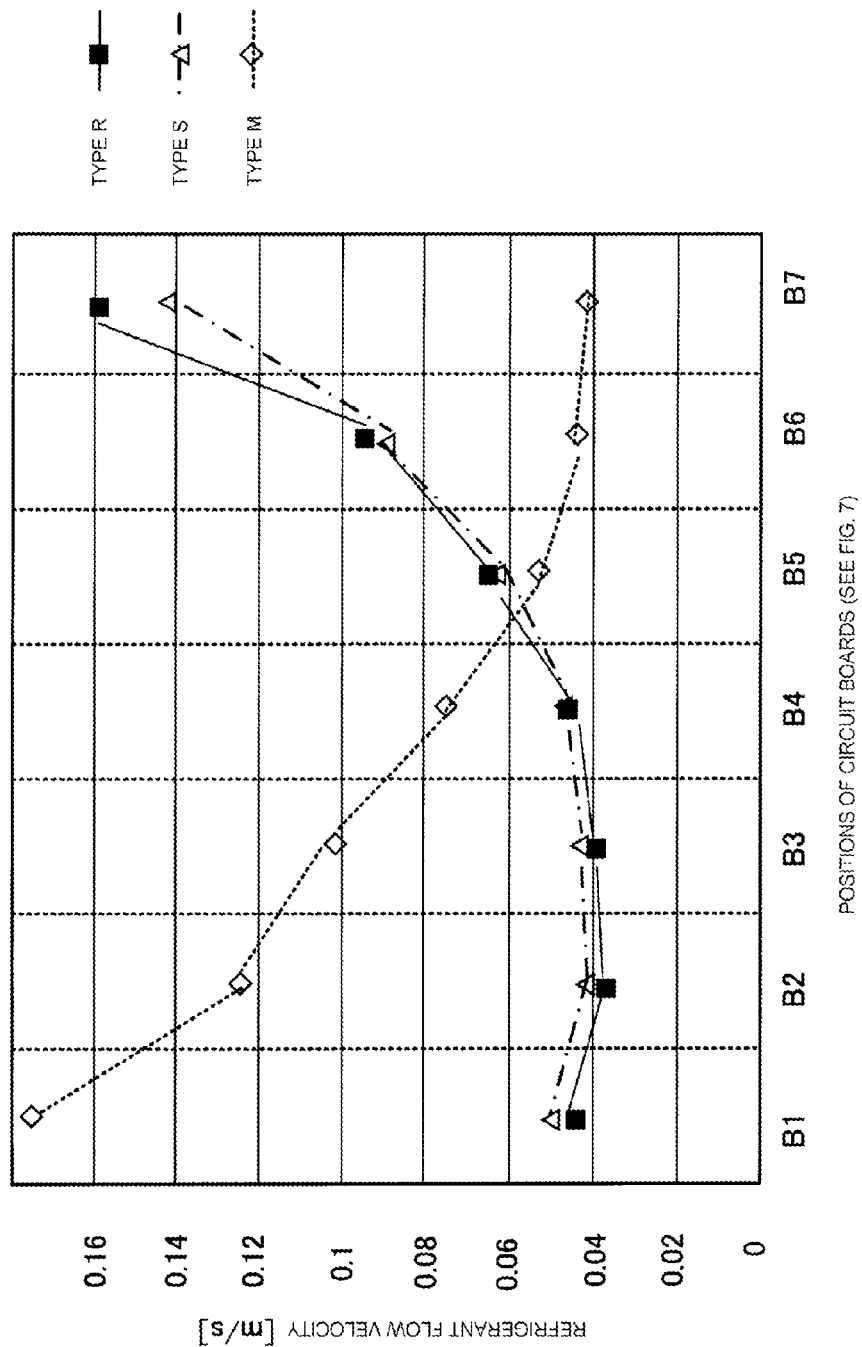

SEMICONDUCTOR MODULE AND COOLER

TECHNICAL FIELD

The present invention relates to a cooler for cooling a semiconductor element, and a semiconductor module in which a refrigerant is supplied from the outside to a water jacket configuring the cooler, to cool the semiconductor element disposed on an outer surface of the cooler.

BACKGROUND ART

A semiconductor module has been extensively used in a power converter, such as an electrical system of a hybrid vehicle or an electrical vehicle. The semiconductor module configuring an energy-saving controller has a power semiconductor element for controlling a high current.

The heat generated by such a power semiconductor element when controlling a high current tends to increase especially as miniaturization and power boosting of the power semiconductor element advance. Therefore, a major problem is to cool a semiconductor module having a plurality of power semiconductor elements.

A liquid cooling cooler has conventionally been used in such a semiconductor module. The power semiconductor elements need to be cooled efficiently in order to improve the cooling efficiency of the semiconductor module. The liquid cooling cooler is designed in various ways to improve its cooling efficiency thereof, by increasing the flow rate of its refrigerant, shaping heat radiating fins (cooling body) into a shape to provide good heat-transfer efficiency, and increasing heat-transfer efficiency of materials configuring the fins.

Increasing the flow rate of refrigerant supplied to the cooler or adopting the fin structures providing good heat-transfer efficiency can easily increase a pressure loss of the refrigerant inside the cooler. Especially in a cooler that uses a plurality of heat sinks to cool a large number of power semiconductor elements, the pressure loss of the refrigerant is significant in a passage structure where refrigerant passages are connected in series. To reduce the pressure loss of the refrigerant, it is ideal to construct a cooler in which its cooling efficiency can be enhanced with a low refrigerant flow rate. However, adopting a new fin material for improving the heat-transfer efficiency of the fin material configuring the cooler can lead to increases in costs of the entire cooler.

In a recent cooler, a refrigerant introducing passage for introducing a refrigerant and a refrigerant discharge passage for discharging the refrigerant are arranged parallel to each other, and a plurality of heat sinks are disposed therebetween in a refrigerant circulation direction so as to be substantially perpendicular to the abovementioned passages (for example, Japanese Patent Application Publication No. 2001-35981, Japanese Patent Application Publication No. 2007-12722, Japanese Patent Application Publication No. 2008-205371, Japanese Patent Application Publication No. 2008-251932, Japanese Patent Application Publication No. 2006-80211, Japanese Patent Application Publication No. 2009-231677, Japanese Patent Application Publication No. 2006-295178). In this case, the refrigerant can flow parallel between fins configuring each heat sink, increasing the cooling performance per pressure loss and reducing the pressure loss of the refrigerant inside the passages, as shown in Japanese Patent Application Publication No. 2006-80211.

Japanese Patent Application Publication No. 2009-231677 describes a liquid cooling cooler in which the entire rear-side wall of the casing is smoothly inclined forward from the right-side wall toward the left-side wall and in which the cross-sectional area of the passage of the entrance header part decreases gradually from the cooling liquid entrance side toward the left-side wall (see the paragraphs [0024] and [0031] and FIG. 2). Japanese Patent Application Publication No. 2008-205371 describes a liquid cooling cooler in which the connection water paths for introducing and discharging a refrigerant are disposed on the same side surface of the module and in which each of the paths is disposed in a direction perpendicular to the fins without changing the cross-sectional areas thereof (see FIG. 1).

Japanese Patent Application Publication No. 2006-295178 describes a heat sink apparatus for use in a computer electronic device and the like. In this heat sink apparatus, the shape of the inflow guide plate extending toward the plurality of passages is configured so as to be inclined into the shape of a curve of a convex surface toward the plurality of passages, as it moves away from the inflow port. In addition, the cross-sectional area of the inflow guide part becomes small gradually from the inflow port. Moreover, the shape of the inflow guide plate is same as that of the inflow guide plate (see the paragraph [0030] and FIG. 6).

In the conventional cooling technologies, however, a drift distribution in which the refrigerant drifts away occurs due to the shapes of the heat sinks and refrigerant passages, the method for disposing the heater elements, or the shapes of the refrigerant introduction/discharge ports, etc. Such drift distribution caused in the conventional coolers disturbs the balance of the cooling performance. Therefore, a uniform and stable cooling performance cannot be accomplished. Another problem is that only the temperatures of heat generated in the semiconductor elements disposed opposing the refrigerant discharge port increase significantly, reducing the lives of the elements or damaging the elements.

As in the coolers disclosed in Patent Documents 6 and 7 in which the cross-sectional areas of the entrance header parts decrease gradually in a direction in which the entrance header parts extend, their flow rate distributions are improving, but the increase in the temperatures of the sections near the refrigerant introduction ports cannot be prevented.

DISCLOSURE OF THE INVENTION

The present invention was contrived in view of the circumstances described above, and an object thereof is to provide a semiconductor module in which a drift generated in a refrigerant passage can be eliminated so as to improve a refrigerant flow velocity in the vicinity of an introduction port, and in which a semiconductor element can be cooled evenly and stably by preventing the increase in the temperature obtained in the vicinity of the introduction port. The semiconductor module can be prevented from being operated erroneously or being destroyed by heat generated in the semiconductor element.

Another object of the present invention is to provide a cooler capable of efficiently cooling the semiconductor element.

In order to solve the problems described above, the present invention provides a semiconductor module in which a refrigerant is supplied from the outside to a water jacket configuring a cooler, to cool a semiconductor element disposed on an outer surface of the cooler. This semiconductor module has, in the water jacket: a heat sink connected thermally to the semiconductor element; a first passage which extends from a refrigerant introduction port and in which is disposed a guide part that has at least one surface and another surface inclined to guide the refrigerant toward one side surface of the heat sink; a second passage that is disposed in the water jacket so as to be parallel to the first passage, extends to a refrigerant discharge port, and has formed therein a side wall parallel to another side surface of the heat sink; and a third passage that is formed in a position for communicating the first passage and the second passage with each other in the water jacket and has the heat sink disposed therein.

The cooler of the present invention has: a heat sink that is thermally connected to a semiconductor element disposed on an outer surface of the cooler, when supplying a refrigerant from the outside to a water jacket to cool the semiconductor element; in the water jacket, a first passage which extends from a refrigerant introduction port and in which is disposed a guide part that has at least one surface and another surface inclined to guide the refrigerant toward one side surface of the heat sink; a second passage that is disposed in the water jacket so as to be parallel to the first passage, extends to a refrigerant discharge port, and has formed therein a side wall parallel to another side surface of the heat sink; and a third passage that is formed in a position for communicating the first passage and the second passage with each other in the water jacket and has the heat sink disposed therein.

According to the semiconductor module of the present invention, the flow velocity of the refrigerant flowing from the first passage to the heat sink can be adjusted by making the cross-sectional area of the refrigerant introduction path smaller than that of the discharge path so that the refrigerant can be guided toward one side surface of the heat sink. Therefore, the semiconductor element disposed on the outer surface of the cooler can be cooled efficiently, whereby the semiconductor element can be operated stably.

The above and other objects, features and advantages of the present invention will become more apparent from the following description taken with the accompanying drawings illustrating preferred embodiments of the present invention.

BRIEF DESCRIPTION OF THE DRAWINGS

FIGS. 4(A) and 4(B) respectively show two different types of fins, wherein FIG. 4(A) is a perspective view of blade fins, and FIG. 4(B) is a perspective view of corrugated fins;

FIG. 5 is a diagram showing an example of a power conversion circuit configured as the semiconductor module;

FIGS. 6(A) and 6(B) show a first modification of a conventional semiconductor module, wherein FIG. 6(A) is a perspective view showing an example of an arrangement of its circuit elements thereof, and FIG. 6(B) is a perspective view showing the configurations of substantial parts of a water jacket of a cooler of the conventional semiconductor module;

FIGS. 8(A) and 8(B) show a second modification of the conventional semiconductor module, wherein FIG. 8(A) is a perspective view showing an example of arrangement of circuit elements, and FIG. 8(B) is a perspective view showing the configurations of substantial parts of the water jacket of the cooler;

FIG. 9 is a plan view showing a passage structure of the semiconductor module shown in FIGS. 8(A) and 8(B);

FIGS. 10(A) and 10(B) show a general cooling performance of the cooler, wherein FIG. 10(A) is a diagram schematically showing the relationship between the flow velocity and pressure of the refrigerant, and FIG. 10(B) is a diagram schematically showing the relationship between the flow velocity of the refrigerant and the element temperature;

FIGS. 11(A) and 11(b) show a passage structure of the semiconductor module of the present invention, wherein FIG. 11(A) is a plan view of the water jacket of the cooler, and FIG. 11(B) is an explanatory diagram showing different structures of the guide part by type;

FIG. 12 is a diagram showing the refrigerant flow velocities obtained at different positions of the circuit boards in accordance with the structure of the guide part of the semiconductor module shown in FIGS. 11(A) and 11(B);

FIGS. 14(A) and 14(B) show the performance of the water jacket shown in FIGS. 11(A) and 11(B), wherein FIG. 14(A) is a diagram showing an example of arrangement of the circuit elements, and FIG. 14(B) a diagram showing heat generated during the steady operation (on the downstream side of the row B1);

FIGS. 15(A) and 15(B) shows the performance of the water jacket shown in FIGS. 11(A) and 11(B), wherein FIG. 15(A) is a diagram showing an example of arrangement of the circuit elements, and FIG. 15(B) is a diagram showing heat generated during the steady operation (on the downstream side of the row B4);

FIGS. 16(A) and 16(B) show the performance of the water jacket shown in FIGS. 11(A) and 11(B), wherein FIG. 16(A) is a diagram showing an example of arrangement of the circuit elements, and FIG. 16(B) is a diagram showing heat generated during the steady operation (on the upstream side of the row B7);

FIG. 18 is a plan view showing a water jacket that has a passage structure in which a guide part with two inclined surfaces is formed, the two inclined surfaces being inclined at different angles;

FIG. 19 is a plan view showing the water jacket having a passage structure in which a guide part with two surfaces is formed, the two surfaces being different in length from the ones shown in FIG. 18;

FIG. 20 is a plan view showing the water jacket having a passage structure in which a guide part with three inclined surfaces is formed, the three inclined surface being inclined at different angles;

FIG. 21 is a plan view of the water jacket having a passage structure in which a parallel surface near the terminal end part of the first passage is concaved;

FIGS. 22(A), 22(B) and 22(C) show a passage structure having steps in a height direction in the semiconductor module shown in FIG. 17, wherein FIG. 22(A) is a plan view showing substantial parts of the water jacket of the cooler, FIG. 22(B) is a cross-sectional diagram taken along the arrow L2-L2 in the vicinity of a refrigerant introduction port, and FIG. 22(C) is an explanatory diagram showing the guide part structures by type;

FIGS. 25(A) and 25(B) show the performance of the water jacket shown in FIGS. 22(A) to 22(C), wherein FIG. 25(A) is a diagram showing the passage structure having the steps formed in the height direction, and FIG. 25(B) a diagram showing heat generated during the steady operation (on the downstream side of the row B1);

FIGS. 26(A) and 26(B) show the performance of the water jacket shown in FIGS. 22(A) to 22(C), wherein FIG. 26(A) is a diagram showing the passage structure having the steps formed in the height direction, and FIG. 26(B) is a diagram showing heat generated during the steady operation (on the downstream side of the row B4);

FIGS. 27(A) and 27(B) show the performance of the water jacket shown in FIGS. 22(A) to 22(C), wherein FIG. 27(A) is a diagram showing the passage structure having the steps formed in the height direction, and FIG. 27(B) is a diagram showing heat generated during the steady operation (the downstream side of the row B7);

FIGS. 28(A) and 28(B) show the passage structure having steps formed in the height direction in a semiconductor module different from that shown in FIGS. 22(A) to 22(C), wherein FIG. 28(A) is a plan view showing the substantial parts of the water jacket of the cooler, and FIG. 28(B) is a cross-sectional diagram taken along the arrow L2-L2 in the vicinity of the refrigerant introduction port;

FIGS. 29(A) and 29(B) show the passage structure having steps formed in the height direction in another semiconductor module different from that shown in FIGS. 22(A) to 22(C), wherein FIG. 29(A) is a plan view showing the substantial parts of the water jacket of the cooler, and FIG. 29(B) is a cross-sectional diagram taken along the arrow L2-L2 in the vicinity of the refrigerant introduction port;

FIG. 30 is a perspective view of the cooler of the conventional semiconductor module, showing the configurations of substantial parts of the water jacket having a structure different from that shown in FIG. 3;

FIG. 32 is a diagram showing the refrigerant flow velocities obtained at different positions of the circuit boards in accordance with the structure of the water jacket;

FIGS. 34(A) and 34(B) show a passage structure of the semiconductor module according to the fifth embodiment, wherein FIG. 34(A) is a plan view of the water jacket of the cooler, and FIG. 34(B) is an explanatory diagram showing the structures of the guide parts by type;

FIG. 38 is a diagram showing generated heat by type, the heat being generated during the steady operation of the semiconductor element disposed on the upstream side of the row B7 of the water jacket;

FIG. 40 is a diagram showing the refrigerant flow velocities obtained according to the structures of the guide part of the semiconductor module shown in FIG. 39; and FIGS. 41(A), 41(B) and 41(C) show the performance of the water jacket shown in FIG. 39 that is obtained during the steady operation of semiconductor elements, wherein FIG. 41(A) is a diagram showing the temperatures of heat generated on the downstream side of the row B1, FIG. 41(B) is a diagram showing the temperatures of heat generated on the downstream side of the row B4, and FIG. 41(C) is a diagram showing the temperatures of heat generated on the upstream side of the row B7, the temperatures being shown in these diagrams by type.

BEST MODE FOR CARRYING OUT THE INVENTION

Figure 1:
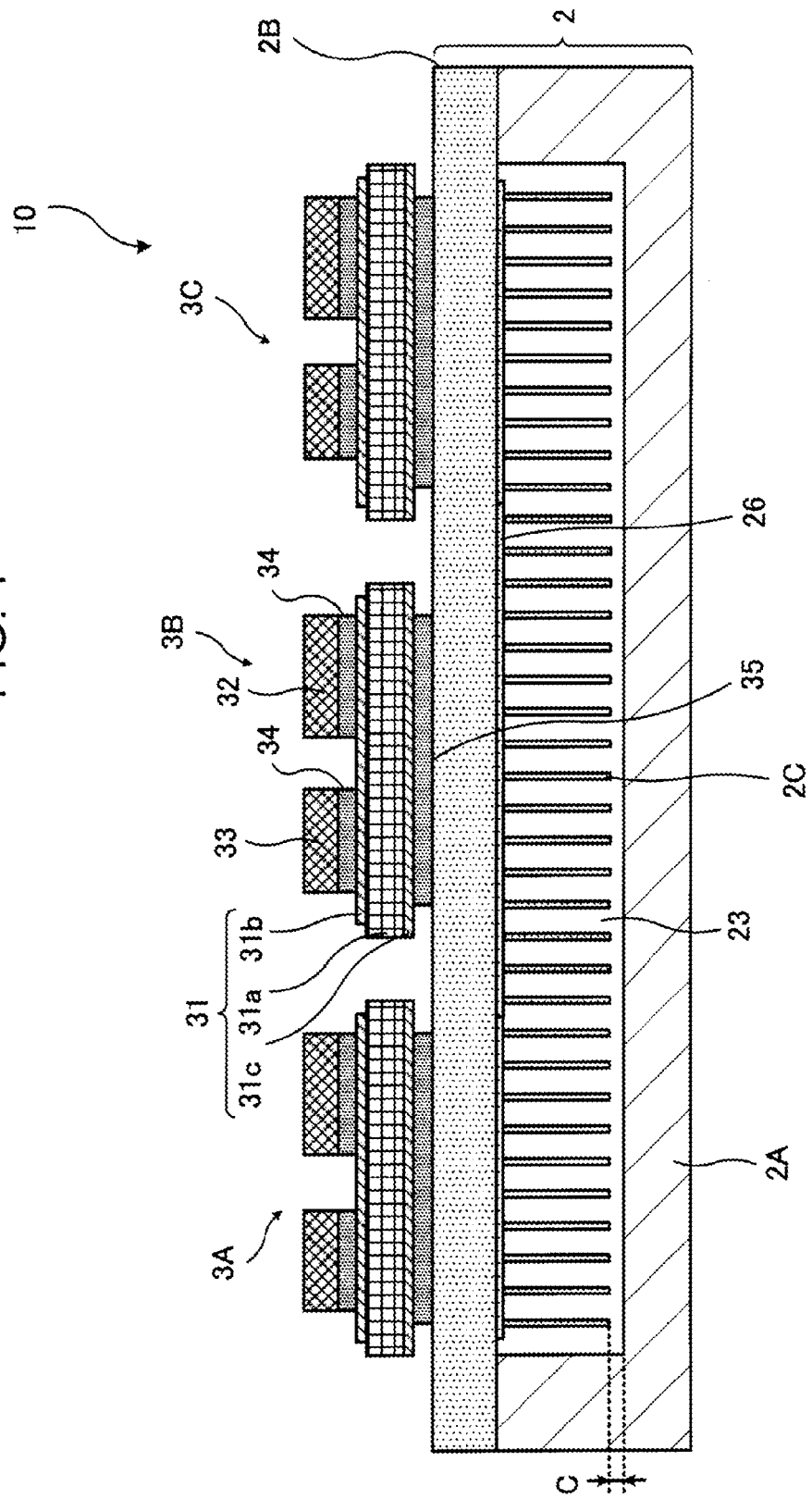
FIG. 1 is a cross-sectional schematic diagram showing an example of a semiconductor module according to the present invention.
Figure 2:
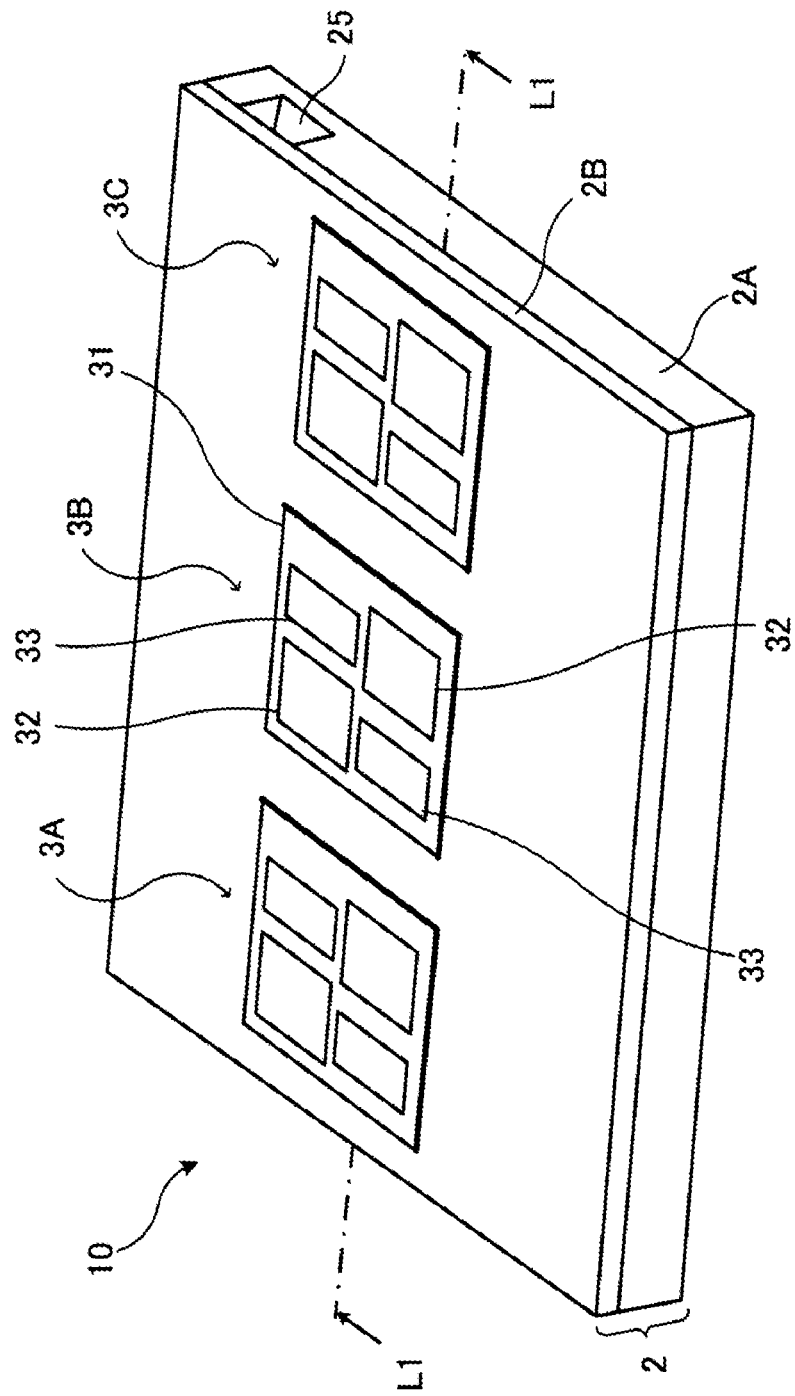
FIG. 2 is a perspective view showing the exterior of the semiconductor module.
Figure 3:
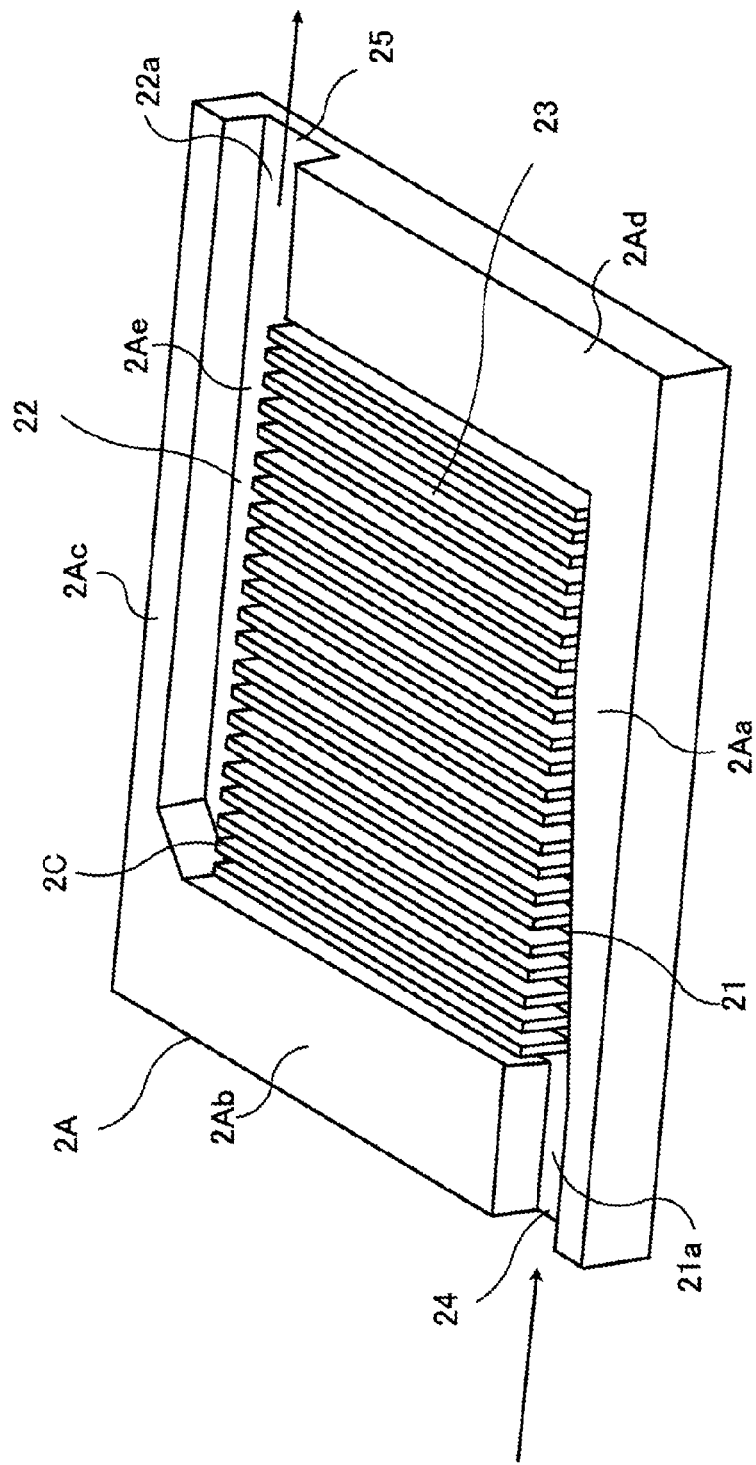
FIG. 3 is a perspective view showing the configurations of substantial parts of a water jacket of a cooler.

FIG. 1 is a cross-sectional schematic diagram showing an example of a semiconductor module according to the present invention. FIG. 2 is a perspective view showing the exterior of the semiconductor module. FIG. 1 is a cross-sectional diagram taken along the arrow L1-L1 of FIG. 2. FIG. 3 is a perspective view showing the configurations of substantial parts of a water jacket of a cooler, wherein the arrows show the directions in which a refrigerant flows.

A semiconductor module 10 is configured by a cooler 2 and a plurality of circuit element parts 3A to 3C disposed on the cooler 2, as shown in FIGS. 1 and 2. The cooler 2 is configured by a water jacket 2A functioning as a fin cover, and a fin base 2B in which a plurality of fins 2C are implanted to configure a heat sink. The plurality of fins 2C are stored in the water jacket 2A. In the following description, the section to which the fin base 2B is attached in the water jacket 2A and the fins 2C stored therein as shown in FIG. 2 is referred to as "upper side." When viewing the water jacket 2A in the directions of the arrows as shown in FIG. 3, with the upper side of the water jacket 2A facing up, the near side is referred to as "front side." The section in which a discharge port 25 on the right is formed is referred to as "right side." The section in the vicinity of an introduction port 24 in relation to the flow of the refrigerant in the cooler 2 is referred to as "upstream side."

As shown in FIG. 3, the water jacket 2A of the cooler 2 is in the shape of a substantially rectangular cuboid. A main surface on the upper side of the cooler 2 is provided with a refrigerant introducing passage 21, an introduction port part 21a, a refrigerant discharge passage 22, a discharge port part 22a, and a cooling passage 23. Furthermore, in the water jacket 2A, a left side wall 2Ab thereof is provided with the introduction port 24 for introducing the refrigerant into the water jacket 2A, and a right side wall 2Ad on the other side is provided with the discharge port 25 for discharging the refrigerant to the outside. In other words, the introduction port 24 and the discharge port 25 are placed on a diagonal line of the water jacket 2A. These spaces for the refrigerant introducing passage 21 and the like are defined by a front side wall 2Aa, the left side wall 2Ab, a rear side wall 2Ac, the right side wall 2Ad, and a bottom wall 2Ae. Note that the fins 2C are shown in the diagram, for explanatory convenience.

The refrigerant introducing passage 21, functioning as a first passage, extends from the introduction port 24 to the right side wall 2Ad via the introduction port part 21a along a refrigerant inflow direction so as to be parallel to the front side wall 2Aa of the water jacket 2A. The refrigerant discharge passage 22, functioning as a second passage, extends linearly toward the discharge port 25 of the refrigerant from the left side wall 2Ab via the discharge port part 22a so as to be parallel to the rear side wall 2Ac. The refrigerant introducing passage 21 and the refrigerant discharge passage 22 are provided so as to be substantially parallel to each other.

The cooling passage 23, functioning as a third passage, is placed between the refrigerant introducing passage 21 and the refrigerant discharge passage 22 to communicate the refrigerant introducing passage 21 and the refrigerant discharge passage 22 with each other. In other words, the cooling passage 23 extends in a direction perpendicular to the directions in which the refrigerant introducing passage 21 and the refrigerant discharge passage 22 extend. Inner surfaces of the left side wall 2Ab and the right side wall 2Ad that define edges of the cooling passage 23 are formed perpendicular to a bottom surface of the cooling passage 23 and an inner surface of the rear side wall 2Ac.

The heat sink configured by the plurality of fins 2C is disposed on the cooling passage 23. The refrigerant flows through the passage defined by the fins 2C. The refrigerant introduced from the introduction port 24 is discharged from the discharge port 25 through the refrigerant introducing passage 21, the cooling passage 23, and the refrigerant discharge passage 22 in the water jacket 2A. The heat sink has a substantially rectangular cuboid shape, and has its left side surface, rear side surface, and right side surface disposed in the cooling passage 23 so as to be parallel to the inner surfaces of the left side wall 2Ab, the rear side wall 2Ac, and the right side wall 2Ad.

The water jacket 2A with the configuration described above can be made of, for example, aluminum, aluminum alloy, copper, copper alloy, or other metallic material. When creating the water jacket 2A using such a metallic material, the refrigerant introducing passage 21, refrigerant discharge passage 22, cooling passage 23, introduction port 24, and discharge port 25 can be die-casted. Besides these materials mentioned above, a material containing carbon filler can be used for the water jacket 2A. Ceramic materials, resin materials and the like can be used as well, depending on the type, temperature and the like of the refrigerant flowing in the water jacket 2A.

As shown in FIGS. 1 and 2, the surfaces of the water jacket 2A on which the refrigerant introducing passage 21, the refrigerant discharge passage 22, and a plurality of the cooling passages 23 are formed are sealed with the fin base 2B, except for the introduction port 24 and the discharge port 25. The plurality of fins 2C are implanted in a lower surface of the fin base 2B, with, for example, a base material 26 interposed therebetween.

Shapes of the fins 2C of the cooler 2 are described next.

Figure 4A:
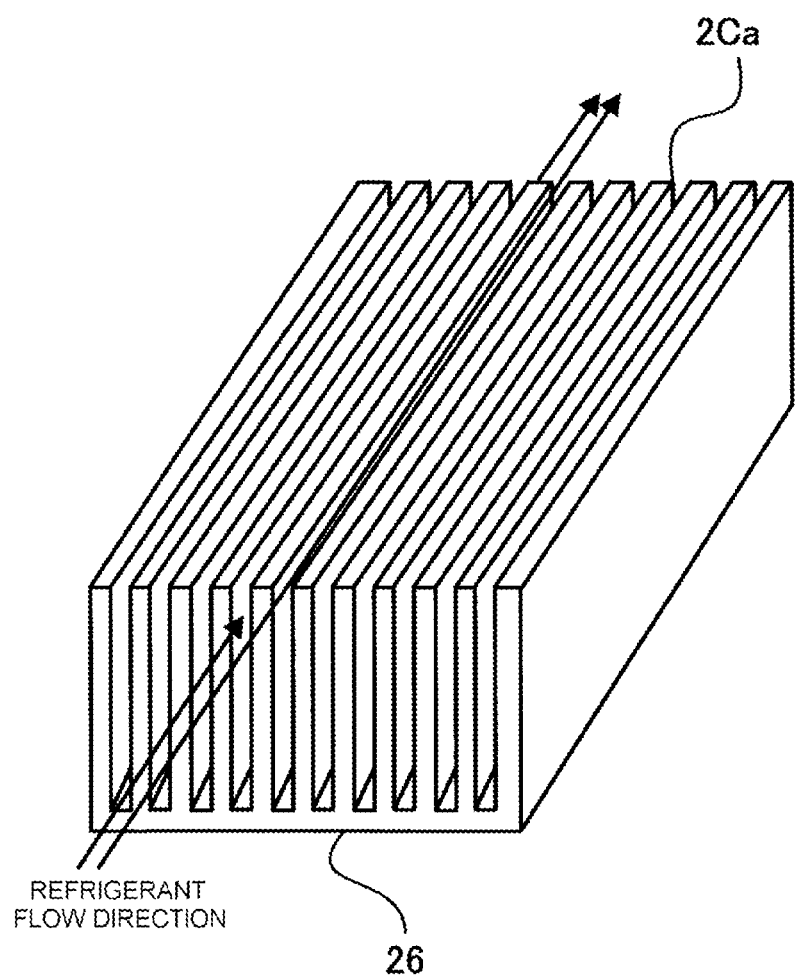
Figure 4B:
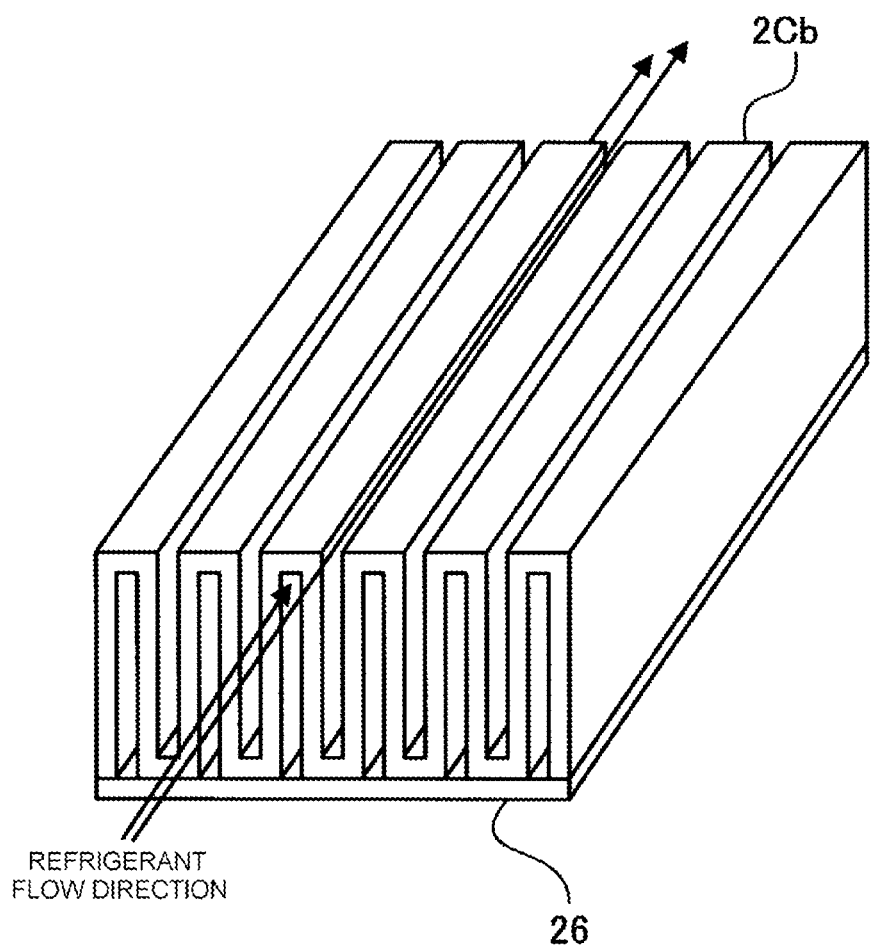

FIGS. 4(A) and 4(B) show the shapes of two types of fins. FIG. 4(A) is a perspective view of blade fins, and FIG. 4(B) a perspective view of corrugated fins.

As shown in FIG. 4(A), for example, the fins 2C of the cooler 2 can be formed as a plurality of plate-like blade fins 2Ca. The blade fins 2Ca are disposed in the cooling passage 23 to allow the refrigerant to pass therethrough in the direction indicated by the arrows shown in FIG. 4(A). The blade fins 2Ca are held by the base material 26 and the fin base 2B in the cooling passage 23.

Corrugated fins 2Cb as shown in FIG. 4(B) can be used as well.

The fins 2C in the shape of the blade fins 2Ca or the corrugated fins 2Cb are integrated with the fin base 2B and disposed facing the water jacket 2A, as shown in, for example, FIG. 2. The fins 2C are so formed into a size (height) as to provide a certain amount of clearance C between tip ends of the fins 2C and the bottom wall 2Ae of the water jacket 2A (see FIG. 1).

As shown in FIG. 1, the base material 26 is constructed integrally with the fin base 2B. The fins 2C are disposed in the cooling passage 23 of the water jacket 2A by directing the section of the fin base 2B on the fins 2C side toward the water jacket 2A. The fins 2C can be integrated with the fin base 2B itself. Or, a wire-cutting method can be adopted in which the fin base 2B is die-cast into the convex fins 2C.

A variety of conventionally known structures can be adopted to form the fins 2C. Because the fins 2C become a resistance to the refrigerant flowing through the cooling passage 23, it is desired that the fins 2C have a shape that produces less pressure loss to the refrigerant. Further, it is preferred that the shape and size of the fins 2C be set appropriately in consideration of the conditions for introducing the refrigerant to the cooler 2 (i.e., pump performance, etc.), the type of the refrigerant (viscosity, etc.), a desired level of heat removal, and the like.

The heat sink configured by the fins 2C has a substantially rectangular cuboid external shape or preferably a rectangular cuboid external shape, or may be chamfered or deformed within a scope that does not undermine the effects of the present invention.

As with the water jacket 2A, the fins 2C and the fin base 2B can be made of, for example, aluminum, aluminum alloy, copper, copper alloy, or other metallic material. Besides forming the fins 2C into the blade fins 2Ca or corrugated fins 2Cb described above, the fins 2C can be formed by joining predetermined metallic pins or plate bodies to the metallic base material 26.

The base material 26 to which the fins 2C are joined in the manner described above is joined to a predetermined region of the fin base 2B such as a metallic plate. In other words, the base material 26 is joined to a region corresponding to the cooling passage 23 shown in FIG. 1. Besides joining, to the fin base 2B, the base material 26 having the fins 2C joined thereto beforehand, the plurality of fins 2C can be joined directly to the fin base 2B to construct the heat sink.

When using the cooler 2, for example, the introduction port 24 is connected to a pump provided at its upstream, and the discharge port 25 is connected to a heat exchanger provided at its downstream, to construct a closed-loop refrigerant passage that includes the cooler 2, the pump, and the heat exchanger. The pump forces the refrigerant to circulate in this closed loop.

As shown in FIG. 2, for example, each of the circuit element parts 3A to 3C is constructed by forming two semiconductor elements 32 and two semiconductor elements 33 of different types, a total of four semiconductor elements, on a circuit board 31. As shown in FIG. 1, for example, the circuit board 31 has conductor patterns 31b, 31c formed on either side of an insulated substrate 31a.

A ceramic substrate made of, for example, aluminum nitride or aluminum oxide can be used as the insulated substrate 31a of the circuit board 31. Copper or other metal (e.g., copper foil) can be used to form the conductor patterns 31b, 31c on the insulated substrate 31a.

The semiconductor elements 32, 33 are joined to the conductor pattern 31b of the circuit board 31 by soldering or using joining layers 34 and then electrically connected to the conductor pattern 31b directly or by using wires (not shown).

The other conductor pattern 31c of the circuit board 31 having the semiconductor elements 32, 33 mounted thereon is joined to the fin base 2B of the cooler 2 via a joining layer 35.

In this manner, the circuit board 31 and the semiconductor elements 32, 33 mounted thereon are thermally connected to the cooler 2. Note that nickel-plated protective films may be formed on the exposed surfaces of the conductor patterns 31b, 31c and the wire surfaces that electrically connect the semiconductor elements 32, 33 and the conductor pattern 31b to each other, in order to protect these surfaces from contamination, corrosion, external force, and the like.

FIG. 5 is a diagram showing an example of a power conversion circuit configured as the semiconductor module.

Power semiconductor elements are used herein as the semiconductor elements 32, 33 mounted on the circuit board 31. For instance, as shown in FIG. 5, each of the semiconductor elements 32 can be constructed as a free wheeling diode (FWD) and each of the semiconductor elements 33 as an insulated gate bipolar transistor (IGBT).

The semiconductor module 10 can construct an inverter circuit 40 with, for example, three circuit element parts 3A to 3C.

FIG. 5 illustrates the inverter circuit 40 that converts a DC current into an AC current and supplies the resultant current to a three-phase AC motor 41. The inverter circuit 40 has bridge circuits configured by the IGBT semiconductor elements 33 and the FWD semiconductor elements 32 for three phases, a U-phase, V-phase, and W-phase. The three-phase AC motor 41 can be driven by switching the semiconductor elements 33 to convert a DC current into an AC current.

The circuit element parts 3A to 3C that are constructed as described above are disposed on the fin base 2B of the cooler 2. These circuit element parts 3A to 3C can be connected with one another so as to construct the inverter circuit on, for example, the cooler 2.

Each of the circuit element parts 3A to 3C generates heat when this power conversion circuit is operated. The heat is transmitted to the fin base 2B to which the circuit element parts 3A to 3C are joined, and then further transmitted to the fins 2C below the fin base 2B. Because the fins 2C are disposed within the cooling passage 23 as described above, the refrigerant passing through the cooling passage 23 cools the fins 2C. These heat-generating circuit element parts 3A to 3C are cooled by the cooler 2 in this manner.

The above has described a case in which the semiconductor module 10 is provided with the three circuit element parts 3A to 3C. However, the number of the circuit element parts is not limited to three, as in a semiconductor module shown in FIG. 6.

Figure 6A:
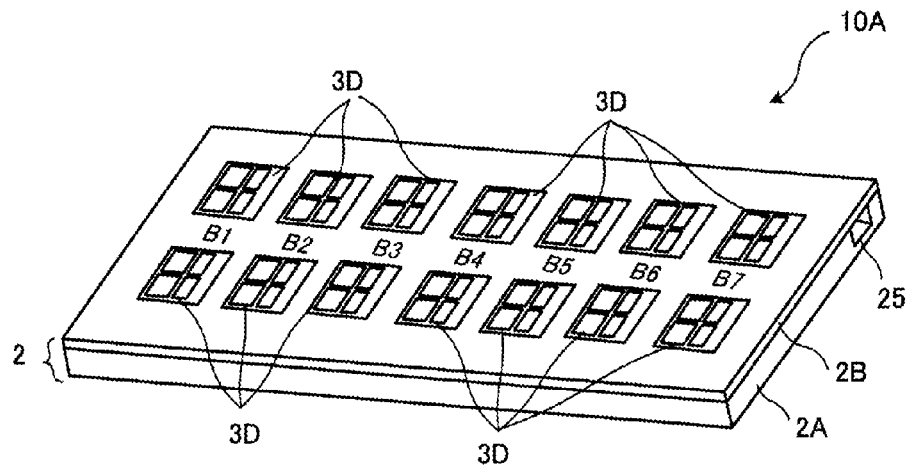
Figure 6B:
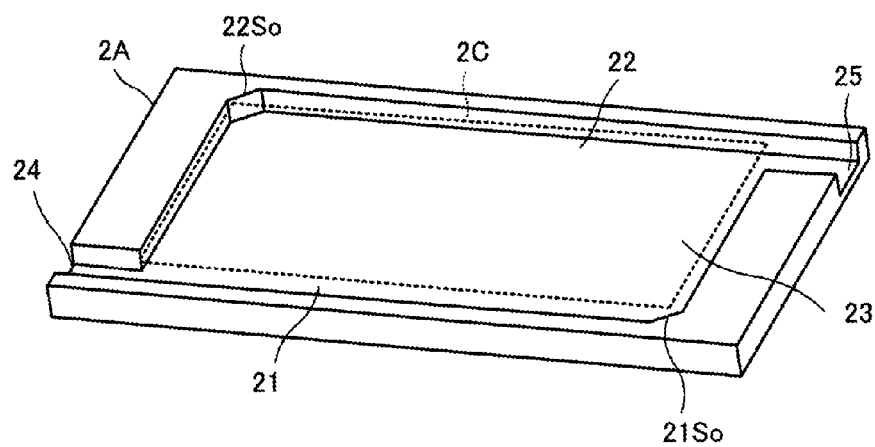

FIGS. 6(A) and 6(B) explains a first modification of a conventional semiconductor module. FIG. 6(A) is a perspective view showing an example of an arrangement of its circuit elements, and FIG. 6(B) is a perspective view showing the configurations of substantial parts of a water jacket of a cooler of the conventional semiconductor module.

In a semiconductor module 10A in FIG. 6(A), fourteen circuit element parts 3D are disposed; two lines (vertically on the fin base 2B) of seven circuit elements in a longer direction of the cooler 2 (rows B1 to B7). These circuit element parts 3D can be combined appropriately and connected with each other to construct a plurality of the inverter circuits 40 in FIG. 5.

As in FIG. 6(B), one of the main surfaces of the water jacket 2A is provided with the refrigerant introducing passage 21, the refrigerant discharge passage 22, and the cooling passage 23, wherein the cooling passage 23 is formed into a size corresponding to the fins 2C. The fins 2C are integrated with the fin base 2B and disposed facing the water jacket 2A, as shown in FIG. 2. The fin base 2B integrated with the fins 2C is eventually disposed on the water jacket 2A, as shown in FIGS. 1 and 2.

The fin base 2B and the water jacket 2A are joined to each other using an appropriate sealing material (not shown). The cooler 2 having the water jacket 2A, the fin base 2B, and the fins 2C can be constructed. A terminal end part of the refrigerant introducing passage 21 to which the refrigerant flows from the introduction port 24 and a leading end part of the refrigerant discharge passage 22 through which the refrigerant flows out to the discharge port 25 are chamfered to form guide parts 21So, 22So having an inclination angle of approximately 45°.

Figure 7:
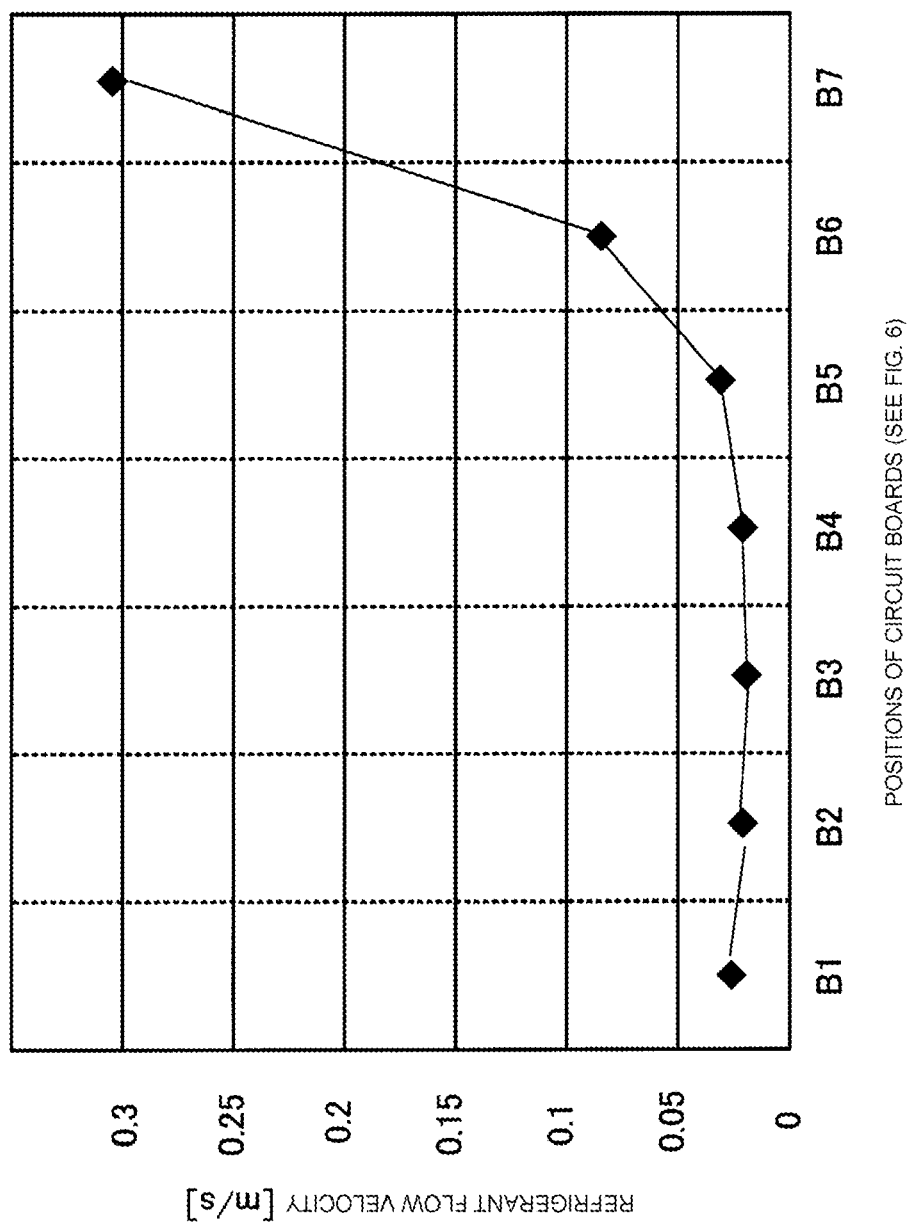
FIG. 7 is a diagram showing refrigerant flow velocities obtained at different positions of circuit boards of the semiconductor module shown in FIG. 6(A)

FIG. 7 is a diagram showing refrigerant flow velocities obtained at different positions of circuit boards of the semiconductor module shown in FIG. 6.

The graph shown in FIG. 7 illustrates an example of the flow velocities of the refrigerant flowing between the blade fins 2Ca of FIG. 4(A) disposed in the cooling passage 23 when the refrigerant is let flow from the introduction port 24 at a flow rate of 10 L/min. The characteristics shown in FIG. 7 form a reverse L shape, wherein the flow velocity of the refrigerant flowing between the fins 2C under the circuit boards of the circuit element parts 3D disposed at the position B7 in the seventh row is extremely higher than that of the refrigerant flowing under the circuit element parts 3D disposed in the other rows.

Where the fins 2C are disposed in the cooling passage 23 to be substantially perpendicular to the refrigerant introducing passage 21 as shown in FIG. 6, the refrigerant flowing between the fins 2C has drift characteristics in which the flow velocity of the refrigerant increases as it flows from the introduction port 24 toward the discharge port 25.

Figure 8A:
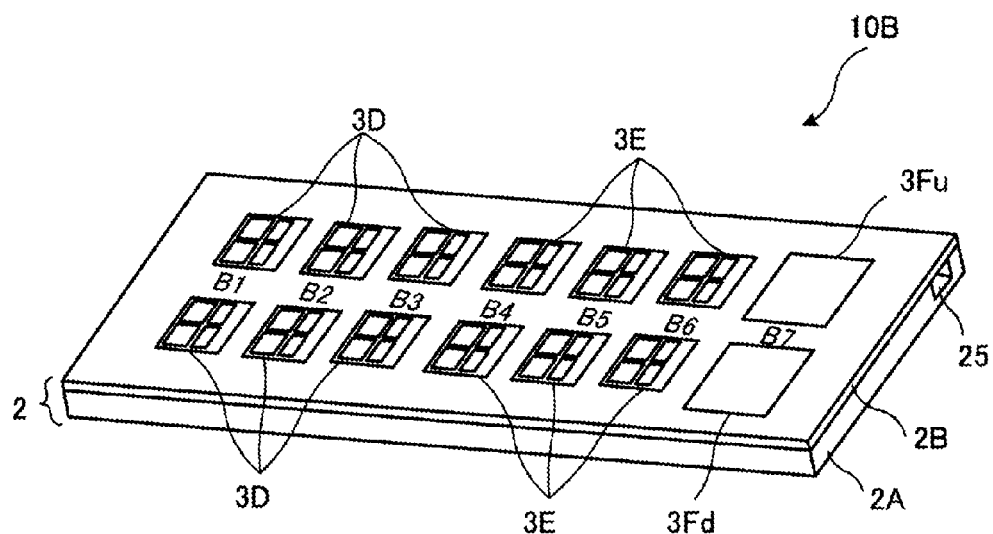
Figure 8B:
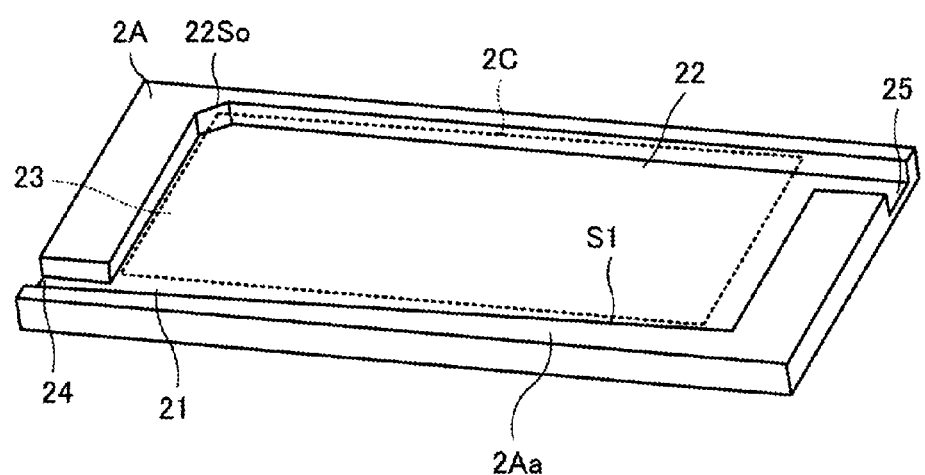

FIGS. 8(A) and 8(B) explain a second modification of the conventional semiconductor module. FIG. 8(A) is a perspective view showing an example of arrangement of circuit elements, and FIG. 8(B) is a perspective view showing the configurations of substantial parts of the water jacket of the cooler.

As with the semiconductor module shown in FIG. 6, a semiconductor module 10B shown in FIG. 8(A) has two lines of six circuit element parts 3D, 3E and has additional two circuit element parts 3Fu, 3Fd disposed on the cooler 2. These two circuit element parts 3Fu, 3Fd added here are constructed differently from the other twelve circuit element parts 3D, 3E.

The twelve circuit element parts 3D, 3E can be combined appropriately and connected with each other to construct a plurality of the inverter circuits 40 shown in FIG. 5. The circuit element parts 3Fu, 3Fd can be constructed into a boosting converter circuit that uses a predetermined number of IGBTs and FWDs.

For instance, the circuit element parts 3Fu, 3Fd of the boosting converter circuit are connected to a battery and the inverter circuit 40, and the voltage of the battery is increased by the circuit element parts 3Fu, 3Fd. The increased DC current is converted into an AC current by the inverter circuit 40 and supplied to the three-phase AC motor 41.

When newly adding the circuit element parts 3Fu, 3Fd that are different from the circuit element parts 3D, 3E, it is relatively easy to dispose the circuit element parts 3Fu, 3Fd at an end part of the semiconductor module 10B, as shown in FIG. 8(A), in view of a wiring layout and other configurations involved in designing or producing the circuits.

In this semiconductor module 10B, the fins 2C of the cooler 2 has two heat-generating sections that are disposed along the direction in which the refrigerant passes through the cooling passage 23. These heat-generating sections are respectively located on the upstream side and the downstream side of the direction in which the refrigerant flows. The temperature of the refrigerant flowing on the downstream side is already raised by heat absorption taking place on the upstream side. This improves the efficiency of cooling the circuit element parts 3D, 3E disposed on the upstream side.

In view of these circumstances, the circuit element parts can be cooled more easily by disposing the circuit element part 3D or 3E, whichever generates the highest amount of heat when being driven, near the refrigerant introducing passage 21 side. The refrigerant flowing through the cooling passage 23 of the cooler 2 has the drift characteristics in which the flow velocity of the refrigerant becomes higher in the vicinity of the discharge port 25 than in the vicinity of the introduction port 24. The cooling efficiency of the fins 2C is particularly high in the sections in the cooling passage 23 in which the refrigerant flows fast.

In the semiconductor module 10B described above, the refrigerant must flow at a flow velocity equal to or higher than a certain level in accordance with the heat generated by the circuit element parts 3D, 3E, 3Fu, 3Fd. However, if the refrigerant flow velocity is increased in a low-flow velocity part, an excessive amount of refrigerant flows in a high-flow velocity part. The refrigerant must be increased in amount and supplied to the cooler 2, requiring a high-performance pump.

FIG. 9 is a plan view showing a passage structure of the semiconductor module in FIGS. 8(A) and 8(B). This diagram illustrates the second modification of the guide part 21So conventionally employed. This guide part 21So has a different shape from the guide part 21So in FIG. 6 and configures a guide wall S1 inclined uniformly in the entire range in which the refrigerant introducing passage 21 faces the cooling passage 23.

In the conventional cooler 2, the guide part 21So is disposed at the terminal end part of the refrigerant introducing passage 21 as shown in the water jacket 2A of FIG. 6. In the cooler 2 in FIGS. 8 and 9, the front side wall 2Aa facing the heat sink is configured as the guide wall S1 provided over the entire refrigerant introducing passage 21, and the inclined surface of the guide wall S1 is formed to be longer than the guide part 21So in FIG. 6. It is well known that a flow velocity distribution of the refrigerant flowing from the introduction port 24 into the cooling passage 23 can be adjusted to some extent by shaping the guide part 21So in various ways above.

To simulate such flow characteristics, the thermal fluid analysis must be performed to analyze the flow, heat conduction, heat transfer, and other physical phenomena of the refrigerant. When obtaining an increase in the temperature of the refrigerant from the heat generated by the circuit element parts 3D, 3E, 3Fu, 3Fd, the results of the analysis can be obtained by considering a loss that occurs in a steady operation of the semiconductor module.

When simulating the refrigerant flow velocity distribution using the water jacket 2A having the conventional structure, the refrigerant introduced from the introduction port 24 into the water jacket 2A flows, at a high flow velocity, through the refrigerant introducing passage 21 extending linearly from the introduction port 24. Also, it is known that the refrigerant flowing into the cooling passage 23 flows relatively fast especially in the vicinity of the discharge port 25.

In the plurality of circuit element parts 3D, 3E, 3Fu, 3Fd it must maintain the flow velocity necessary for cooling the semiconductor elements 32, 33 in accordance with the occurring loss. However, when the breadth of the refrigerant flow velocity distribution increases due to the drift characteristics described above, the cooling performance of the refrigerant becomes similarly unbalanced. Although the cooling performance changes slowly with respect to a change in the flow velocity especially on the discharge port 25 side in the cooling passage 23 where the flow velocity increases, the cooling performance changes significantly on the introduction port 24 side where the flow velocity drops. This indicates the occurrence of a flow velocity component on the discharge port 25 side, which impedes the improvement of the cooling performance. If such drift characteristics can be improved, not only is it possible to achieve more stable cooling performance, but also the overall cooling performance can be improved.

Where the refrigerant discharge passage 22 or the discharge port 25 is so shaped as to cause a pressure loss or has extremely prominent drift characteristics, the refrigerant often rotates in the shape of a track in the water jacket 2A. Such a phenomenon can be prevented by adjusting the drift characteristics. It is effective to use the cooler 2 that creates less pressure loss and to accurately adjust the flow velocity, to ensure a refrigerant flow velocity equal to or higher than the certain level to cool each of the circuit element parts 3D, 3E, 3Fu, 3Fd, while curbing cost increases which emanate from changing the functions of the pump.

The drift characteristics of the refrigerant described above are the phenomena that occur in the parallel passage structure having the cooling passage 23 between the refrigerant introducing passage 21 and the refrigerant discharge passage 22. Therefore, reducing the cross-sectional area of the refrigerant introducing passage 21 is not enough to adjust the drift characteristics, because the flow velocity of the refrigerant flowing from the refrigerant introducing passage 21 into the cooling fins 2C disposed in the cooling passage 23 only intensifies the linearly flowing flow velocity component.

Particularly, increasing the interval between the cooling fins 2C disposed in the cooling passage 23 reduces the resistance to the refrigerant flowing from the refrigerant introducing passage 21 to the fins 2C, allowing the refrigerant to flow easily. Therefore, the wider the interval between the fins 2C, the more the refrigerant flow velocity distribution depends on an interval y0 between the terminal end part of the refrigerant introducing passage 21 and the fins 2C shown in FIG. 9.

This is described in detail. First, factors that affect the performance of the cooler 2 include;
(1) The performance of the pump used for introducing the refrigerant;
(2) The shape and thermal conductivity of the material of the fins 2C;
(3) The properties of the refrigerant itself (viscosity, thermal conductivity, temperature, etc.); and
(4) The shape of the refrigerant introducing passage 21 (width, depth, planar shape, etc.).

These factors can be considered to affect the performance of the cooler 2. Particularly the impact of the fourth factor on the cooling performance are examined hereinafter.

Figure 10A:
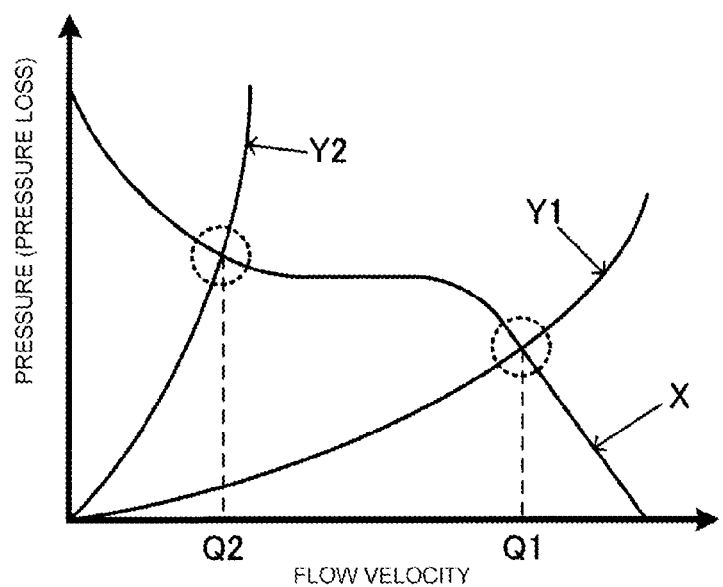
Figure 10B:
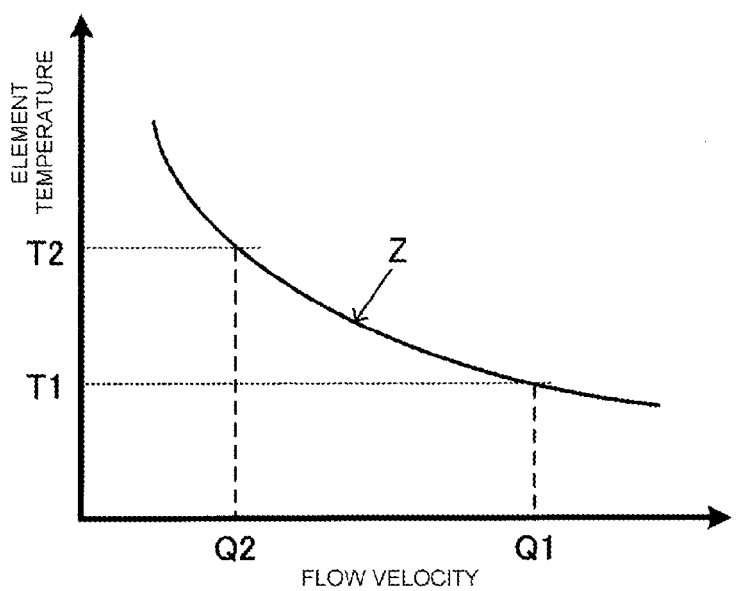

FIGS. 10(A) and 10(B) explain a general cooling performance of the cooler. FIG. 10(A) is a diagram schematically showing the relationship between the flow velocity and pressure of the refrigerant, and FIG. 10(B) is a diagram schematically showing the relationship between the flow velocity of the refrigerant and the element temperature.

In FIG. 10(A), the horizontal axis represents the flow velocities of the refrigerant, and the vertical axis represents pressure losses of the cooler. A curved line X, showing the pump performance, is defined by the abovementioned factor (1), i.e., the performance unique to the pump actually used.

Curved lines Y1, Y2 in FIG. 10(A) each represent the relationship between the refrigerant flow velocity and the pressure loss that are obtained respectively in the introduction port 24 and the discharge port 25 of a certain cooler 2. These curved lines are defined by the abovementioned factor (4), i.e., the shape of the refrigerant introducing passage 21. These curved lines can be obtained experimentally or based on the design of each cooler 2 to be used.

The flow velocity of the refrigerant that can flow in each cooler 2 can be determined based on these curved lines X, Y1, Y2. Flow velocities Q1, Q2 of the refrigerant are determined from the intersections between the curved line X, which shows the performances of the pump and heat exchanger used for circulating the refrigerant, and the curved lines Y1, Y2 showing the relationships between the flow velocity and the pressure loss.

For instance, where the example in FIG. 10(A) is the cooler 2 that shows the curved line Y1 in which the increase in the pressure loss with respect to the increase in the refrigerant flow velocity is relatively small, the flow velocity of the refrigerant that can flow in this cooler 2 is Q1, based on the intersection between the curved line Y1 and the curved line X. Where the example in FIG. 10(A) is the cooler 2 that shows the curved line Y2 in which the increase in the pressure loss with respect to the increase in the refrigerant flow velocity is relatively large, the intersection between the curved line Y2 and the curved line X is obtained at the upper left, showing that the flow velocity Q2 of the refrigerant that can flow in this cooler 2 is a lot lower than the flow velocity Q1 (Q2<Q1).

In FIG. 10(B), the horizontal axis represents the flow velocities of the refrigerant, and the vertical axis represents junction temperatures (element temperatures) of the semiconductor elements to be cooled. According to the relationship between the refrigerant flow velocity and the element temperature in FIG. 10(B), the element temperature increases as the refrigerant flow velocity decreases, as shown by a curved line Z. The curved line Z is defined by the abovementioned factors (2) and (3). Therefore, an element temperature T1 obtained at the refrigerant flow velocity Q1 is lower than an element temperature T2 obtained at the refrigerant flow velocity Q2 (T1<T2). It is obviously easier to prevent the increase in the element temperature by using the cooler 2 in which the refrigerant can flow at the high flow velocity Q1, than using the cooler 2 in which the refrigerant can flow at the flow velocity Q2.

Even with the cooler 2 that shows such a behavior as the curved line Y2 in which the pressure loss increases, the flow velocity of the refrigerant that can flow in this cooler 2 can be increased by using a pump of more excellent performance, preventing the increase in the element temperature. However, use of such a pump causes significant cost increases in the semiconductor module cooled by the cooler 2, and hence an electronic device equipped with the semiconductor module.

As in FIG. 10, the pressure loss increases in proportion to the square of the flow velocity, but the cooling performance only increases in proportion to the one-half power of the flow velocity. This means that more advantages can be achieved not by increasing the flow velocity of the refrigerant but by using a passage creating less pressure loss. Therefore, when minimizing the load required by the pump to reduce the costs, it is effective to adjust the flow velocity of the refrigerant to create less pressure loss.

Methods for adjusting the refrigerant flow velocity distribution of the cooler 2 are described below. These result from verifying the properties of the refrigerant itself (refrigerant characteristics) and the cooling performance of the refrigerant by simulation.

First Embodiment

A first embodiment describes the cooler 2 in which the guide part is disposed in the refrigerant introducing passage 21 so as to adjust a drift generated in the semiconductor module.

Figure 11A:
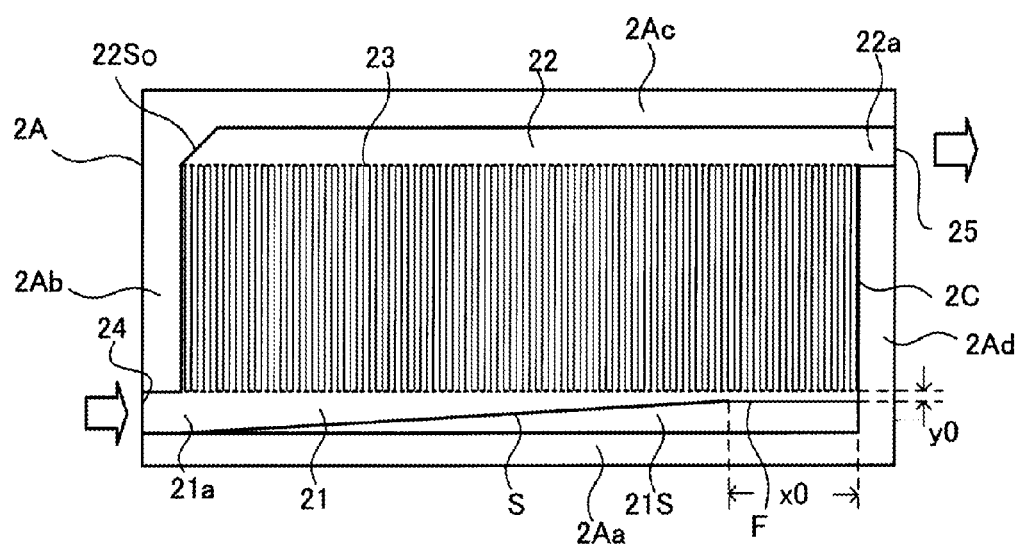

FIGS. 11(A) and 11(B) explain a passage structure of the semiconductor module of the present invention FIG. 11(A) is a plan view of the water jacket of the cooler, and FIG. 11(B) is an explanatory diagram showing different structures of the guide part by type.

First is described a passage structure in which the refrigerant introducing passage 21 is provided with a guide part 21S. In order to improve the flow velocity distribution of the cooling passage 23, the guide part 21S is configured by an inclined surface S having a predetermined inclination and a flat surface F, as shown in FIG. 11(A).

The guide part 21S of the present embodiment is formed on the front side wall 2Aa of the water jacket 2A, and the inclined surface S and flat surface F that face a front side surface of the heat sink configured by the fins 2C regulate the width of the refrigerant introducing passage 21. The inclined surface S functions to guide the refrigerant toward the front side surface of the heat sink. The inclined surface S is inclined at an angle of more than 0 degree and less than 90 degrees with respect to the front side surface of the heat sink. The flat surface F is disposed parallel to the front side surface of the heat sink. The angled part between the inclined surface S and flat surface F of the guide part 21S forms an obtuse angle, which makes the guide part 21S project toward the heat sink side in the middle of the refrigerant introducing passage 21.

The cross-sectional area of the refrigerant introducing passage 21 of the water jacket 2A of the present embodiment defined by the bottom wall 2Ae, the guide part 21S, and the front side surface of the heat sink becomes small gradually from the introduction port 24 of the refrigerant introducing passage 21 toward the terminal end part at a constant rate. The flat surface F is formed in the section where the rate of reduction of the cross-sectional area becomes zero in the middle of the refrigerant introducing passage 21. The heat sink is placed in a manner that the front side surface is substantially parallel to the inflow direction of the refrigerant flowing from the introduction port 24 and becomes flush with an inner wall of the introduction port part 21a so as not to block the flow of the refrigerant. The height of the refrigerant introducing passage 21, which is the interval between the bottom wall 2Ae of the water jacket 2A and the fin base 2B, is constant.

The leading end part of the refrigerant discharge passage 22 for letting the refrigerant flow out to the discharge port 25 is chamfered to form the guide part 22So having an inclination angle of approximately 45° to the rear side surface of the heat sink. Then, the rear side wall 2Ac extending toward the downstream side is formed parallel to the rear side surface of the heat sink. Forming the side wall of the refrigerant discharge passage 22 to be parallel to the rear side surface of the heat sink throughout the length of the refrigerant discharge passage 22 can reduce the pressure loss on the downstream side of the heat sink and achieve the effect of adjusting the flow velocity with the guide part 21S provided on the refrigerant introducing passage 21 side.

Suppose that 1.2 mm thick and 10 mm tall blade fins are disposed at a 2.1 mm pitch in the cooling passage 23 and that the refrigerant is introduced from the introduction port 24 to the refrigerant introducing passage 21 at a flow rate of 10 L/min. The impact of the difference in the structure of the guide part 21S on the refrigerant flow velocity distribution was confirmed by simulation for each type of passage in the guide part 21S.

Next is described the results of the simulation performed using the passage structure in FIG. 9 as a target for comparison.

Here, suppose that the internal (minimum value) y0 between the fins 2C and the guide wall S1 in FIG. 9 is 3 mm in both the guide part 21S of the refrigerant introduction passage 21 of type A and the guide part 21S of the refrigerant introducing passage 21 of type B. Suppose that the flat surface F having a length x0 of 30 mm and a 0-degree inclination is disposed on the terminal end side of the A-type refrigerant introducing passage 21. Suppose that the flat surface F having a length x0 of 40 mm is similarly disposed in the B-type refrigerant introducing passage 21. Suppose that the entire length, height, and width of each refrigerant introducing passage 21 are 255 mm, 10.5 mm, and 15 mm.

When three rows B1 to B3 and three rows B4 to B6 from the introduction port 24 are configured as two groups of circuit element parts as shown in FIG. 8(A), the losses applied to the circuit element parts 3D are set to be the same level immediately below the circuit element parts 3D, 3E. Different losses are set for the upstream-side circuit element part 3Fu and the downstream-side circuit element part 3Fd only in the seventh row. The loss values are set in accordance with the amount of heat generated, to satisfy the relation of 3D<3E<3Fu<3Fd, based on the relationship of the refrigerant flow velocity to the refrigerant temperature and the cooling performance. In so doing, with regard to the circuit element parts 3D in the first row (B1) and the circuit element parts 3E in the fourth row (B2), the IGBT elements disposed on the downstream side are taken as the targets for comparison. With regard to the circuit element parts 3F in the seventh row, the circuit element part 3Fd with a large loss is taken as the target for comparison.

Figure 13:
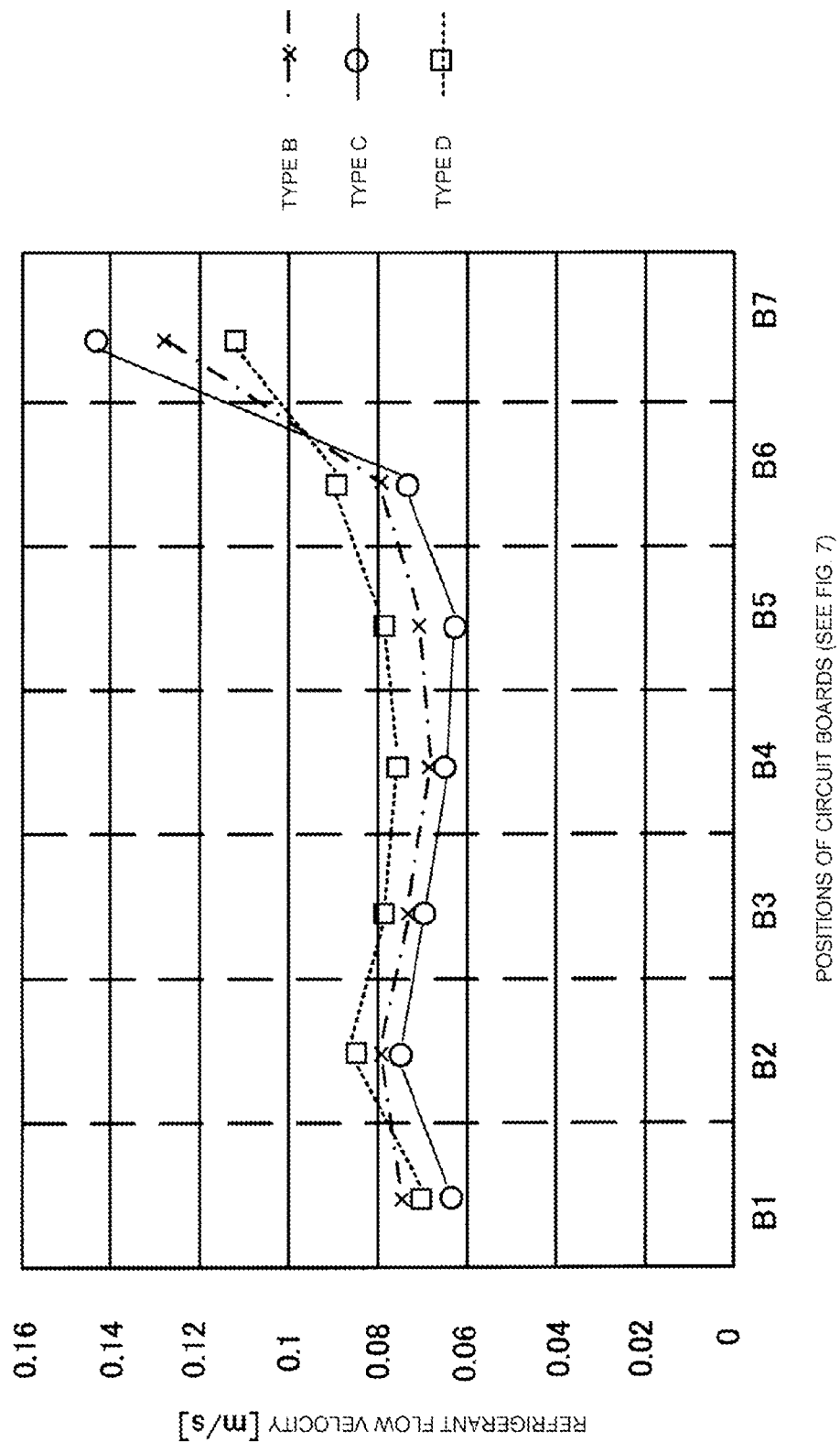
FIG. 13 shows the refrigerant flow velocities obtained at different positions of the circuit boards in accordance with the structure of the guide part of the semiconductor module shown in FIGS. 11(A) and 11(B)

FIGS. 12 and 13 are diagrams each showing the refrigerant flow velocities obtained at different positions of the circuit boards under the structure of the guide part of the semiconductor module in FIGS. 11(A) and 11(B). These are examples of the simulation results obtained by the abovementioned method.

The flow velocity distributions shown in the diagrams are the results obtained by simulating the flow velocities of the refrigerant flowing between the fins 2C disposed immediately below the center of the circuit board of each of the seven rows of circuit element parts 3D, 3E, 3Fu, 3Fd. This simulation shows the flow velocities of the refrigerant flowing from the introduction port 24 toward the discharge port 25 through the rows B1 to B7 sequentially.

According to the simulation result in FIG. 12, the flow velocity of the refrigerant obtained at each comparison position in the A-type guide part 21S is better than that of the guide part in FIG. 9, and the flow velocity of the refrigerant obtained at each comparison position in the B-type guide part 21S is better than that of the A-type guide part. In both the A-type guide part and the B-type guide part, the flow velocity is improved throughout the rows including the first row (B1) corresponding to the area near the introduction port where the flow velocity drops.

The average value of the flow velocities of the refrigerant obtained at the seven sections below the circuit boards is as follows, the refrigerant flowing between the fins 2C: 0.0609 m/s for the type in FIG. 9, 0.0805 m/s for type A, and 0.081 m/s for type B. Providing a plurality of inclinations to the refrigerant introducing passage 21 with the inclined surface S and the flat surface F increases the average flow velocity of the refrigerant by approximately 25%.

Sometimes the refrigerant flow velocity fluctuates as the refrigerant flows from a changing point of the inclined surface S of the guide part 21S (the position of the angled part between the inclined surface S and the flat surface F) toward the terminal end of the refrigerant introducing passage 21, reducing the flow velocity. Therefore, it is desired that an optimum length of the flat surface F be obtained based on the relationship between a set flow rate and the loss generated in each of the circuit element parts 3D, 3E, 3Fu, 3Fd.

The interval y0 between the fins 2C and the guide part 21S is also another factor that defines the guide part and brings the drift characteristics to the refrigerant. For the guide parts 21S of types B to D in FIG. 11(B), the length of a flat part F1 is set at a common value of 40 mm. The interval y0 between the fin 2C and the guide part 21S is set at 3 mm for type B, 2 mm for type C, and 4 mm for type D. The drift characteristics are compared with one another.

FIG. 13 shows an example of the simulation result regarding the drift characteristics.

The average flow velocity of the refrigerant flowing between the fins 2C disposed immediately below the center of the circuit board of each of the circuit element parts 3D, 3E, 3Fu, 3Fd is 0.078 m/s for type C, 0.081 m/s for type B, and 0.083 m/s for type D. Therefore, increasing the interval y0 from 2 mm to 4 mm improves the average flow velocity. Compared to the conventional guide part 21So (0.0609 m/s) that constructs the guide wall S1 formed to be entirely linear, the average flow velocity is improved by approximately 25% due to the reduction in the drift.

The drift can be adjusted by providing the guide part 21S with a plurality of types of inclined surfaces S and flat surfaces F, and the overall flow velocity of the refrigerant flowing immediately below the center of the circuit board of each of the circuit element parts 3D, 3E, 3Fu, 3Fd can be improved. From this simulation result, heat generation states of the power semiconductor elements were confirmed by applying a loss to each of the circuit element parts 3D, 3E, 3Fu, 3Fd in the passages having the guide part in FIG. 9, the guide part 21S of B-type, and the guide part 21S of D-type, from among the passage having the guide part 21S in FIG. 11(B).

Figure 14A:
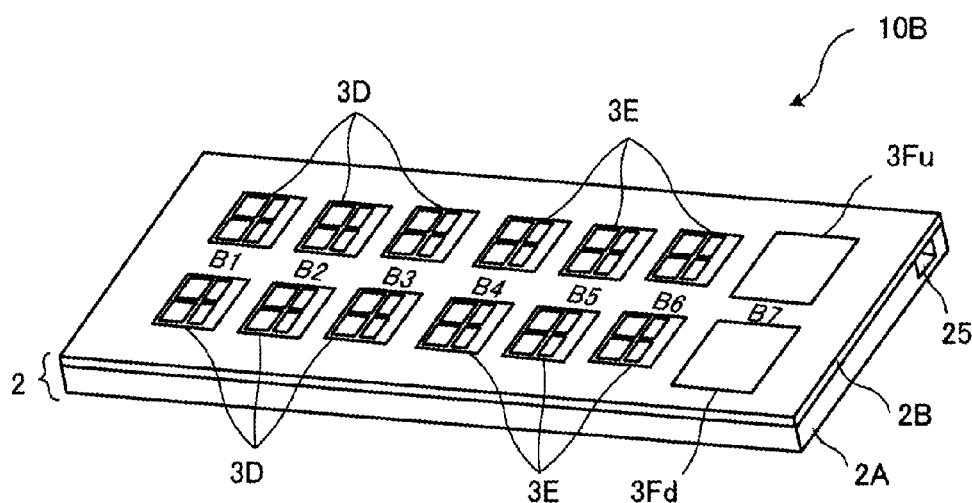
Figure 14B:
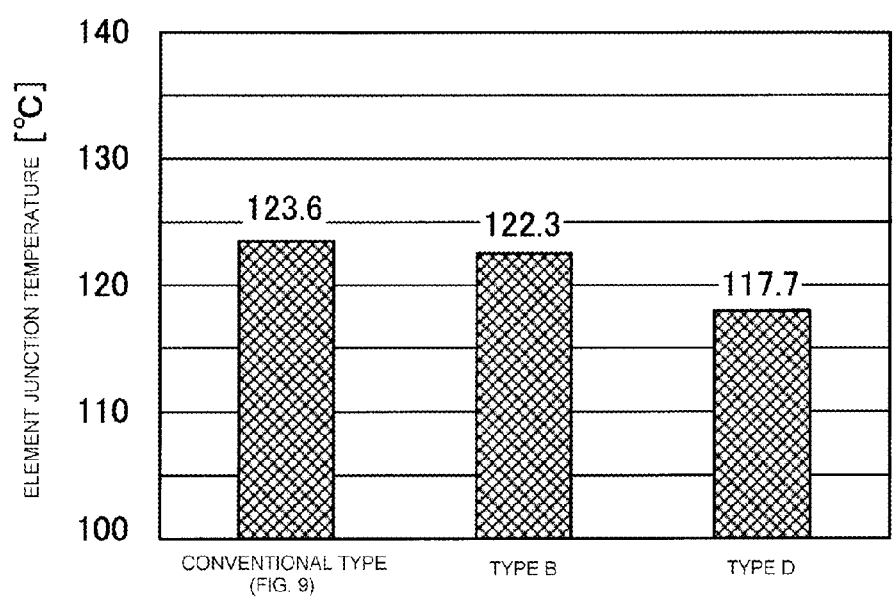
Figure 15A:
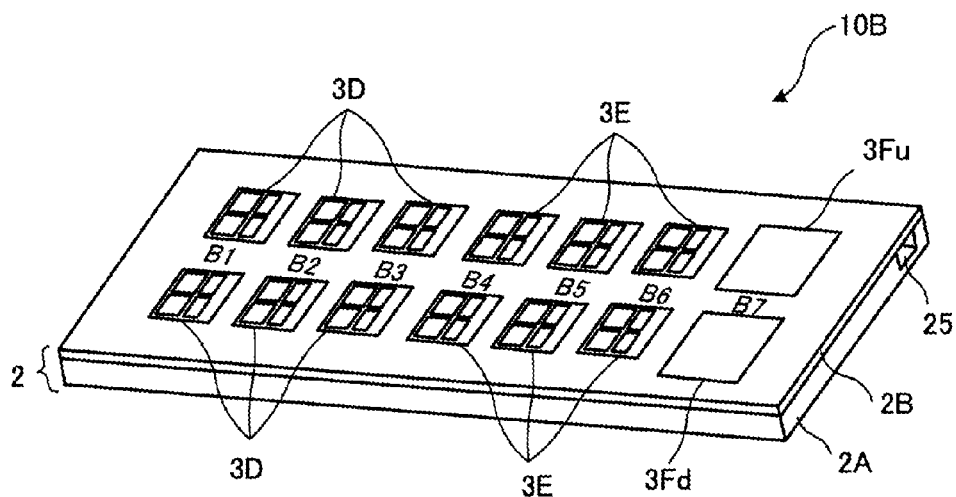
Figure 15B:
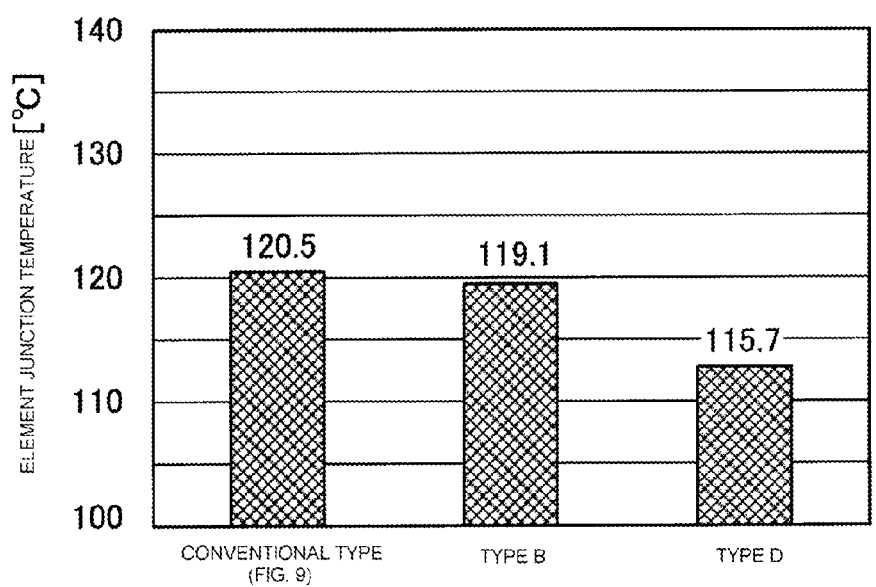
Figure 16A:
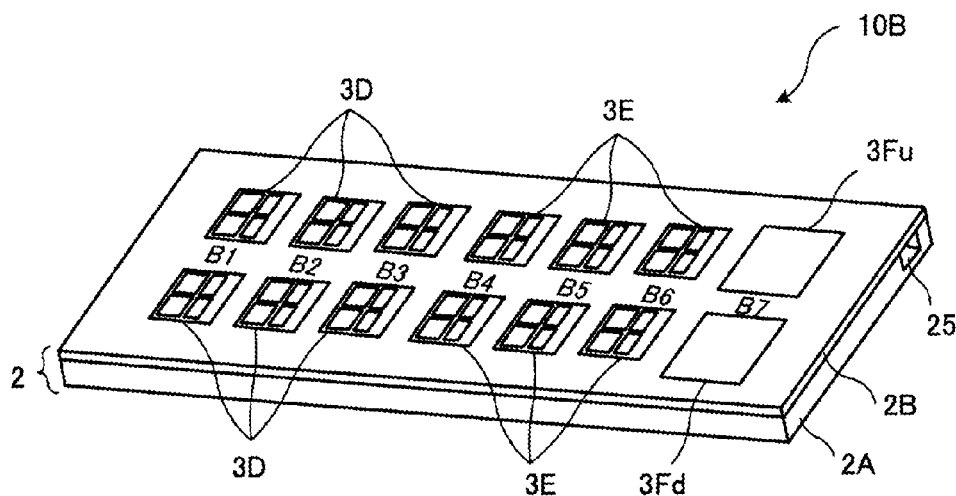
Figure 16B:
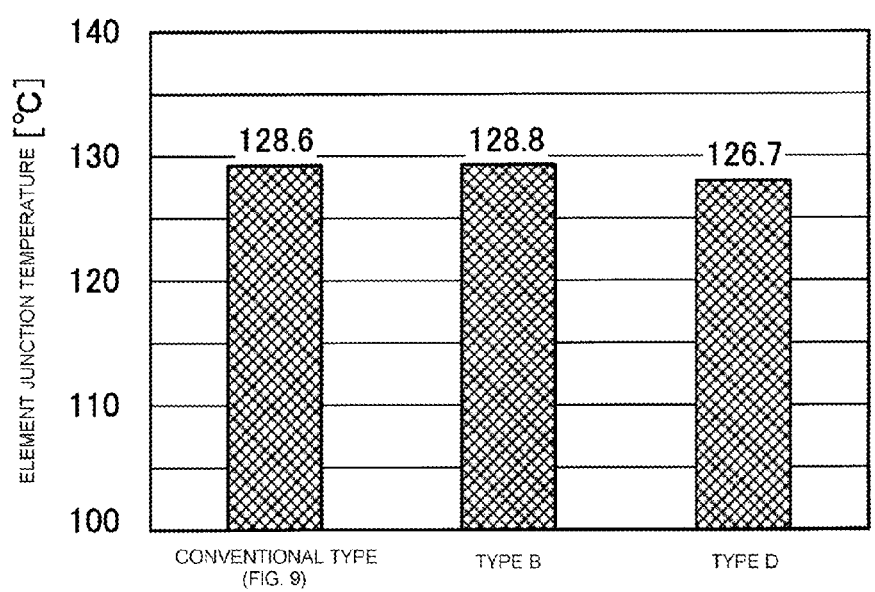

FIGS. 14 to 16 are diagrams each explaining the performance of the water jacket shown in FIG. 11. FIGS. 14(A), 15(A) and 16(A) show an example of arrangement of the circuit elements, and FIGS. 14(B), 15(B) and 16(B) show heat generated during the steady operation. Here, examples of the results of simulating generated heat values are shown.

The flow velocity of the refrigerant flowing immediately below the center of the circuit board of each of the circuit element parts 3D, 3E, 3Fu, 3Fd can be improved by improving the structure of the guide part, and this improvement effect can reduce the junction temperatures of the power semiconductor elements. As shown in FIG. 14(B), the junction temperature of each circuit element part 3D disposed at the position B1 in the first row providing the highest effect is 123.6° C. in the conventional shape (FIG. 9), 122.3° C. in type B, and 117.7° C. in type D. Therefore, because the junction temperature in type D is lower than that of the conventional shape (FIG. 9) by 5.9° C., the cooling efficiency can be improved by 5%.

As shown in FIG. 12, the flow velocity of the refrigerant flowing through the circuit element parts 3E disposed at the position B4 in the fourth row generating a high set loss is lower than those obtained at the other positions, but the junction temperature of these circuit element parts can be reduced as shown in FIG. 15(B).

In this effect, a flow velocity of 0.1 m/s required for cooling the semiconductor elements is kept in the water jacket 2A with respect to the loss values, and the impact of thermal interference is lowered. Therefore, it is clear that when the flow velocity of the refrigerant flowing between the fins 2C is 0.05 m/s or lower, the flow velocity affects the cooling performance significantly, and that stable cooling performance can be obtained when the flow velocity is 0.1 m/s or higher. As shown in FIG. 16(B), for all three types (i.e., conventional type, type B and type D), a similar or the same level of cooling performance is obtained in the power semiconductor element 3Fd which is disposed at the position B7 in the seventh row.

Note that predetermined improvements are confirmed in the same simulations performed on the guide parts of types E to I shown in FIG. 11(B), other than the guide parts of types A to D described above.

According to the simulation results, the following guide part structures are preferably used for adjusting the refrigerant flow velocity distribution. Regarding one guide part structure, the changing point of the inclination angle, which is the position of the angled part between the inclined surface S and the flat surface F, is placed within a ¼ range from the terminal end part with respect to a longer direction of the refrigerant introducing passage 21 facing the introduction port 24 and the fins 2C. Further, the interval between the guide part 21S and the fins 2C at the terminal end part of the refrigerant introducing passage 21 is set at 1 mm or above and ⅓ or less of the maximum width of the refrigerant introducing passage 21.

Second Embodiment

Figure 17:
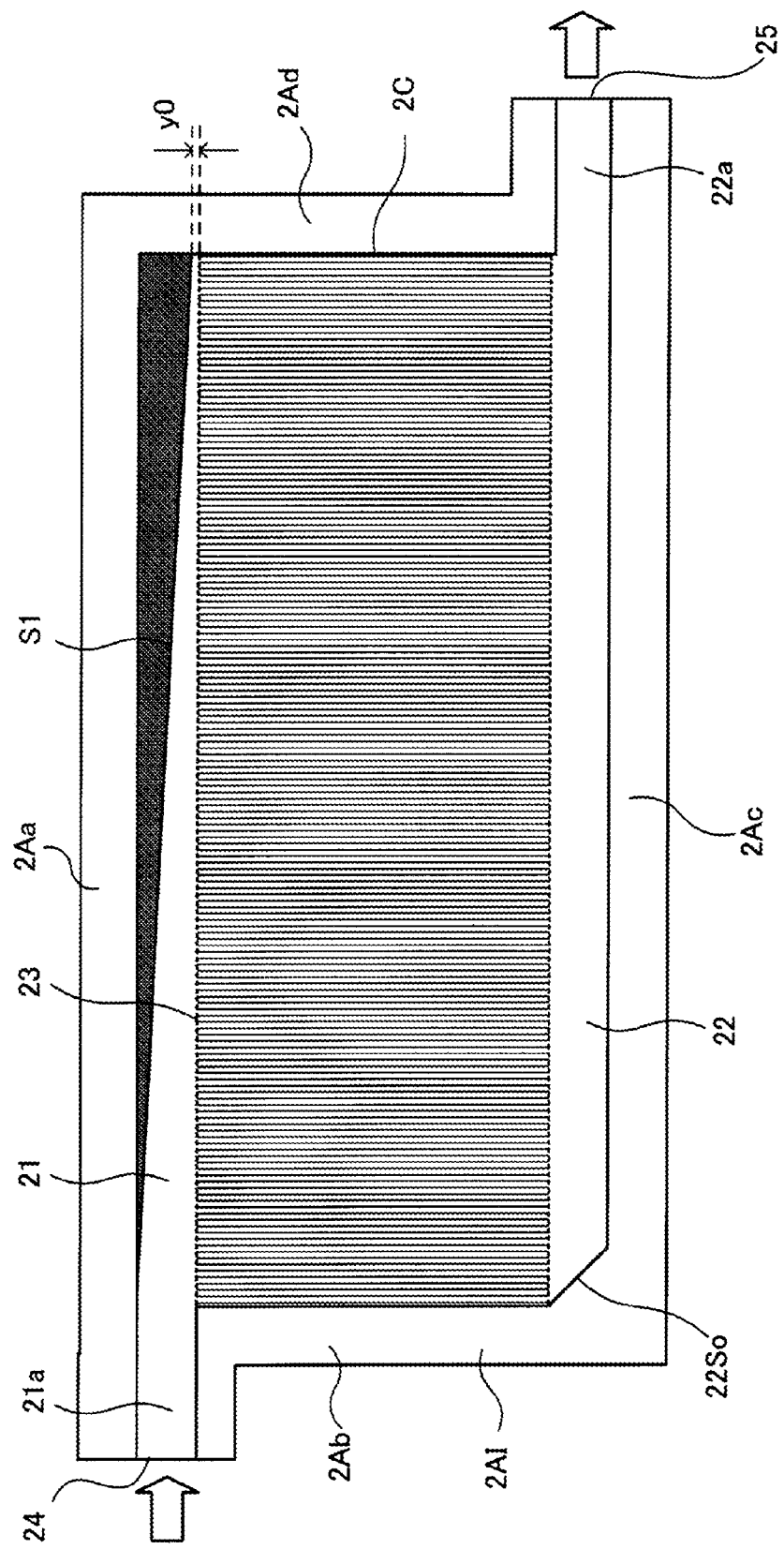
FIG. 17 is a plan view showing a water jacket of the conventional semiconductor module, wherein the passage structure of the water jacket is different from that shown in FIG. 9.

FIG. 17 is a plan view showing a water jacket of the conventional semiconductor module, wherein the passage structure of the water jacket is different from that shown in FIG. 9. In the diagrams subsequent to FIG. 17, the positions of the refrigerant introducing passage 21 and the refrigerant discharge passage 22 are switched back and forth from those illustrated in FIGS. 2, 9.

In this embodiment, the introduction port part 21a and the discharge port part 22a project from the left side wall 2Ab and the right side wall 2Ad of a water jacket 2AI, respectively. A tubular pipe or the like is connected to the water jacket 2AI, and the refrigerant sent from the pump flows into the cooler 2 and then flows out of the discharge port part 22a. As with the refrigerant introducing passage 21 shown in FIG. 9, a side wall of the refrigerant introducing passage 21 of this embodiment is configured by the guide wall S1 that is inclined uniformly in the entire range in which the refrigerant introducing passage 21 faces the cooling passage 23.

The introduction port part 21a of the refrigerant introducing passage 21 and the discharge port part 22a of the refrigerant discharge passage 22, which are provided in order to connect the pump and the cooler 2 to each other, are the cause of disrupting the balance of the difference in pressure between the introduction port 24 and the discharge port 25, depending on the cross-sectional areas of the passages, and therefore change the drift characteristics. The refrigerant sometimes rotates in the shape of a race track through the refrigerant introducing passage 21, the refrigerant discharge passage 22, and the cooling passage 23. This phenomenon is prominent especially when the refrigerant flows abnormally at or around the discharge port 25 and cannot be discharged easily.

According to the drift characteristics observed in the cooling passage 23 of the cooler 2, the flow velocity of the refrigerant is low on the introduction port 24 side and high on the discharge port 25 side. Therefore, the flow velocity component moving toward the discharge port 25 in the refrigerant discharge passage 22 is increased on the discharge port 25 side in the cooling passage 23, collides with the wall surface of the refrigerant discharge passage 22 near the introducing passage 24, and is reduced by the flow velocity component returning toward the introduction port 24. When the refrigerant discharge passage 22 and the discharge port 25 have an element that causes an increase in pressure loss, a method must be devised to allow the refrigerant to flow on both the introduction port 24 side and the discharge port 25 side in the cooling passage 23 at an equal flow velocity.

Next is described a second embodiment in which the drift is adjusted by forming the guide part in the passage of such a semiconductor module in which the refrigerant introducing passage 21 and the refrigerant discharge passage 22 are so shaped that the refrigerant cannot flow smoothly at the terminal end parts.

FIG. 18 is a plan view showing a water jacket that has a passage structure in which a guide part with two inclined surfaces is formed, the two inclined surfaces being inclined at different angles.

Of the passages of the cooler 2 used for adjusting the drift, an inclined member S2 of isosceles triangular planar shape configures the guide part. As with the water jacket shown in FIG. 17, the water jacket 2AI has the refrigerant introducing passage 21 formed by the conventionally used guide wall S1, wherein the inclined member S2 is superposed on the guide wall S1 to configure a new guide part forming two different inclination angles. The inclined member S2 configuring the new guide part has a first inclined surface that is inclined to guide the refrigerant toward the front side surface of the heat sink configured by the fins 2C, and a second inclined surface that is inclined similarly. The new guide part provides the maximum inclination angle using the first inclined surface that is located on the upstream side of the refrigerant introducing passage 21 facing the fins 2C within the cooling passage 23, and the second inclined surface is formed subsequently in a manner as to extend from a changing point P of the inclination angle toward the terminal end. The angled part between the first inclined surface and the second inclined surface projects toward the heat sink.

Therefore, the guide part formed in the refrigerant introducing passage 21 is different from that of the water jacket 2AI shown in FIG. 17 in having a plurality of inclined surfaces and configuring a surface having the largest inclination angle at the introduction port 24. The cooling performance of the cooler 2 can be improved in the case where the circuit element parts 3D, 3E, 3Fu, 3Fd with different loss values are disposed in a manner that great losses are generated in the circuit element parts 3D shown in FIG. 8(A).

In the refrigerant introducing passage 21 in which the inclined member S2 is disposed on the guide wall S1 as shown in FIG. 18, the flow velocity distribution of the refrigerant in the cooling passage 23 can be improved by disposing the two inclined surface in a manner that the cross-sectional areas of the refrigerant introduction passage 21 declines gradually in a refrigerant introduction direction. The guide part for improving the flow velocity distribution of the refrigerant in the cooler 2 can be configured not only by the abovementioned isosceles triangular inclined member S2, but also by the following members.

Modifications of the structure of the guide part for adjusting the drift are described next referring to FIGS. 19 to 21.

FIG. 19 is a plan view showing the water jacket having a passage structure in which a guide part with two surfaces is formed, the two surfaces being different in length from the ones shown in FIG. 18.

As with the water jacket shown in FIG. 18, the water jacket 2AI a guide part having a plurality of inclined surfaces is configured in the refrigerant introducing passage 21 with an inclined member S3. However, this guide part is different from the one in FIG. 18 in that the inclination angles of the inclined surfaces are the greatest in the vicinity of the center of the refrigerant introducing passage 21. In the planar shape of the inclined member S3, a peak (changing point P) facing the fins 2C inside the cooling passage 23 is close to the terminal end part of the refrigerant introducing passage 21. Therefore, the cooling performance of the cooler 2 can be improved where the circuit element parts 3D, 3E, 3Fu, 3Fd with different loss values are disposed in a manner that a great loss is generated at the position B4 in the fourth row shown in FIG. 8(A).

FIG. 20 is a plan view showing the water jacket having a passage structure in which a guide part with three inclined surfaces is formed, the three inclined surface being inclined at different angles.

In this water jacket 2AI, an inclined member S4 is disposed in the refrigerant introducing passage 21 to configure three inclined surfaces. The inclined member S4 is configured to have a planar shape in which the inclination angle of a second inclined surface 21b is the greatest. The position of the second inclined surface 21b is not limited to the center of the refrigerant introducing passage 21.

The inclination angles of the three inclined surfaces can be set within the range of 5° to 45°. Therefore, when any of the circuit element parts 3D, 3E, 3Fu, 3Fd generates heat locally, efficient cooling can be realized by providing the inclined member S4 in a manner that the second inclined surface 21b is disposed in a position corresponding to the heat-generating position.

A position in the refrigerant discharge passage 22 that corresponds to the position of the second inclined surface 21b may be provided with a guide piece 22G for guiding the refrigerant to the discharge port 25 at a predetermined inclination angle. The flow velocity of the refrigerant flowing toward the discharge port 25 can further be increased. The height of the guide piece 22G is preferably equal to or lower than 70% of the refrigerant discharge passage 22. On the refrigerant discharge passage 22, the guide piece 22G is preferably inclined at an inclination angle of 60 degrees or lower with respect to a longer direction of the refrigerant discharge passage 22, and is preferably disposed near the fins 2C with respect to the center of a width direction of the refrigerant discharge passage 22.

FIG. 21 is a plan view of the water jacket having a passage structure in which a parallel surface near the terminal end part of the first passage is concaved.

As with the water jacket shown in FIG. 18, in the water jacket 2AI an inclined member S5 with a plurality of inclined surfaces configures a guide part formed in the refrigerant introducing passage 21. However, this guide part is different from the one shown in FIG. 18 in that the inclined member S5 has a concavity 21c in the vicinity of an end part of the refrigerant introducing passage 21 and configures the inclined surfaces that are reversed along the refrigerant introduction direction.

In FIG. 21, the refrigerant flowing from the introduction port 24 is divided into two refrigerants, one flowing in upward direction and the other one flowing downward direction, by the concavity 21c located in a position immediately before the terminal end part of the refrigerant introducing passage 21 in which the refrigerant collides. Therefore, the refrigerant flowing directly into the fins 2C merges into the refrigerant again that flows in the opposite direction and collides with the concavity 21c. As a result, the flow velocity of the refrigerant flowing toward the cooling passage 23 is increased, improving the cooling performance.

Third Embodiment

Next is described a method for adjusting the drift by forming a step in a height direction in the refrigerant introducing passage 21 to adjust the drift.

Figures 22B, 22C:
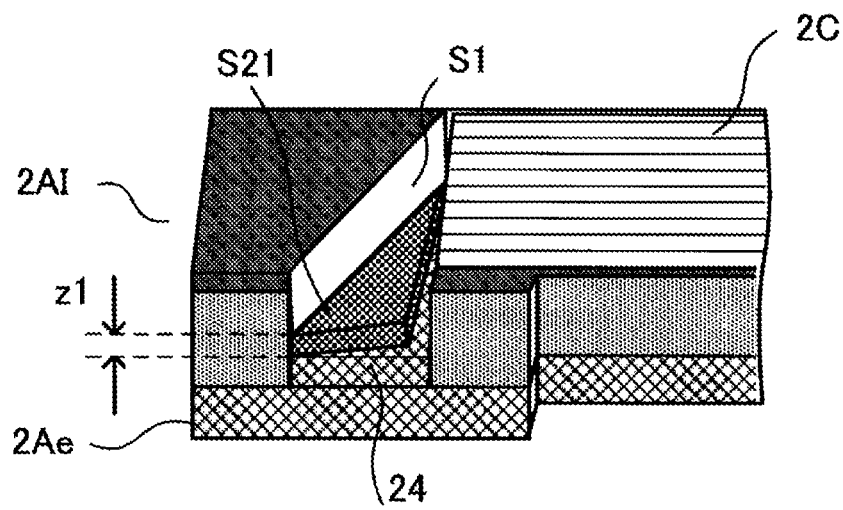

FIGS. 22(A), 22(B) and 22(C) show a passage structure having steps in a height direction in the semiconductor module shown in FIG. 17. FIG. 22(A) is a plan view showing substantial parts of the water jacket of the cooler, FIG. 22(B) is a cross-sectional diagram taken along the arrow L2-L2 in the vicinity of a refrigerant introduction port, and FIG. 22(C) is an explanatory diagram showing the guide part structures by type.

In the water jacket 2AI of the present embodiment, an inclined member S21 is superposed along the inclined surface of the guide wall S1 in the refrigerant introducing passage 21 configured by the inclined guide wall S1. The guide part configured by the inclined member S21 forms a side wall that is inclined with respect to the front side surface of the heat sink. The inclined member S21 has two inclined surfaces that are inclined to guide the refrigerant toward this front side surface. In this inclined member S21, the inclination angles of the inclined surfaces with respect to the front side surface of the heat sink are made different from the inclination angle of the guide wall S1, and steps are formed in the height direction of the passage.

In other words, compared to the structure of the guide part 21S of the first embodiment, the inclined member S21 is formed in the shape of a belt within a range between a bottom surface of the water jacket 2AI and a predetermined height level. The interval between the front side surface of the heat sink and the inclined surfaces of the inclined member S21 becomes narrow from an opening part of the refrigerant introducing passage 21 to the terminal end part of the same. The rate of reduction of the interval changes at the angled part between the upstream-side inclined surface and the downstream-side inclined surface and declines gradually. This angled part projects toward the heat sink. Therefore, the cross-sectional area of the section defined by the front side surface of the heat sink, the guide wall S1, and the inclined member S21 also declines in the same manner.

By forming such a multi-step guide part provided with a plurality of steps in the height direction of the passage, the flow velocity distribution of the refrigerant flowing from the refrigerant introducing passage 21 to the cooling passage 23 can be improved, preventing the refrigerant from flowing backwards.

Next is described the impact of the difference in the guide part structure onto the flow velocity distribution.

The plate-like blade fins 2Ca having a thickness of 1.2 mm are disposed at a 2.1 mm pitch on the cooling passage 23. The height of each plate-like blade from the base material 26 is 10 mm. The interval between the tip ends of the blade fins 2Ca and a bottom part of the water jacket 2AI is 0.5 mm. The refrigerant is introduced into the introduction port 24 at a flow rate of 10 L/min. A simulation was performed under these conditions.

Next are described the results of the simulation that was performed using the passage structure of the conventional semiconductor module of FIG. 17 as a target for comparison.

In the semiconductor module shown in FIG. 17, the shape of the refrigerant introducing passage 21 formed by the guide wall S1 configures the linear inclined surface over the entire range facing the cooling passage 23. In a second guide part configured by the inclined member S21, on the other hand, the two inclined surfaces are configured, as shown in FIG. 22(A), wherein the inclined member S21 is disposed on the bottom surface of the refrigerant introducing passage 21 along the inclined surfaces of the guide wall S1.

Here, the first inclined surface of the inclined member S21 functioning as the second guide part has a basing point at a section inside the refrigerant introducing passage 21 where the refrigerant first enters the fins 2C from the introduction port 24. The distance x1 between this basing point and the changing point of the inclination angle is set at 10.0 mm. The interval y0 between the guide part of the inclined member S21 and the fins 2C at the terminal end part of the refrigerant introducing passage 21 is set at 4.0 mm. The refrigerant introducing passage 21 has a total length of 255 mm, a height of 10.5 mm from the bottom surface, and a width of 15 mm.

Additionally, it is preferred that a height z1 of the inclined member S21 be equal to or less than ½ of the height of the refrigerant introducing passage 21, as shown in FIG. 22(B). In the case where the heights of the refrigerant introducing passage 21, the refrigerant discharge passage 22, and the cooling passage 23 of the water jacket 2AI are set at 10 mm, the height z1 of the inclined member S21 is set at 2.5 mm for a J-type guide part and 5.0 mm for a K-type guide part, as shown in FIG. 22(C).

Figure 23:
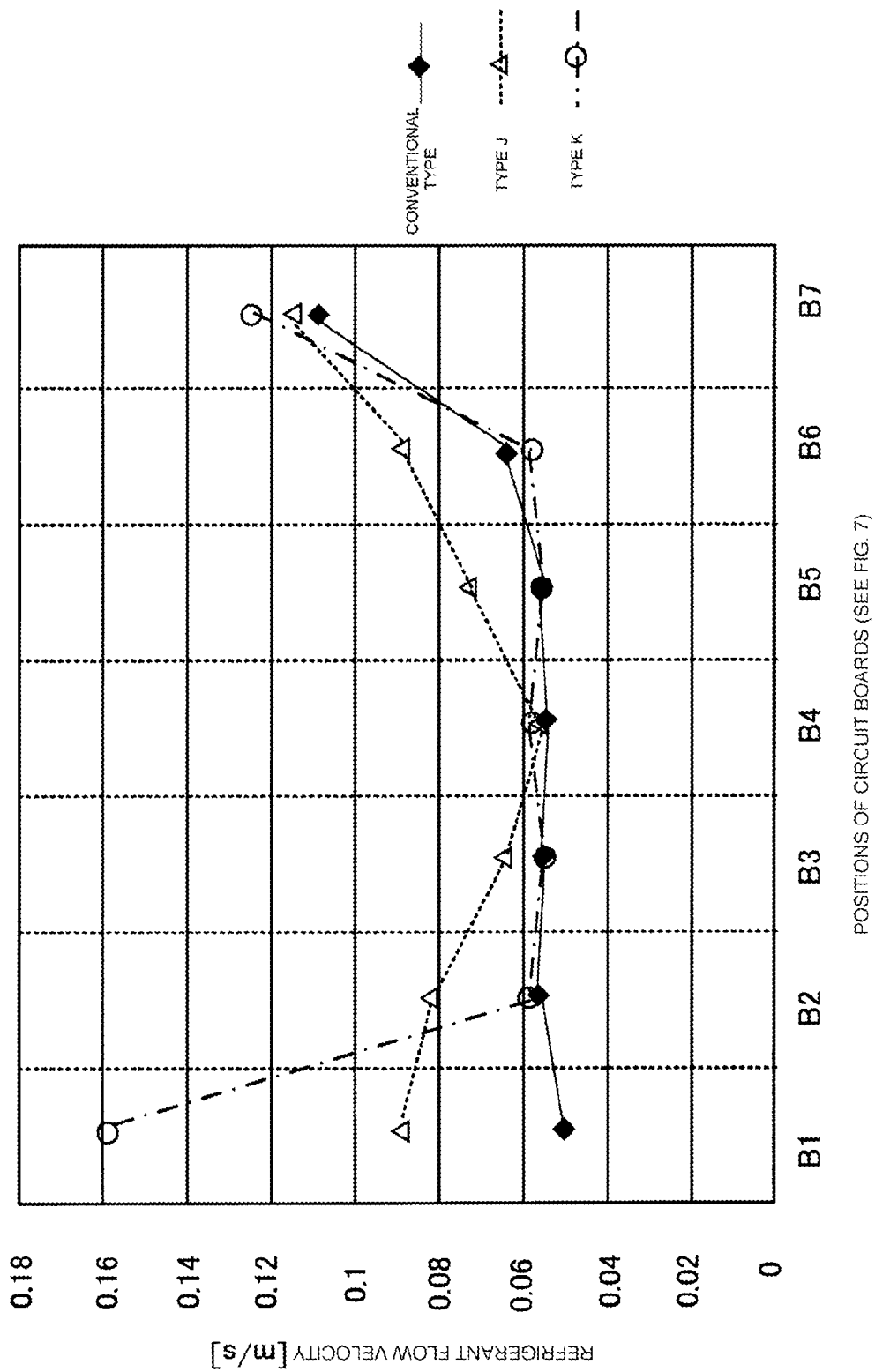
FIG. 23 is a diagram showing the refrigerant flow velocities obtained at different positions of the circuit boards in accordance with the structure of the guide part of the semiconductor module shown in FIGS. 22(A) to 22(C)

FIG. 23 is a diagram showing the refrigerant flow velocities obtained at different positions of the circuit boards in accordance with the structure of the guide part of the semiconductor module in FIGS. 22(A) to 22(C).

As with the flow velocity distributions shown in FIG. 12 and the like of the first embodiment, the flow velocity distribution shown in FIG. 23 is the result obtained by simulating the flow velocities of the refrigerant flowing between the fins 2C that are disposed immediately below the center of the circuit board of each of the seven rows of circuit element parts 3D to 3F. This simulation shows the flow velocities of the refrigerant flowing from the introduction port 24 toward the discharge port 25 through the rows B1 to B7 sequentially.

According to the flow velocity distribution shown in FIG. 23, the refrigerant flows from the introduction port 24 of the cooling passage 23 at a higher flow velocity than the refrigerant flowing through the conventional type shown in FIG. 17, due to the addition of the inclined member S21 functioning as the second guide part in, for example, the J-type and K-type guide parts. Moreover, increasing the height z1 of the inclined member S21 also increases the flow velocity of the refrigerant flowing through both end parts of the refrigerant introducing passage 21.

The J-type and K-type guide parts both show U-shaped flow velocity distributions along the refrigerant introducing passage 21. In the flow velocity distribution of the K-type guide part, a significantly high flow velocity is obtained at either end part of the refrigerant introducing passage 21. Note that the flow velocity obtained at the introduction port 24 is equal to the flow velocity obtained at the discharge port 25 in the cooling passage 23. On the other hand, the conventional type shows an L-shaped flow velocity distribution, wherein the flow velocity is low in the vicinity of the introduction port 24.

In addition, the average flow velocity of the refrigerant flowing between the fins 2C immediately below the center of the circuit board of each of the circuit element parts 3D, 3E, 3Fu, 3Fd from B1 to B7 is 0.064 m/s for the conventional type, 0.082 m/s for the guide part of type J, and 0.081 m/s for the guide part of type K. In other words, in the guide part having the plurality of steps in the height direction, the average refrigerant flow velocity can be increased by approximately 20% to adjust the flow velocity distribution.

As described above, the flow velocity of the refrigerant to be introduced to the cooling passage 23 can be increased without lowering the flow velocity of the refrigerant flowing under the circuit boards of the circuit elements by forming the multi-step inclined surfaces in the height direction of the refrigerant introducing passage 21. As a result, the cooling performance.

Figure 24:
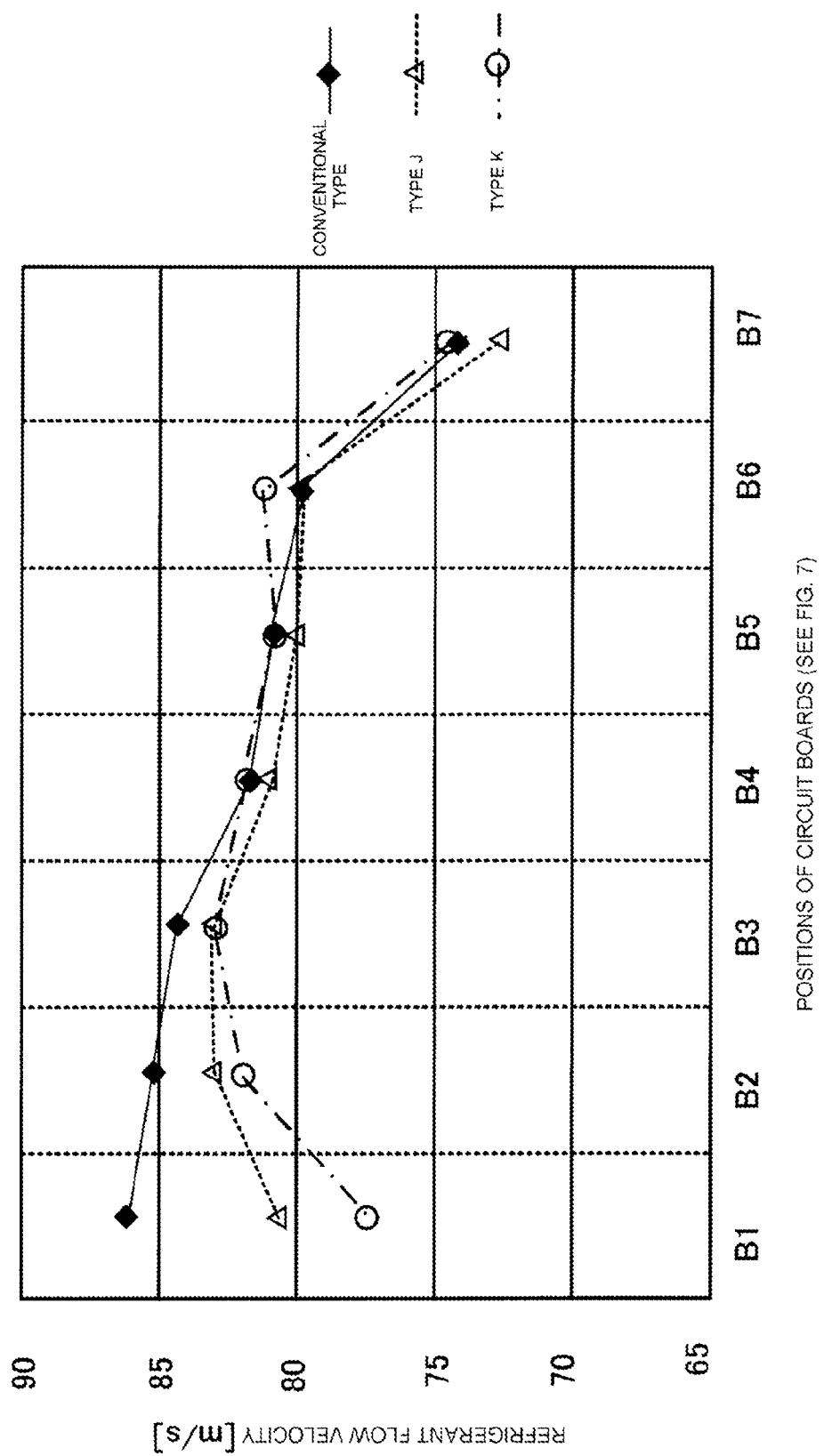
FIG. 24 is a diagram showing temperatures of the refrigerant obtained at different positions of the circuit boards in accordance with the structure of the guide part of the semiconductor module shown in FIGS. 22(A) to 22(C)

FIG. 24 is a diagram showing temperatures of the refrigerant obtained at different positions of the circuit boards in accordance with the structure of the guide part of the semiconductor module in FIGS. 22(A) to 22(C).

In the guide parts of types J and K, the junction temperatures of the power semiconductor elements can be lowered by increasing the flow velocity of the refrigerant flowing immediately below the center of the circuit board of each of the circuit element parts 3D to 3F by means of the inclined member S21 added as the second guide part. Particularly, the flow velocity of the refrigerant declines significantly on the upstream side of the refrigerant introducing passage 21. In other words, as shown in FIG. 24, the temperature of the refrigerant drops in proportion to the increase in the flow velocity. It is therefore confirmed that a stable refrigerant flow velocity corresponding to the loss generated in each power semiconductor element can be realized by providing the guide part with the plurality of inclinations and steps.

Figure 25A:
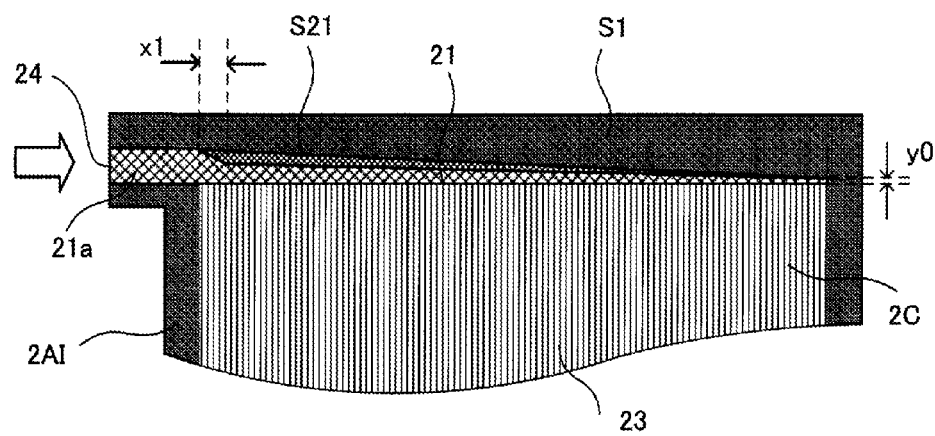
Figure 25B:
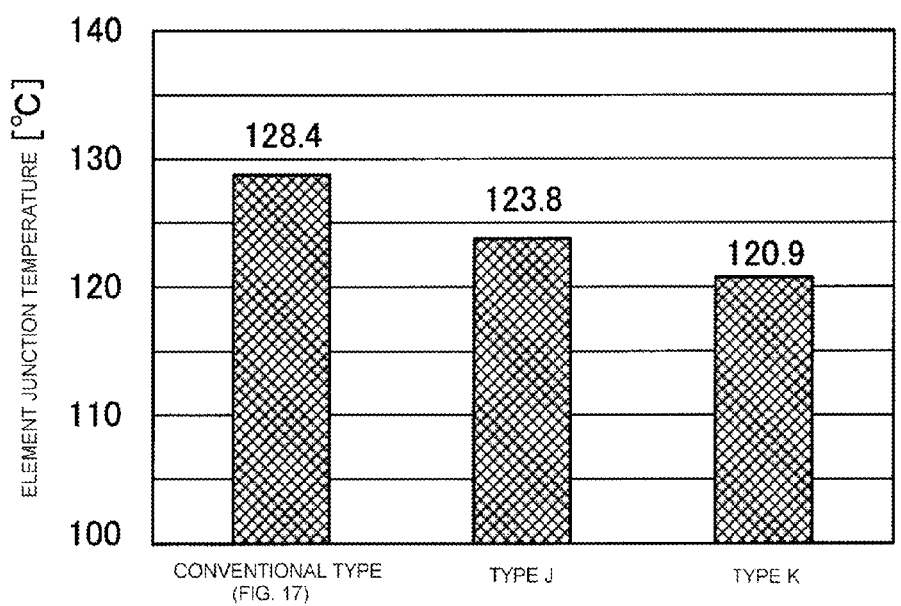
Figure 26A:
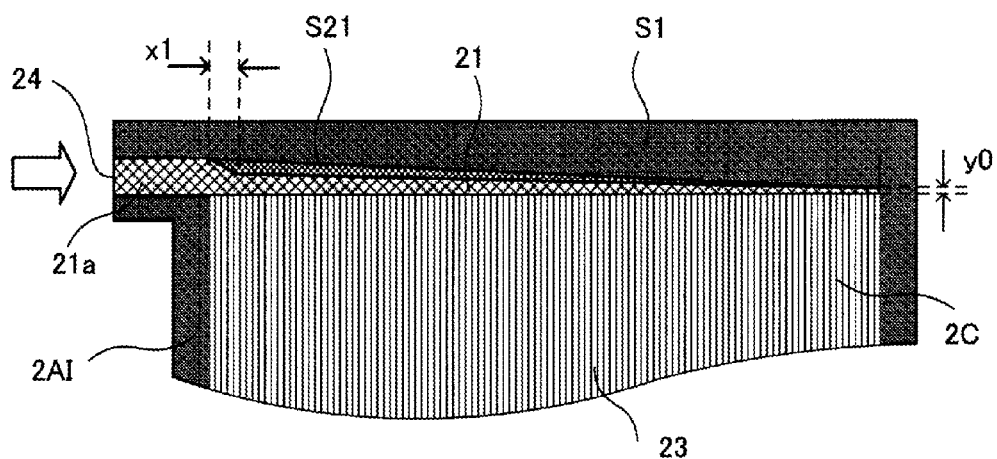
Figure 26B:
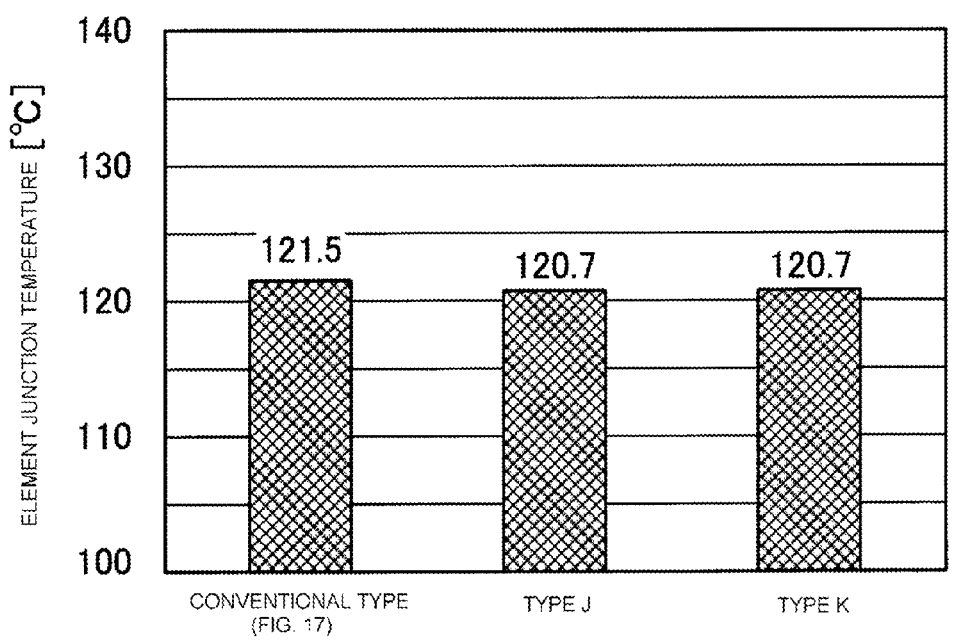
Figure 27A:
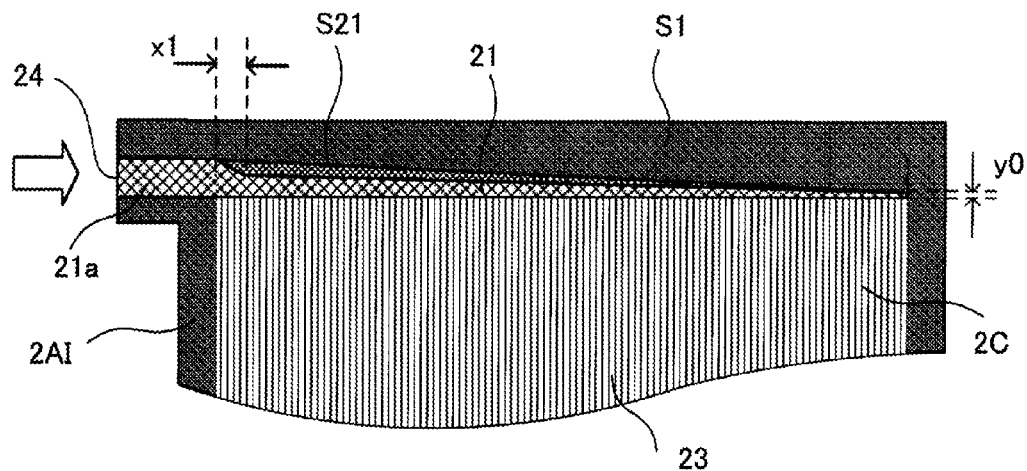
Figure 27B:
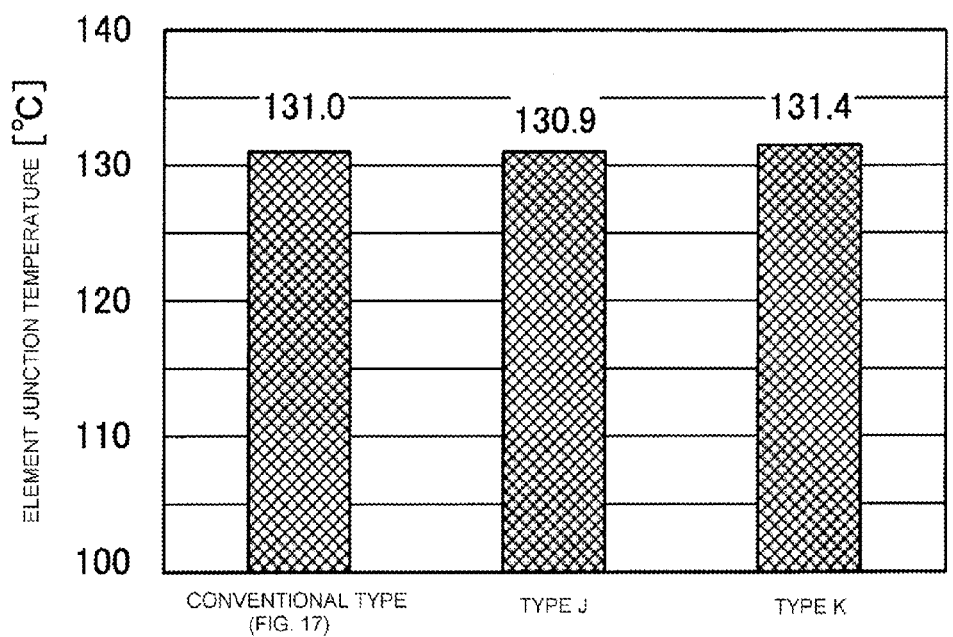

FIGS. 25 to 27 are each a diagram for explaining the performance of the water jacket shown in FIGS. 22(A) to 22(C). FIGS. 25(A), 26(A) and 27(A) show the passage structure having the steps formed in the height direction, and FIGS. 25(B), 26(B) and 27(B) show heat generated during the steady operation. Here, examples of the results of simulating generated heat values are shown.

As shown in FIG. 25(B), the junction temperature of each circuit element part 3D disposed at the position B1 in the first row providing the highest effect is 128.4° C. in the conventional structure, 123.8° C. in the J-type guide part, and 120.9° C. in the K-type guide part. Therefore, because the junction temperature of the K-type guide part is lower than that of the conventional type (FIG. 17) by 7.5° C., the cooling efficiency can be improved by 5.8%.

Furthermore, as shown in FIG. 26(B), the flow velocity of the refrigerant flowing through the power semiconductor elements disposed at the position B4 in the fourth row generating a high set loss is kept at 0.1 m/s, and the junction temperature of these power semiconductor elements does not increase. As shown in FIG. 27(B), the same level of cooling performance is obtained in the power semiconductor element 3Fd disposed at the position B7 in the seventh row.

As described above, the drift can be adjusted in the refrigerant introducing passage 21 by adding the guide part configured by the inclined member S21 to the guide wall S1 of the conventional type shown in FIG. 17. As a result, the flow velocity of the refrigerant flowing between the fins 2C can be improved overall at the center of the circuit board of each of the circuit element parts 3D, 3E, 3Fu, 3Fd.

Fourth Embodiment

Figure 28B:
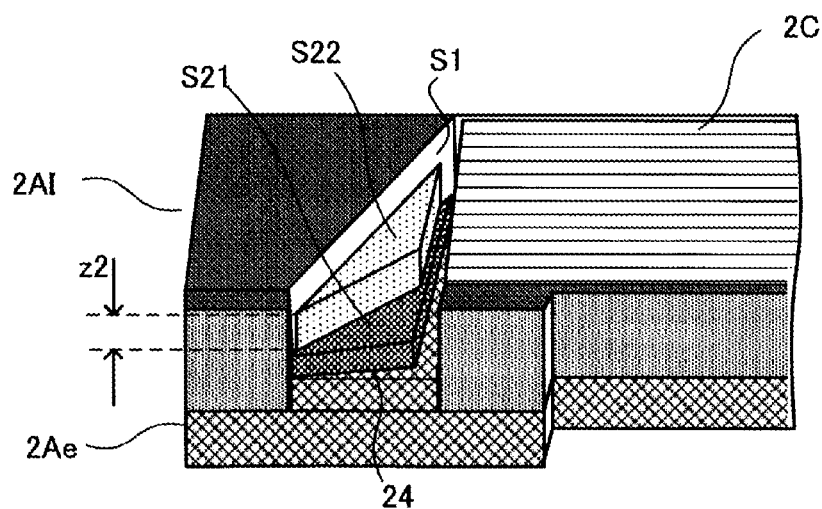

FIGS. 28(A) and 28(B) show the passage structure having steps formed in the height direction in a semiconductor module different from that shown in FIGS. 22(A) to (C). FIG. 28(A) is a plan view showing the substantial parts of the water jacket of the cooler, and FIG. 28(B) a cross-sectional diagram taken along the arrow L2-L2 in the vicinity of the refrigerant introduction port.

In the refrigerant introducing passage 21 shown in FIG. 28(A), the guide wall S1 and the inclined member S21 functioning as the second guide part are disposed at either end part of the refrigerant introducing passage 21, and an inclined member S22 functioning as a third guide part is disposed on an upper surface of the inclined member S21. The passage structure in FIGS. 28(A) and 28(B) is different from the one shown in FIGS. 22(A) to 22(C) in having three steps formed in the height direction. The refrigerant flowing from the introduction port 24 can easily flow into the cooling passage 23 in which the fins 2C are disposed, thereby improving the cooling performance.

Figure 29B:
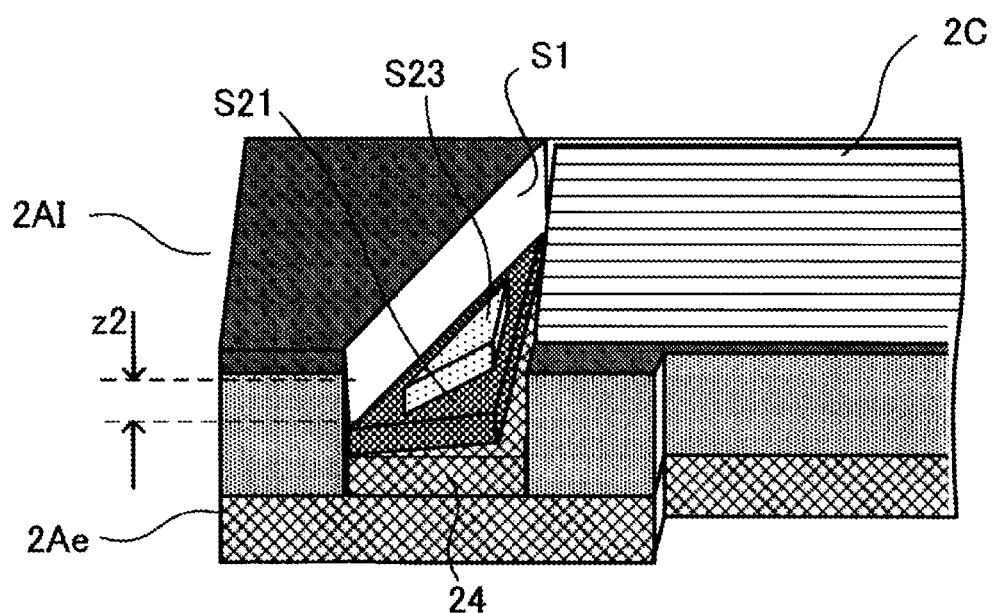

FIGS. 29(A) and 29(B) show the passage structure having steps formed in the height direction in another semiconductor module different from that shown in FIGS. 22(A) to 22(C). FIG. 29(A) is a plan view showing the substantial parts of the water jacket of the cooler, and FIG. 29(B) a cross-sectional diagram taken along the arrow L2-L2 in the vicinity of the refrigerant introduction port.

In the refrigerant introducing passage 21 shown in FIG. 29(A), the guide wall S1 and the inclined member S21 functioning as the second guide part are disposed on either end part of the refrigerant introducing passage 21, and the third guide part configured by an inclined member S23 of isosceles triangular planar shape is disposed on the upper surface of the inclined member S21. This inclined member S23 functioning as the third guide part is different from the inclined member of the passage structure shown in FIG. 28 in that a predetermined interval is provided between the inclined member S23 and the guide wall S1.

The refrigerant flowing from the introduction port 24 can easily enter the cooling passage 23 in which the fins 2C are disposed locally and selectively. Note that the inclined member S23 may not necessarily be disposed alone; a plurality of the inclined members S23 may be disposed on the upper surface of the inclined member S21 functioning as the second guide part. In place of the inclined members S23 of isosceles triangular planar shape, parallelogram or oblong plates can be disposed. Moreover, these plates can be replaced with guide vanes.

Fifth Embodiment

The first to fourth embodiments above each have described the water jacket 2A in which the introduction port 24 and the discharge port 25 are divided into the left side wall 2Ab and the right side wall 2Ad. A fifth embodiment describes how the drift is adjusted when the introduction port 24 and the discharge port 25 are disposed only on either one of the left and right side walls 2Ab and 2Ad.

FIG. 30 is a perspective view of the cooler of the conventional semiconductor module, showing the configurations of substantial parts of the water jacket having a structure different from that shown in FIG. 3. In FIG. 30, the dashed arrows shown in a water jacket 2AR represent the directions in which the refrigerant flows.

As shown in FIGS. 1 and 2, the semiconductor module 10 is configured by the cooler 2 and the plurality of circuit element parts 3A to 3C disposed on the cooler 2. This cooler 2 is configured by the water jacket 2AR functioning as a fin cover, and the fin base 2B in which the plurality of fins 2C are implanted to configure a heat sink. The plurality of fins 2C are stored in the water jacket 2AR.

As shown in FIG. 30, the external form of the water jacket 2AR of the cooler 2 is in the shape of a substantially rectangular cuboid. A main surface on the upper side of the cooler 2 is provided with the refrigerant introducing passage 21, the refrigerant discharge passage 22, and the cooling passage 23 in which the fins are disposed. Unlike the water jacket 2AR shown in FIG. 3, the introduction port 24 for introducing the refrigerant to the water jacket 2AR is provided on the right side wall 2Ad, which is the same side surface on which the discharge port 25 for discharging the refrigerant to the outside is disposed.

These spaces for the refrigerant introducing passage 21 and the like are defined by the front side wall 2Aa, the left side wall 2Ab, the rear side wall 2Ac, the right side wall 2Ad, and the bottom wall 2Ae. Note that the fins 2C are shown in the diagram, for explanatory convenience.

The refrigerant introducing passage 21, functioning as the first passage, extends from the introduction port 24 to the left side wall 2Ab via the introduction port part 21a along the refrigerant inflow direction so as to be parallel to the front side wall 2Aa of the water jacket 2AR. The refrigerant discharge passage 22, functioning as the second passage, extends linearly toward the discharge port 25 of the refrigerant from the left side wall 2Ab to the discharge port 25 so as to be parallel to the rear side wall 2Ac. The refrigerant introducing passage 21 and the refrigerant discharge passage 22 are provided so as to be substantially parallel to each other.

The cooling passage 23, functioning as a third passage, is placed between the refrigerant introducing passage 21 and the refrigerant discharge passage 22 to communicate the refrigerant introducing passage 21 and the refrigerant discharge passage 22 with each other. In other words, the cooling passage 23 extends in a direction perpendicular to the directions in which the refrigerant introducing passage 21 and the refrigerant discharge passage 22 extend. The inner surfaces of the left side wall 2Ab and the right side wall 2Ad that define edges of the cooling passage 23 are formed perpendicular to the bottom surface of the cooling passage 23 and the inner surface of the rear side wall 2Ac.

The heat sink configured by the plurality of fins 2C is disposed on the cooling passage 23. The refrigerant flows through the passage defined by the fins 2C. The refrigerant introduced from the introduction port 24 is discharged from the discharge port 25 through the refrigerant introducing passage 21, the cooling passage 23, and the refrigerant discharge passage 22 in the water jacket 2AR. The heat sink has a substantially rectangular cuboid external form, and has its left side surface, rear side surface, and right side surface disposed in the cooling passage 23 to be parallel to the inner surfaces of the left side wall 2Ab, the rear side wall 2Ac, and the right side wall 2Ad.

The water jacket 2AR with the configuration described above can be made of, for example, aluminum, aluminum alloy, copper, copper alloy, or other metallic material. When creating the water jacket 2AR using such a metallic material, the refrigerant introducing passage 21, cooling passage 23, refrigerant discharge passage 22, introduction port 24, and discharge port 25 can be die-casted. Besides these materials mentioned above, a material containing carbon filler can be used in the water jacket 2AR. Ceramic materials, resin materials and the like can be used as well, depending on the type, temperature and the like of the refrigerant flowing in the water jacket 2AR.

When using the cooler 2, for example, the introduction port 24 is connected to a pump provided at its upstream, and the discharge port 25 is connected to a heat exchanger provided at its downstream, to construct a closed-loop refrigerant passage that includes the cooler 2, the pump, and the heat exchanger. The pump forces the refrigerant to circulate in this closed loop.

Each of the circuit element parts 3D, 3E, 3Fu, 3Fd of the semiconductor module 10B shown in FIG. 8(A) generates heat when this power conversion circuit is operated. The heat is transmitted to the fin base 2B to which the circuit element parts are joined, and then further transmitted to the fins 2C below the fin base 2B. Because the fins 2C are disposed within the cooling passage 23 as described above, the refrigerant passing through the cooling passage 23 cools the fins 2C. These heat-generating circuit element parts 3D, 3E, 3Fu, 3Fd are cooled by the cooler 2 in this manner.

Figure 31A:
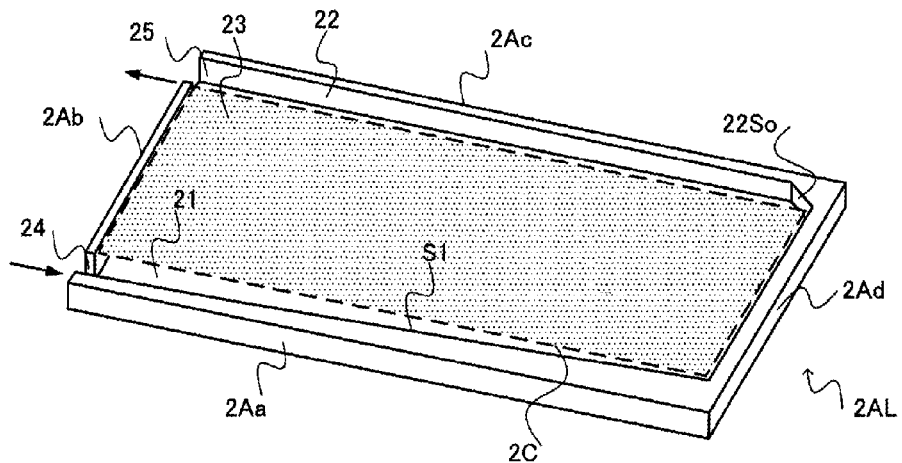
FIGS. 31(A) and 31(B) show the configurations of substantial parts of the water jacket having a passage structure different from that shown in FIG. 30.
Figure 31B:
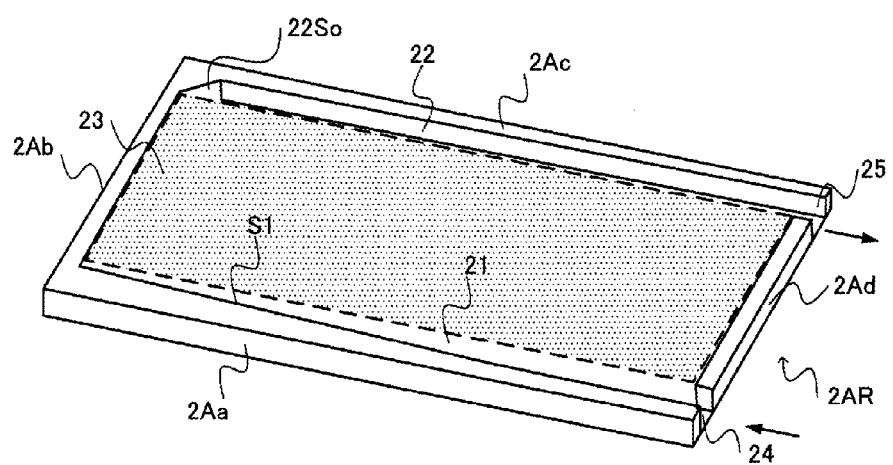

FIGS. 31(A) and 31(B) are, respectively, a perspective view showing the configurations of substantial parts of the water jacket having a passage structure different from that shown in FIG. 30.

One of the main surfaces of a water jacket 2AL shown in FIG. 31(A) is provided with the refrigerant introducing passage 21, the refrigerant discharge passage 22, and the cooling passage 23, wherein the cooling passage 23 surrounded by the dashed line is formed into a size corresponding to the fins 2C. The fins 2C that are integrated with the fin base 2B as shown in, for example, FIG. 2 are disposed in the cooling passage 23 of the water jacket 2AL. The fins 2C are so formed into a size (height) as to provide a certain amount of clearance C between the tip ends thereof and the bottom wall 2Ae of the water jacket 2AL (see FIG. 1). The fin base 2B integrated with the fins 2C is eventually joined to the water jacket 2AL by using, for example, an appropriate sealing material, as shown in FIGS. 1 and 2. As a result, the cooler 2 having the water jacket 2AL, the fin base 2B, and the fins 2C is constructed.

The front side wall 2Aa that configures the refrigerant introducing passage 21 extending from the introduction port 24 is provided with the guide wall S1 that is inclined with respect to the entire surface of the cooling passage 23 between the leading end part of the refrigerant introducing passage 21 and the terminal end part of the same. Furthermore, the guide part 22So having an inclination angle of 45 degrees is disposed at the leading end part of the refrigerant discharge passage 22 through which the refrigerant flows out to the discharge port 25. Both the guide wall S1 and the guide part 22So have an inclination of 60 degrees or less. The guide wall S1 of the refrigerant introducing passage 21 is inclined uniformly over the entire region that is in contact with the cooling passage 23.

FIG. 31(A) shows the L-type water jacket 2AL in which the introduction port 24 and the discharge port 25 are disposed on the same surface on the left side wall 2Ab. As with the water jacket shown in FIG. 30, the R-type water jacket 2AR shown in FIG. 31(B) has the introduction port 24 and the discharge port 25 disposed on the same surface on the right side wall 2Ad. In other words, a plurality of passage structures are considered in order to connect pipes for actually introducing the refrigerant, but the passage structure needs to be optimized according to the shape of the water jacket, as with the above-described embodiments in which the introduction port 24 and the discharge port 25 are disposed on the left side wall 2Ab and the right side wall 2Ad respectively.

FIG. 32 is a diagram showing the refrigerant flow velocities obtained at different positions of the circuit boards in accordance with the structure of the water jacket. Each of these graphs shows an example of the flow velocities of the refrigerant flowing between the blade fins 2Ca of FIG. 4(A) disposed in the cooling passage 23 when the refrigerant is let flow from the introduction port 24 at a flow rate of 10 L/min.

The flow velocity distribution of the water jacket 2AL (type L) shown in FIG. 31(A) is expressed in a dotted line. The flow velocity distribution of the water jacket 2AR (type R) shown in FIG. 31(B) is expressed in a solid line. As with the water jacket 2A shown in FIG. 6(B), the flow velocity distribution of the water jacket (type LR) in which the introduction port 24 and the discharge port 25 are positioned symmetrically is expressed in a dashed-dotted line in FIG. 32.

When comparing these flow velocity distributions, in each of the water jackets 2AL, 2AR in which the introduction port 24 and the discharge port 25 are disposed on the same surface, the flow velocity is high immediately below the circuit boards B1, B7 where the pipes are connected, and the flow velocity distribution is less uniform compared to when the introduction port 24 and the discharge port 25 are disposed symmetrically. In other words, it is found that the drift characteristics in which the flow velocity of the refrigerant becomes high on the discharge port 25 side are generated in the passage structure in which the fins are disposed parallel in the cooling passage 23 between the refrigerant introducing passage 21 and the refrigerant discharge passage 22. Moreover, the cooling efficiency of the fins 2C is high at the sections in the cooling passage 23 where the refrigerant flows at high velocities.

In the semiconductor module 10B shown in FIG. 8(A), the refrigerant needs to flow at a flow velocity equal to or higher than the certain level in accordance with the amount of heat generated in the circuit element parts 3D, 3E, 3Fu, 3Fd. However, if the flow rate of the refrigerant flowing from the introduction port 24 is simply increased for the purpose of increasing the flow velocity obtained at a low-flow velocity part, an excessive amount of refrigerant flows at a high-flow velocity part. For this reason, the refrigerant needs to be increased in amount and supplied to the cooler 2, requiring a high-performance pump.

When simulating the refrigerant flow velocity distributions by using the water jackets 2AL, 2AR having the conventional structure, the refrigerant introduced from the introduction port 24 into the water jacket 2AL or 2AR is drawn to the position of the discharge port 25, whereas the refrigerant flowing into the cooling passage 23 flows at a relatively high flow velocity in the vicinity of the discharge port 25.

In the plurality of circuit element parts 3D, 3E, 3Fu, 3Fd, it is required to maintain the flow velocity required for cooling the semiconductor elements 32, 33 in accordance with the occurring loss. However, the larger the refrigerant flow velocity distribution obtained due to the abovementioned drift characteristics, the more out of balance the cooling performance. Although the cooling performance changes slowly with respect to a change in the flow velocity especially on the discharge port 25 side in the cooling passage 23 where the flow velocity tends to increase, the cooling performance changes significantly in a position away from the discharge port where the flow velocity tends to drop. This indicates the occurrence of the flow velocity component on the discharge port 25 side of the cooling passage 23, which impedes the improvement of the cooling performance. If such drift characteristics can be improved, not only is it possible to achieve more stable cooling performance, but also the overall cooling performance can be improved.

According to the relationship between the refrigerant flow velocity and the element temperature shown in FIG. 10(B), the element temperature increases drastically as the refrigerant flow velocity decreases, as shown by the curved line Z. In order to prevent the increase of the element temperature to obtain stable cooling performance, it is desired that the refrigerant flow velocity be specifically 0.1 [m/s] or higher.

In view of only the relationship between the flow velocity and the pressure loss of the cooler 2, the flow velocity of the refrigerant that can pass therethrough can be increased by using a pump of more excellent performance, preventing the increase in the element temperature. However, use of such a pump causes significant cost increases in the semiconductor module cooled by the cooler 2, and hence an electronic device equipped with the semiconductor module.

The drift characteristics of the refrigerant described above are the phenomena that occur in the parallel passage structure having the cooling passage 23 between the refrigerant introducing passage 21 and the refrigerant discharge passage 22. Particularly, increasing the interval between the cooling fins 2C disposed in the cooling passage 23 reduces the resistance to the refrigerant flowing from the refrigerant introducing passage 21 to the fins 2C, allowing the refrigerant to flow easily. Therefore, the wider the interval between the fins 2C is, the greater the drift characteristics.

Measures to be taken on the drift characteristics of the passage structure described above vary depending on the passage structures shown in FIGS. 31(A) and 31(B) and the distributions of loss generated in the circuit element parts disposed in the fin base. Next is described a method for adjusting the flow distributions of the water jackets 2AL, 2AR each having the introduction port 24 and the discharge port 25 disposed on the same surface. These are the results of verifying the properties of the refrigerant itself (refrigerant characteristics) and the cooling performance of the refrigerant by simulation.

Next is described the cooler 2 that has the guide part capable of adjusting the drift characteristics in the refrigerant introducing passage 21 of the semiconductor module.

Figure 33A:
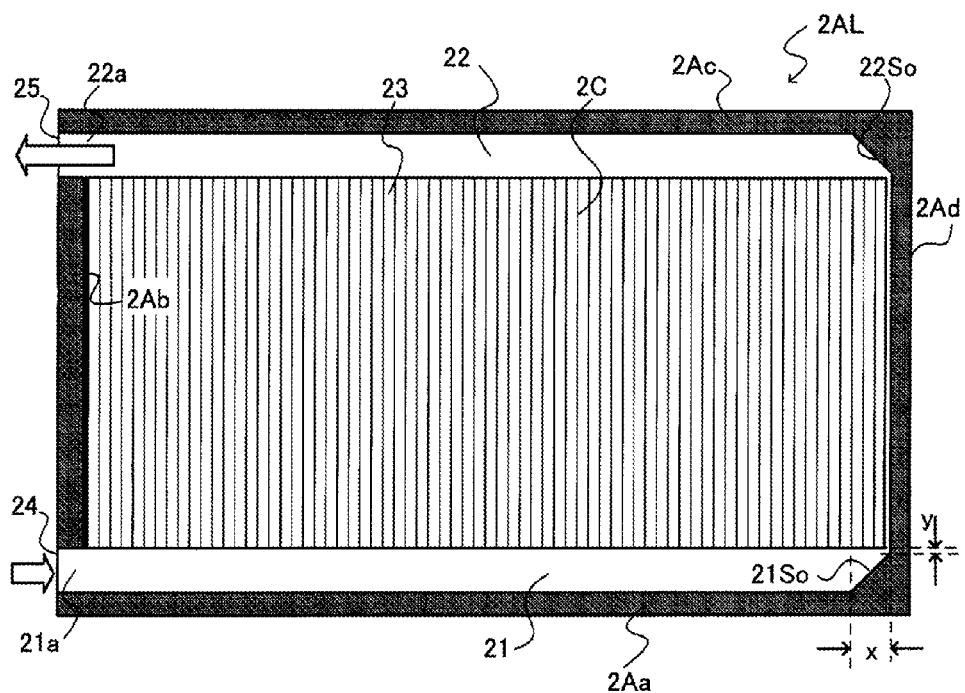
FIGS. 33(A) and 33(B) are, respectively, a plan view showing a passage structure of a semiconductor module according to a fifth embodiment.
Figure 33B:
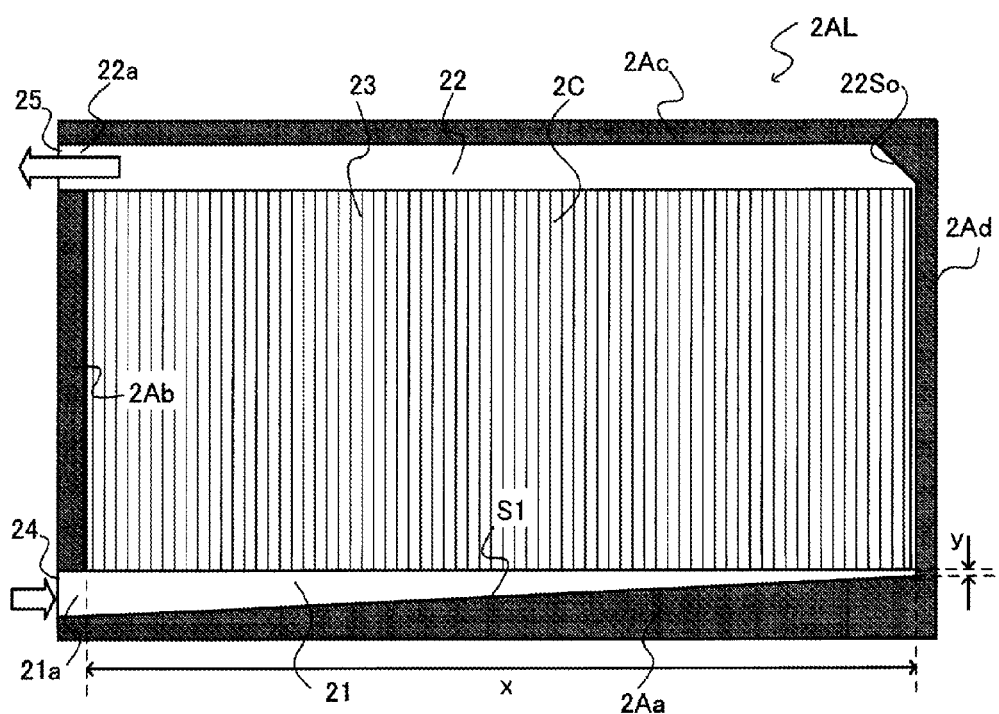
Figures 34A, 34B:
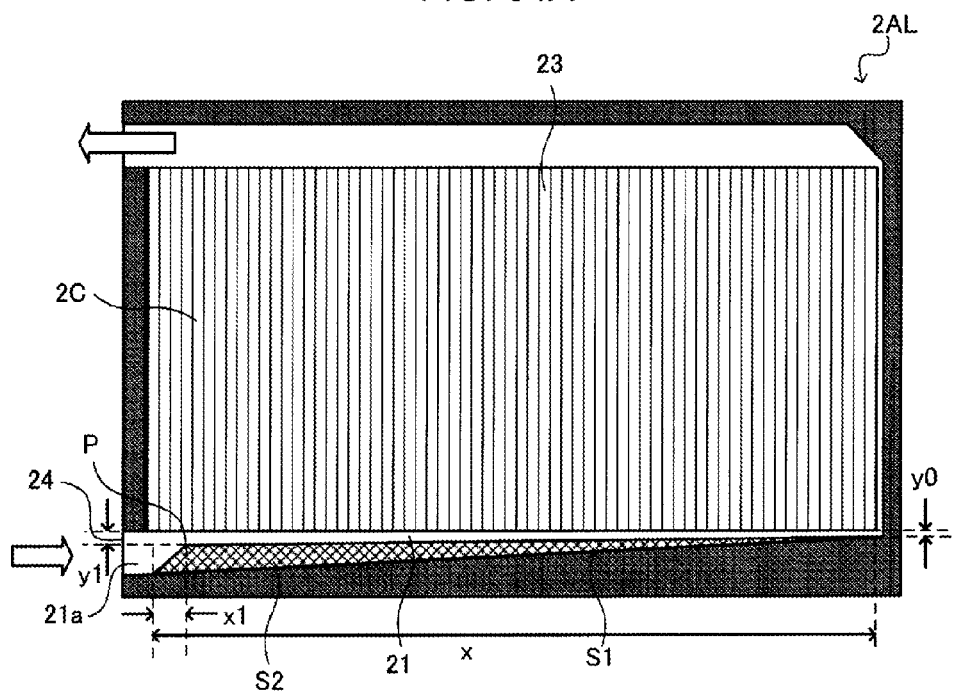

FIGS. 33(A) and 33(B) show a passage structure of the semiconductor module according to the fifth embodiment. FIGS. 34(A) and 34(B) also show a passage structure of the semiconductor module according to the fifth embodiment. FIG. 34(A) is a plan view of the water jacket of the cooler, and FIG. 34(B) is an explanatory diagram showing the structures of the guide parts by type.

In the water jacket 2AL of type L1 shown in FIG. 33(A), the refrigerant introduction port 24 and the discharge port 25 are provided on the left side wall 2Ab, and the refrigerant introducing passage 21 extends along the front side wall 2Aa toward the right side wall 2Ad. The guide part 21So is configured by the inclined member of triangular planar shape at the terminal end part of the refrigerant introducing passage 21.

The shape of the refrigerant introducing passage 21 configured by the inclined member S2 is described first. In order to improve the flow velocity distribution of the cooling passage 23, an inclined surface of a predetermined length is configured by the guide part 21So in FIG. 33(A) and by the guide wall S1 in FIG. 33(B). FIG. 34(A), on the other hand, shows a water jacket of type M in which the inclined member S2 with two different inclined surfaces is disposed along the uniformly inclined guide wall S1.

In the M-type water jacket, in the passage structure of the cooler 2 for adjusting the drift, an inclined surface having a length x is formed by the conventional guide wall S1, and the inclined member S2 is superposed on the guide wall S1 along the inclined surface thereof, whereby a new guide part having two different inclination angles is configured. This inclined member S2 has a first inclined surface that is inclined to guide the refrigerant toward the front side surface of the heat sink configured by the fins 2C, and a second inclined surface that is inclined similarly. The height z1 of the inclined member S2 from the bottom surface of the refrigerant introducing passage 21 is shorter than the height of the guide wall S1.

In such a new guide part having the inclined member S2 disposed along the guide wall S1, the first inclined surface provides the maximum inclination angle in the distance x1 on the upstream side of the refrigerant introducing passage 21 facing the fins 2C of the cooling passage 23, and the second inclined surface is formed subsequently so as to extend from the changing point P of the inclination angle toward the terminal end. The angled part between the first inclined surface and the second inclined surface projects toward the heat sink.

In this manner, the guide part provided with the two inclined surfaces in addition to the guide wall S1 is configured in the refrigerant introducing passage 21. This guide part is different from the L1-type and L-type passage structures shown in FIGS. 33(A) and 33(B) in having the largest inclination on the introduction port 24 side. In other words, in the refrigerant introducing passage 21 having the M-type guide part shown in FIG. 34(A), the cross-sectional area thereof decreases in the refrigerant introduction direction, improving the flow velocity distribution of the cooling passage 23.

In the refrigerant introducing passage 21 of the water jacket 2AL according to the fifth embodiment, the cross-sectional area thereof is defined by the bottom wall 2Ae, the guide wall S1, and the front side wall of the heat sink. This cross-sectional area becomes small gradually from the opening side of the refrigerant introducing passage 21 toward the terminal end part at a constant rate. Moreover, the refrigerant introducing passage 21 is formed in a manner that the rate of reduction of the cross-sectional area changes in the middle of the refrigerant introducing passage 21 due to the presence of the inclined member S2 disposed therein. In the present embodiment, the heat sink is placed in a manner that the front side surface thereof is substantially parallel to the inflow direction of the refrigerant flowing from the introduction port 24 and becomes flush with the inner wall of the introduction port part 21a so as not to block the flow of the refrigerant. Furthermore, in the water jacket 2AL, the height of the refrigerant introducing passage 21, which is the interval between the bottom wall 2Ae of the water jacket 2AL and the fin base 2B, is constant.

The leading end part of the refrigerant discharge passage 22 for letting the refrigerant flow out to the discharge port 25 is chamfered to form the guide part 22So having an inclination angle of approximately 45° with respect to the rear side surface of the heat sink. Then, a side wall extending toward the downstream side of the refrigerant discharge passage 22 is formed parallel to the rear side surface of the heat sink. Forming the side wall of the refrigerant discharge passage 22 to be parallel to the rear side surface of the heat sink over substantially the entire length of the refrigerant discharge passage 22 can reduce the pressure loss occurring on the downstream side of the heat sink and achieve the effect of adjusting the flow velocity by means of the guide part provided on the refrigerant introducing passage 21 side.

Suppose that 1.2 mm thick and 10 mm tall blade fins are disposed at a 2.1 mm pitch in a 255 mm wide and 117 mm long region of the cooling passage 23 and that the refrigerant is introduced from the introduction port 24 to the refrigerant introducing passage 21 at a flow rate of 10 L/min. In this case, the impact of the difference in the structure of the guide part on the flow velocity distribution was confirmed by simulation for each type of passage in the guide part.

Next is described the results of the simulation that was performed using the passage structures classified as shown in FIG. 34(B) as the targets for comparison.

Here, with regard to slope structures of the refrigerant introducing passage 21 used in this example as shown in FIGS. 33 and 34, L-type to Mc-type guide parts each have a 2 mm interval (minimum value) y0 between the fins 2C and the guide wall S1 or the inclined member S2. Furthermore, in the M-type water jacket 2AL shown in FIG. 34(A), the distance x1 between the basing point and the changing point of the inclined member S2 is 11.5 mm. The distance x1 is 20 mm only in a Ma-type water jacket. The interval y1 between the changing point of the inclined member S2 and the fins 2C is 5 mm. The interval y1 is 10 mm only in a Mb-type water jacket. The height z1 of the inclined member S2 is 2.5 mm, but is 5 mm only in a Mc-type water jacket. The height of the cooling passage 23 is 10.5 mm, and the width thereof at the introduction port 24 is 15 mm.

Next is described the thermal losses generated in the circuit element parts 3D and the like that are applied to the refrigerant in the water jacket 2AL shown in FIG. 31(A). The circuit element parts are divided into two groups of three rows B1 to B3 and B4 to B6, starting from the introduction port 24 side. The same level of loss is set for the circuit element parts 3D, 3E, and different levels of loss are set only for the upstream-side circuit element part 3Fd and the downstream-side circuit element part 3Fu in the seventh row. The loss values are set in accordance with the amount of heat generated, so as to satisfy the relation of 3D<3E<3Fu<3Fd, based on the relationship of the refrigerant flow velocity to the refrigerant temperature and the cooling performance.

Figure 35A:
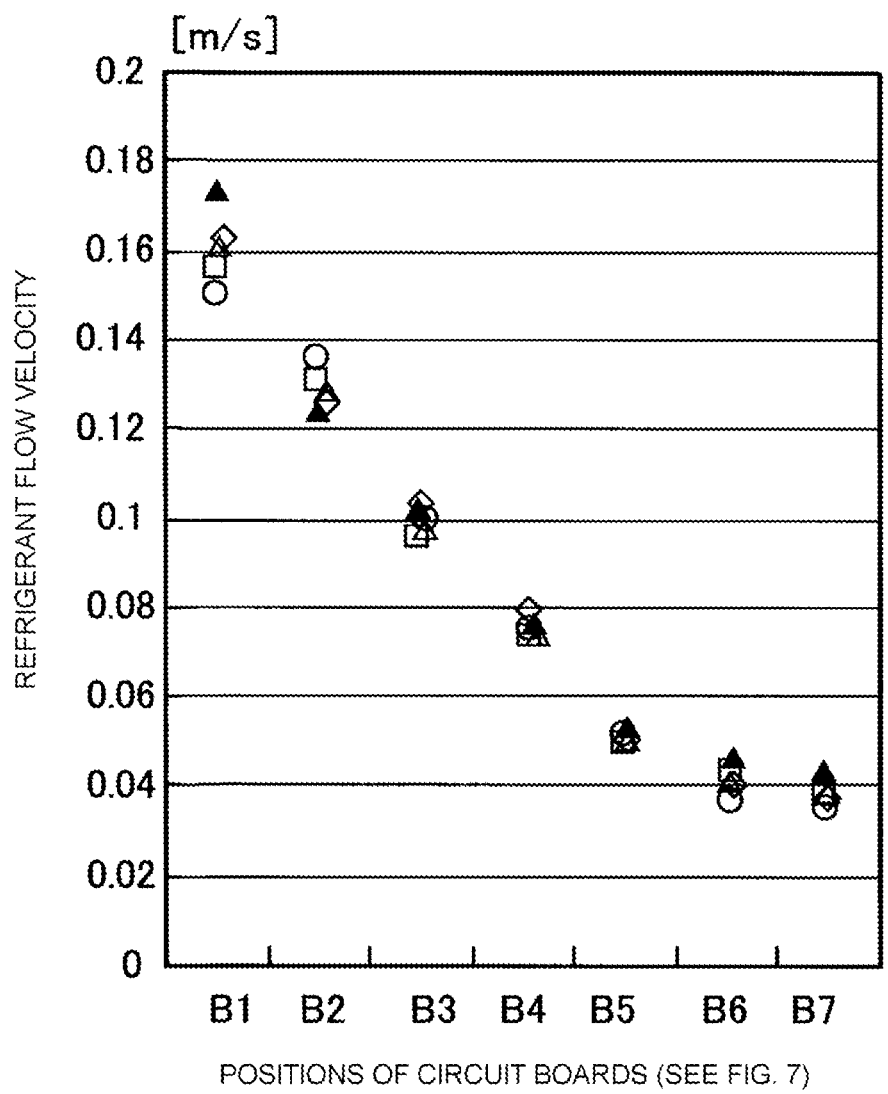
FIGS. 35(A) and 35(B) show refrigerant flow velocities in accordance with the types of the water jacket shown in FIGS. 34(A) and 34(B)
Figure 35B:
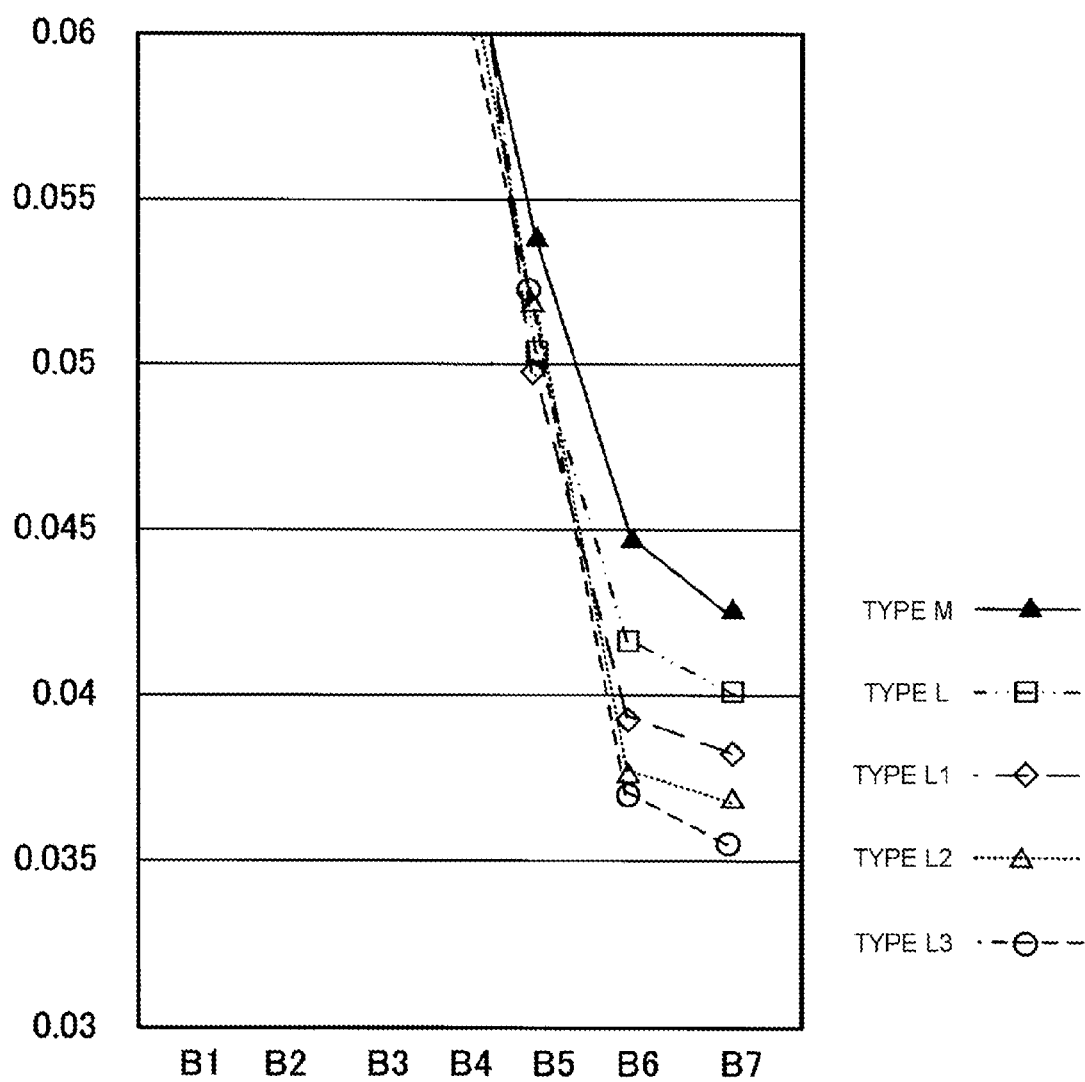
Figure 36:
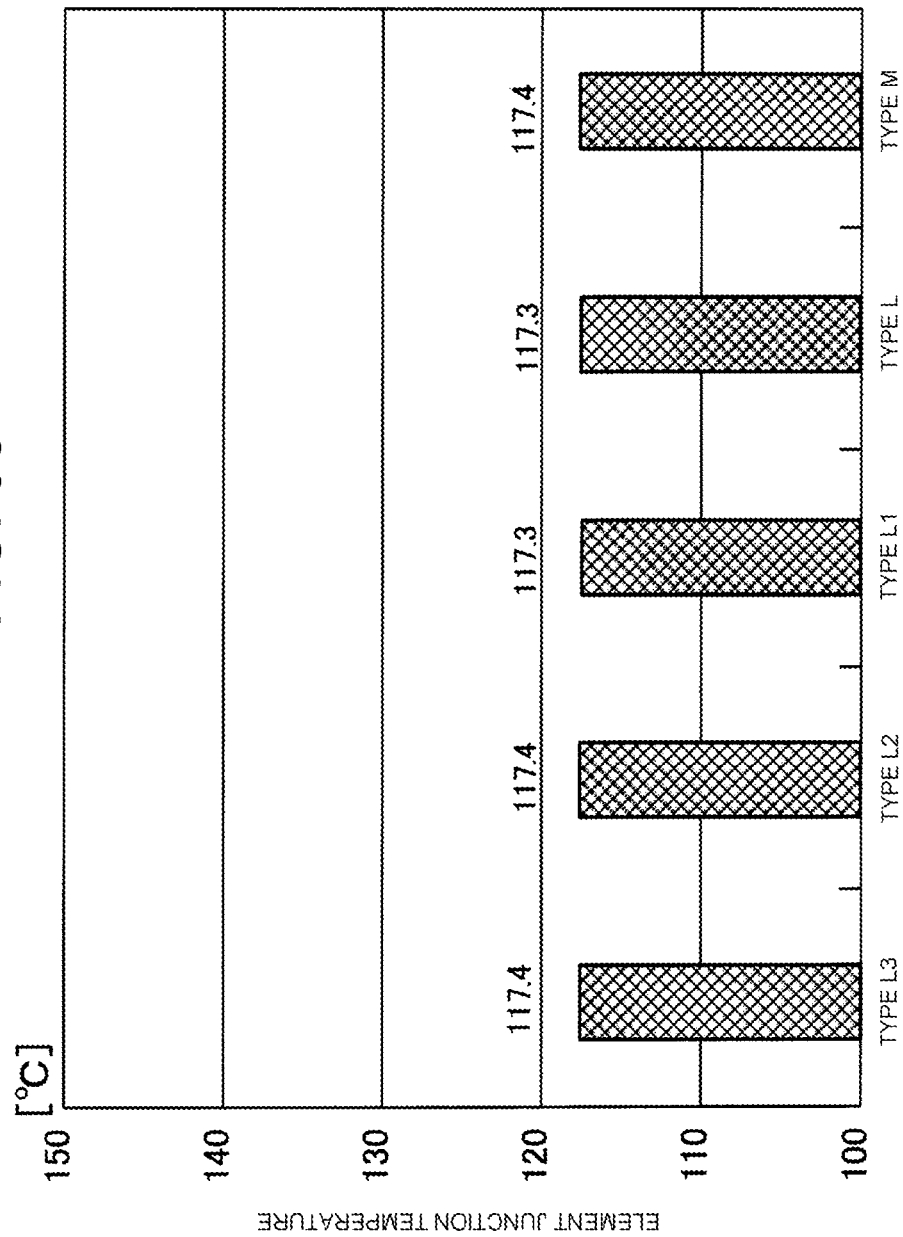
FIG. 36 is a diagram showing generated heat by type, the heat being generated during the steady operation of the semiconductor element disposed on the downstream side of the row B1 of the water jacket.
Figure 37:
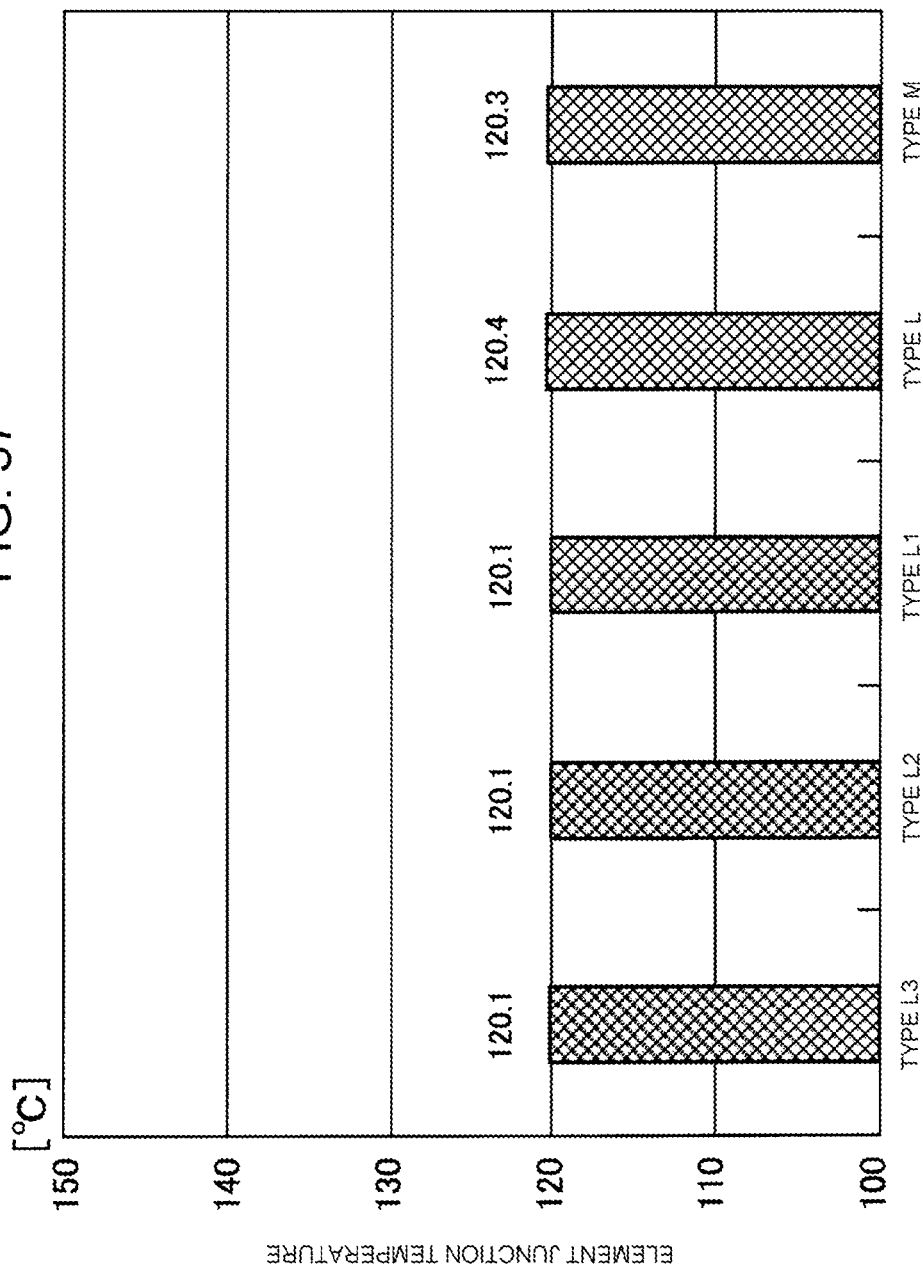
FIG. 37 is a diagram showing generated heat by type, the heat being generated during the steady operation of the semiconductor element disposed on the downstream side of the row B4 of the water jacket.

FIGS. 35(A) and 35(B) show refrigerant flow velocities in accordance with the types of the water jacket shown in FIG. 34. FIGS. 36, 37, and 38 are each a diagram showing generated heat by type, the heat being generated during the steady operation of the semiconductor element. Each of these diagrams is an example of the results of the simulation performed using the methods described above, showing the refrigerant flow velocities obtained at different positions of the circuit boards in accordance with the structures of the guide parts shown in FIG. 34(B).

FIG. 35(A) shows the results of simulating the flow velocity of the refrigerant flowing between the fins 2C that are disposed immediately below the center of the circuit board of each of the seven rows of circuit element parts 3D, 3E, 3Fu, 3Fd. The flow velocities that are obtained sequentially at the B1 to B7 between the introduction port 24 and a terminal end part of an introduction path 20a are shown, and only the sections where the low flow velocities are obtained are enlarged and shown in FIG. 35(B).

According to the simulation results in FIGS. 35(A) and 35(B), in order to increase the generated loss of the passage by using only one inclined surface configured by the guide wall S1, it is appropriate to use the L-type water jacket because this type has a long guide part in which the inclined surface is longer than that of the L1-type water jacket, so that the refrigerant flows fast at the B7 which needs to be cooled most. However, in the M-type water jacket 2AL in which the inclined member S2 is disposed along the guide wall S1, the flow velocity can be made higher, compared to the L-type and L1-type water jackets shown in FIGS. 33(A) and 33(B).

The average flow velocity of the refrigerant flowing between the fins 2C at the seven sections is 0.084 m/s for the L-type water jacket 2AL, 0.083 m/s for the L1-type water jacket 2AL, 0.083 m/s for the L2-type water jacket 2AL, 0.084 m/s for the L3-type water jacket 2AL, and 0.088 m/s for the M-type water jacket 2AL. In other words, even when the length of one inclined surface of the guide part 21S is increased, the average flow velocities of the L-type water jacket and of the L1-type to L3-type water jackets do not change much. However, the average flow velocity of the refrigerant flowing through the circuit element parts is improved by disposing a plurality of inclined surfaces as in type M. Therefore, it is clear that more efficient cooling performance can be obtained by configuring the guide part using the inclined member S2 that has a plurality of inclined surfaces in addition to the guide wall S1.

According to the simulation results in FIGS. 35(A) and 35(B), it can be confirmed that the drift characteristics in which the flow velocity increases at the position B1 depending on the position of the discharge port 25 do not change much in all of the types and are not affected by the presence/absence of the inclined member S2. In other words, it is clear that, even when the inclined member S2 is disposed in the refrigerant introducing passage 21, the cooling efficiency can be improved without contributing to the drift characteristics.

Even when the distance x1 between the basing point and the changing point of the inclined member S2 disposed on the inclined surface of the guide wall S1, the interval y1 between the inclined member S2 and the fins 2C at the changing point, and the height z1 of the inclined member S2 are changed in the M-type water jacket and the Ma-type to Mc-type water jackets shown in FIG. 34(B), the flow velocity can be adjusted to realize an appropriate flow velocity distribution without impairing the flow velocity of the refrigerant flowing from the introduction flow 24 toward the terminal end part.

In the manner described above, the drift characteristics can be adjusted by providing the water jacket 2AL having the introduction port 24 and the discharge port 25 disposed on the same wall surface, with the inclined member S2 in which the plurality of inclined surfaces are disposed on the inclined surface of the guide wall S1. In addition, the flow velocity obtained immediately below the center of the circuit board of each of the circuit element parts 3D, 3E, 3Fu, 3Fd can be improved overall. Based on these simulation results, the heat generation state of each power semiconductor element was confirmed by applying a corresponding loss to each of the circuit element parts 3D, 3E, 3Fu, 3Fd of the passage structures of type L, types L1 to L3, and type M.

FIGS. 36 to 38 are each a diagram showing an example of results by type that are obtained by simulating the heat values obtained during the steady operation of the semiconductor elements disposed in the water jackets shown in FIGS. 33 and 34(A). The temperatures of heat generated in the IGBT elements of the three circuit element parts 3D, 3E, 3Fd were taken as the targets for comparison, the circuit element parts 3D, 3E being disposed on the downstream side of the first row (position B1) and the fourth row (position B4), and the circuit element part 3Fd having a larger loss and being disposed on the seventh row.

As shown in FIG. 38, the junction temperature of the L3-type water jacket is 144.60°, whereas the junction temperature of the M-type water jacket is the lowest temperature of 141.8 C°, lower than that of the former water jacket by 3 C°. In other words, by improving the passage structure of the refrigerant introducing passage 21 by means of the guide wall S1 and the inclined member S2, the flow velocity is improved significantly at the B7 located immediately below the circuit board of the upstream-side circuit element part 3Fd having a particularly high loss value, and the junction temperatures of the power semiconductor elements can be reduced. Furthermore, because enough flow velocity can be ensured in the other circuit element parts with respect to the loss of the cooling performance in the positions B1 to B6, there is substantially no difference in the junction temperature between the respective types of water jackets.

Sixth Embodiment

The embodiments described above uses the inclined member S2 contribute to the improvement of the flow velocity obtained at the terminal end part of the refrigerant introducing passage 21, but are not enough to improve the flow velocity distribution in which the flow velocity of the refrigerant flowing through the refrigerant introducing passage 21 becomes higher near the discharge port 25. For this reason, it is desired that the positions for disposing the inclined members S1, S2 be determined in view of the relationship between the flow velocity distribution and the losses in the circuit element parts.

Figure 39A:
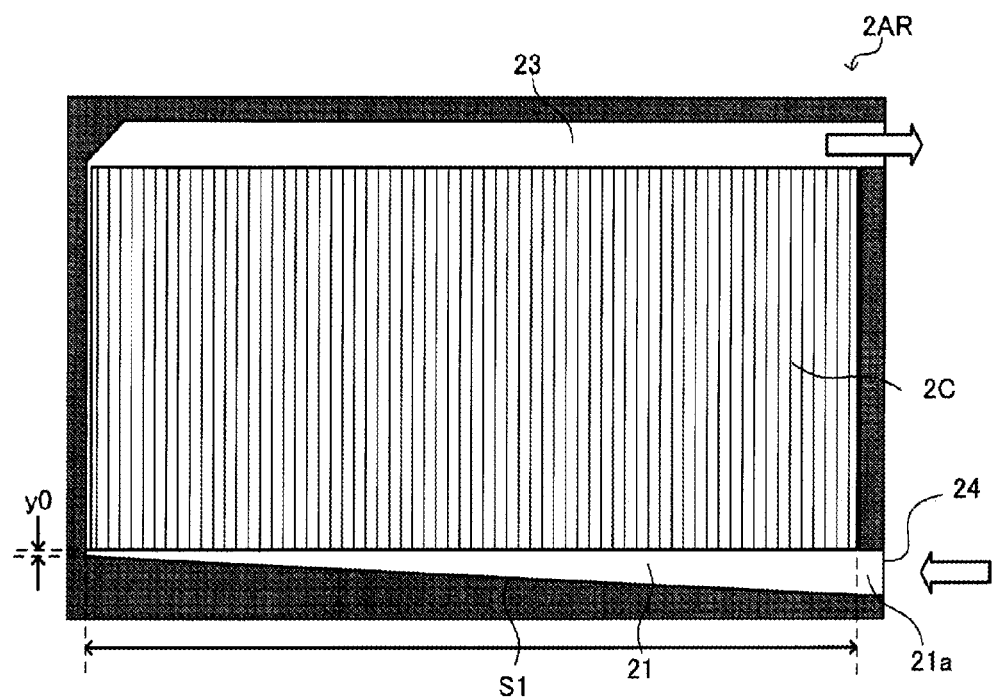
FIGS. 39(A) and 39B) respectively show a plan view showing a passage structure of a semiconductor module according to a sixth embodiment.

It is necessary to provide the introduction path on the circuit element part 3Fd side and a discharge path on the circuit element part 3Fu side as shown in FIG. 39(A) in order to cool the circuit element parts in the water jacket 2AR, the circuit element part 3Fd producing a high cooling performance loss according to the flow velocity distribution relationship.

Figure 39B:
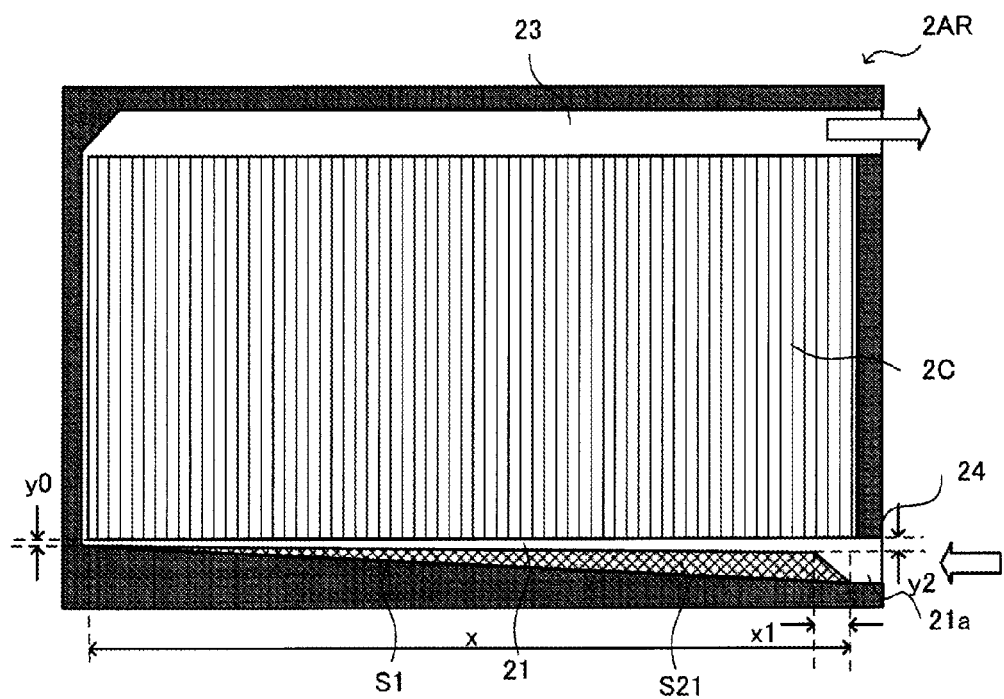

FIGS. 39(A) and 39(B) are, respectively, a plan view showing a passage structure of a semiconductor module according to a sixth embodiment.

The introduction port 24 and the discharge port 25 of an R-type water jacket 2AR shown in FIG. 39(A) are symmetric with those of the L-type water jacket shown in FIG. 33(B). The R-type water jacket 2AR also has an inclined surface of a predetermined length that is configured by the uniformly inclined guide wall S1. The introduction port 24 and the discharge port 25 of an S-type water jacket 2AR shown in FIG. 39(B) are symmetric with those of the M-type water jacket shown in FIG. 34(A). The S-type water jacket 2AR has a surface having two different inclination angles, which is configured by the inclined member S21 disposed along the guide wall S1.

FIG. 40 is a diagram showing the refrigerant flow velocities obtained according to the structures of the guide part of the semiconductor module shown in FIGS. 39(A) and 39(B).

According to the simulation results shown in FIG. 40, the flow velocity distributions of the cooling passages 23 of the R-type and M-type water jackets show that high flow velocities are obtained at the introduction port 24 and the discharge port 25. In other words, the flow velocity of the refrigerant flowing between the fins disposed immediately below the center of the circuit element part 3Fd near the discharge port 25 is 0.141 m/s for the S-type water jacket and 0.158 m/s for the R-type water jacket. This means that the both types of water jackets can realize a flow velocity distribution that reflects the cooling performance loss of the circuit element parts.

The flow velocity obtained at the low flow velocity position B1 of the cooling passage 23 of the S-type water jacket is compared with that of the R-type water jacket. As a result, the flow velocity in the S-type water jacket is 0.052 m/s, and the flow velocity in the R-type water jacket is 0.045 m/s. Specifically, in the S-type water jacket in which the guide part with the guide wall S1 and the two inclined surfaces is configured in the refrigerant introducing passage 21, the flow velocity is high at the low flow velocity positions B1 to B3, but the flow velocity is low at the high flow velocity positions B6 and B7. This means that the flow velocity distribution of the S-type water jacket can be improved to become more uniform.

As described above, according to the relationship between the cooling performance loss of each of the circuit element parts 3D, 3E, 3Fd, 3Fu and the size of each circuit board, the cooling efficiency can be increased more by disposing the introduction port 24 and the discharge port 25 in the circuit element parts 3Fd, 3Fu having large losses and large circuit boards. The heat generation state of each power semiconductor element was confirmed by applying a corresponding loss to each of the circuit element parts 3D, 3E, 3Fu, 3Fd.

Figure 41A:
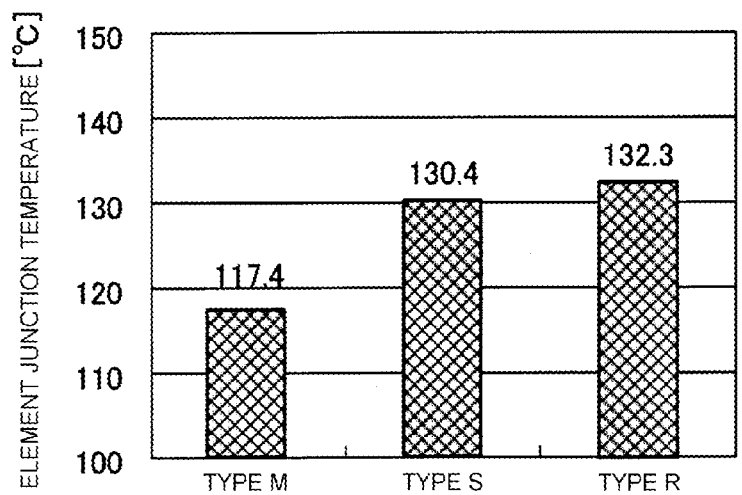
Figure 41B:
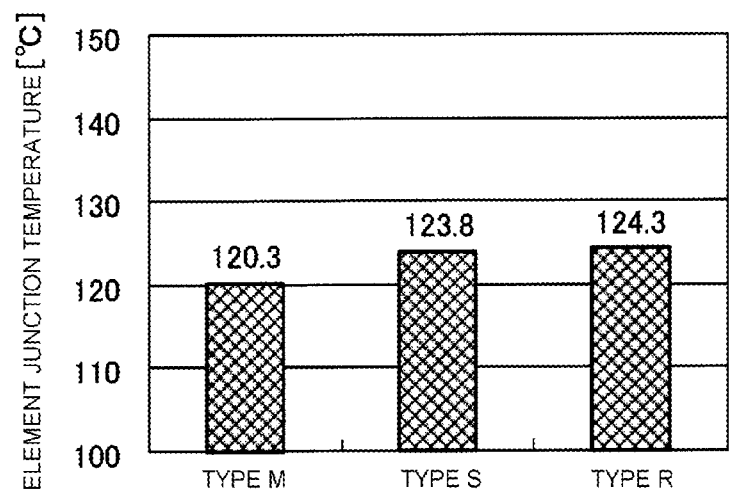
Figure 41C:
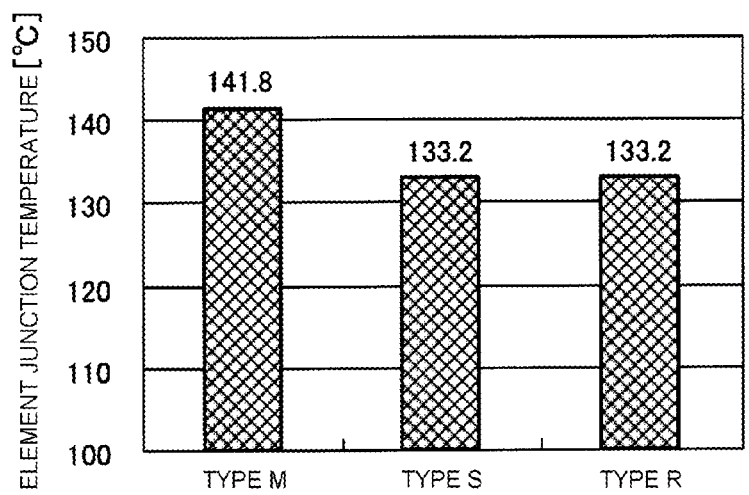

FIGS. 41(A), 41(B) and 41(C) show the performance of the water jacket shown in FIG. 39 that is obtained during the steady operation of semiconductor elements. FIG. 41(A) is a diagram showing the temperatures of heat generated on the downstream side of the row B1, FIG. 41(B) is a diagram showing the temperatures of heat generated on the downstream side of the row B4, and FIG. 41(C) is a diagram showing the temperatures of heat generated on the upstream side of the row B7, the temperatures being shown in these diagrams by type.

The results of the improvement of the flow velocity distribution correlates with the results of the junction temperatures, and it is found the flow velocity required for cooling the circuit element parts 3D, 3E, 3Fd, 3Fu can be adjusted with respect to the losses thereof. Especially for the circuit element part 3Fd producing a high loss, the junction temperatures of the S-type and R-type water jackets are lower than that of the M-type water jacket by 8.6° C., and the cooling efficiencies of the S-type and R-type water jackets are improved by 6%.

When comparing the S-type water jacket with the R-type water jacket, there is substantially no difference between the junction temperatures of the circuit element parts 3Fd of these water jackets because they are improved to obtain the flow velocity high enough to cool the circuit element parts. However, the junction temperature obtained on the downstream-side circuit element part 3D, which is the low flow velocity position, is 130.4 C° for the S-type water jacket and 132.3 C° for the R-type water jacket. The difference therebetween is approximately 2 C°. Accordingly, it is clear that the inclined member S21 disposed in the refrigerant introducing passage 21 of type S has the effect of improving the entire cooling performance.

The present invention is not limited to these six embodiments, and various changes can be made without departing from the scope of the present invention.

The foregoing description merely shows the principle of the present invention. A large number of modifications and changes can be made by those skilled in the art, and the present invention is not limited to the exact configurations and application examples illustrated above. All corresponding modifications and equivalents are considered to be within the scope of the present invention based on the appended claims and equivalents.

The invention claimed is:

1. A semiconductor module in which a refrigerant is supplied from an outside to a water jacket configuring a cooler, to cool a semiconductor element disposed on an outer surface of the cooler, the semiconductor module comprising:
   a heat sink connected thermally to the semiconductor element;
   a first passage in the water jacket, which extends from a refrigerant introduction port;
   a guide part formed along the first passage, including a first surface and a second surface to guide the refrigerant toward one side surface of the heat sink, the first surface being inclined to said one side surface of the heat sink;
   a second passage in the water jacket to be parallel to the first passage, which extends to a refrigerant discharge port, the second passage having a side wall parallel to another side surface of the heat sink; and
   a third passage that is formed in the water jacket in a position for communicating the first passage and the second passage with each other, the heat sink being disposed in the third passage.

2. The semiconductor module according to claim 1, wherein the first surface and the second surface of the guide part collectively form an angled shape which projects toward the heat sink in the first passage.

3. The semiconductor module according to claim 1, wherein the first surface and the second surface are formed sequentially along an introduction direction of the refrigerant and configured in a manner as to gradually reduce a cross-sectional area of the first passage as the first passage extends from the refrigerant introduction port in the introduction direction and to change a rate of reduction of the cross-sectional area as the first passage extends from the refrigerant introduction port in the introduction direction.

4. The semiconductor module according to claim 3, wherein the rate of reduction of the cross-sectional area is greater at the first surface than at the second surface.

5. The semiconductor module according to claim 1, wherein the second surface of the guide part is parallel to the one side surface of the heat sink.

6. The semiconductor module according to claim 5, wherein the second surface is formed near a terminal end part of the first passage to have a length equal to or less than ¼ of a length between the refrigerant introduction port and the terminal end part, and an interval between the second surface and the heat sink is equal to or less than ⅓ of a maximum width of the first passage.

7. The semiconductor module according to claim 5, wherein the second surface has a concavity formed in the vicinity of a terminal end part of the first passage.

8. The semiconductor module according to claim 1, wherein the first surface and the second surface are inclined to the one side surface of the heat sink by the same angle, such that the guide part is inclined uniformly to the one side surface of the heat sink.

9. The semiconductor module according to claim 1, wherein the refrigerant introduction port and the refrigerant discharge port are disposed respectively on wall surfaces of the water jacket that face each other.

10. The semiconductor module according to claim 1, wherein the refrigerant introduction port and the refrigerant discharge port are disposed on the same wall surface of the water jacket.

11. The semiconductor module according to claim 1, wherein the guide part further includes an inclined member on the first and second surfaces the inclined member having a plurality of surfaces, each forming a different inclination angle to said one side of the heat sink.

12. The semiconductor module according to claim 1, wherein
the cooler has a plurality of semiconductor elements disposed on an outer surface thereof along an introduction direction of the refrigerant, the plurality of semiconductor elements having different heat generation characteristics, and
the guide part is formed such that an inclination angle between the guide part and said one side of the heat sink becomes maximum at a part of the guide part corresponding to a region where the semiconductor element of the greatest heat generation characteristics is disposed.

13. The semiconductor module according to claim 1, wherein the guide part is formed into steps on a bottom surface of the first passage.

14. The semiconductor module according to claim 13, further comprising a second guide part superposed on the guide part and disposed along the first passage, wherein:
the second guide part has one surface and another surface that are inclined to the one side surface of the heat sink, to guide the refrigerant toward the one side surface of the heat sink, and an inclination angle of the one surface of the guide part is different from an inclination angle of the one surface of the second guide part.

15. The semiconductor module according to claim 14, wherein an angled part between the first surface and the second surface of the second guide part is located closer to the refrigerant introduction port than an angled part between the one surface and the other surface of the guide part.

16. The semiconductor module according to claim 13, further comprising a third guide part superposed on the guide part, wherein:
the third guide part has one surface and another surface that are inclined to the one side surface of the heat sink, to guide the refrigerant toward the one side surface of the heat sink.

17. The semiconductor module according to claim 16, wherein the guide part and the third guide part are connected to each other by curved surfaces that are formed continuously between the respective steps or in the introduction direction of the refrigerant.

18. The semiconductor module according to claim 1, further comprising a refrigerant guide piece disposed in the second passage at a position in the vicinity of the third passage, wherein the refrigerant guide piece has a height from a bottom surface of the water jacket equal to or less than 70% of a height of the third passage.

19. The semiconductor module according to claim 1, wherein the heat sink has a rectangular cuboid external shape.

20. The semiconductor module according to claim 1, wherein the heat sink is disposed away from a bottom surface of the third passage.

21. The semiconductor module according to claim 1, further comprising a fin base on which the heat sink is formed, wherein, except for the refrigerant introduction port and the refrigerant discharge port, the water jacket is sealed with the fin base.

22. A cooler for supplying a refrigerant from the outside to a water jacket to cool a semiconductor element disposed on an outer surface thereof, the cooler comprising:
a heat sink connected thermally to the semiconductor element;
a first passage in the water jacket, which extends from a refrigerant introduction port;
a guide part formed along the first passage, including a first surface and a second surface to guide the refrigerant toward one side surface of the heat sink, the first surface being inclined to said one side surface of the heat sink;
a second passage in the water jacket to be parallel to the first passage, which extends to a refrigerant discharge port, the second passage having a side wall parallel to another side surface of the heat sink; and
a third passage that is formed in the water jacket in a position for communicating the first passage and the second passage with each other, the heat sink being disposed in the third passage.

* * * * *